(12) United States Patent
Shinohara

(10) Patent No.: US 10,032,667 B2
(45) Date of Patent: Jul. 24, 2018

(54) SEMICONDUCTOR DEVICE AND MANUFACTURING METHOD THEREOF

(71) Applicant: Renesas Electronics Corporation, Koutou-ku, Tokyo (JP)

(72) Inventor: Masaaki Shinohara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/424,798

(22) Filed: Feb. 4, 2017

(65) Prior Publication Data

US 2017/0278750 A1    Sep. 28, 2017

(30) Foreign Application Priority Data

Mar. 28, 2016   (JP) .................................. 2016-063040

(51) Int. Cl.

| | |
|---|---|
| *H01L 21/8234* | (2006.01) |
| *H01L 21/768* | (2006.01) |
| *H01L 21/265* | (2006.01) |
| *H01L 21/266* | (2006.01) |
| *H01L 21/28* | (2006.01) |
| *H01L 27/11568* | (2017.01) |

(Continued)

(52) U.S. Cl.
CPC ...... *H01L 21/76895* (2013.01); *H01L 21/266* (2013.01); *H01L 21/26513* (2013.01); *H01L 21/28282* (2013.01); *H01L 21/76805* (2013.01); *H01L 21/823487* (2013.01); *H01L 27/11568* (2013.01); *H01L 27/11573* (2013.01); *H01L 29/665* (2013.01); *H01L 29/66545* (2013.01); *H01L 29/66575* (2013.01); *H01L 29/66833* (2013.01)

(58) Field of Classification Search
CPC ..... H01L 21/70; H01L 21/702; H01L 21/782; H01L 21/784; H01L 21/786; H01L 21/8232

See application file for complete search history.

(56) References Cited

U.S. PATENT DOCUMENTS

| | | |
|---|---|---|
| 6,177,303 B1 | 1/2001 | Schmitz et al. |
| 8,951,869 B2 | 2/2015 | Tsukamoto et al. |

(Continued)

FOREIGN PATENT DOCUMENTS

| | | |
|---|---|---|
| JP | 2002-526920 T | 8/2002 |
| JP | 2014-154790 A | 8/2014 |

*Primary Examiner* — Cheung Lee
(74) *Attorney, Agent, or Firm* — Shapiro, Gabor and Rosenberger, PLLC

(57) ABSTRACT

When a MISFET is formed by using a gate last process and replacing dummy gate electrodes with metal gate electrodes, both of respective cap insulating films and an interlayer insulating film over a control gate electrode and the dummy gate electrodes are polished to prevent excessive polishing of the upper surface of the interlayer insulating film and the occurrence of dishing. In the gate last process, the interlayer insulating film is formed to cover the control gate electrode and the dummy gate electrodes as well as the cap insulating films located thereover. After the upper surface of the interlayer insulating is polished to expose the cap insulating films from the interlayer insulating films, etching is performed to selectively remove the cap insulating films. Subsequently, the upper surfaces of the interlayer insulating films are polished.

14 Claims, 35 Drawing Sheets

(51) Int. Cl.
*H01L 27/11573* (2017.01)
*H01L 29/66* (2006.01)

(56) References Cited

U.S. PATENT DOCUMENTS

| | | | |
|---|---|---|---|
| 2013/0178024 A1* | 7/2013 | Flachowsky | H01L 21/823807 438/199 |
| 2014/0131808 A1* | 5/2014 | Ando | H01L 21/823842 257/369 |
| 2015/0318279 A1* | 11/2015 | Hong | H01L 21/308 257/77 |

* cited by examiner

FIG. 25

| | OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI (WRITE)/ BTBT (ERASE) | 10/5/1/0.5/0 | -6/6/0/open/0 | 0/0/1.5/1.5/0 |
| B | SSI (WRITE)/ FN (ERASE) | 10/5/1/0.5/0 | 12/0/0/0/0 | 0/0/1.5/1.5/0 |
| C | FN (WRITE)/ BTBT (ERASE) | -12/0/0/0/0 | -6/6/0/open/0 | 0/0/1.5/1.5/0 |
| D | FN (WRITE)/ FN (ERASE) | -12/0/0/0/0 | 12/0/0/0/0 | 0/0/1.5/1.5/0 |

SEMICONDUCTOR DEVICE AND MANUFACTURING METHOD THEREOF

CROSS-REFERENCE TO RELATED APPLICATIONS

The disclosure of Japanese Patent Application No. 2016-063040 filed on Mar. 28, 2016 including the specification, drawings and abstract is incorporated herein by reference in its entirety.

BACKGROUND

The present invention relates to a semiconductor device and a manufacturing method thereof and can be used for the manufacturing of, e.g., a semiconductor device having a metal gate electrode.

As a transistor to be formed in the logic portion of a next-generation microcomputer that can be miniaturized, a transistor including a metal gate electrode and a high-dielectric-constant film (high-k film) is known. As a method of forming such a transistor, a so-called gate last process is known which forms a dummy gate electrode over a substrate and then replaces the dummy gate electrode with a metal gate electrode.

As an electrically writable/erasable nonvolatile semiconductor storage device, a memory cell having a conductive floating gate electrode or a trapping insulating film surrounded by oxide films under the gate electrode of a MISFET (Metal Insulator Semiconductor Field Effect Transistor) has been used widely. Examples of the nonvolatile semiconductor storage device using the trapping insulating film include a MONOS (Metal Oxide Nitride Oxide Semiconductor) split-gate cell.

Patent Document 1 (Japanese Unexamined Patent Publication No. 2014-154790) describes that, in the case of merging a memory cell with a MISFET in a logic portion, silicide layers are formed over the source/drain regions of the MISFET. Subsequently, the metal gate electrode of the MISFET is formed by a gate last process, and then a silicide layer is formed over the gate electrode of the memory cell.

Patent Document 2 (Japanese Translation of PCT Application No. 2002-526920) describes that, after a multilayer film in which a dummy gate electrode and a nitride film are successively stacked is formed and an oxide film in which the multilayer film is to be embedded is deposited, the upper surface of the oxide film is polished to expose the nitride film. Subsequently, the nitride film and the dummy gate electrode are removed and, in the resulting trench, a metal gate electrode is formed.

RELATED ART DOCUMENTS

Patent Documents

[Patent Document 1] Japanese Unexamined Patent Publication No. 2014-154790
[Patent Document 2] Japanese Translation of PCT Application No. 2002-526920

SUMMARY

In the manufacturing process of a semiconductor device in which a gate last process is performed, a silicon nitride film may be formed as a cap insulating film over a dummy gate electrode to be replaced later with a metal gate electrode. Then, a silicon dioxide film in which the dummy gate electrode and the silicon nitride film are to be embedded is formed. Subsequently, the silicon dioxide film and the silicon nitride film are polished from above to expose the upper surface of the dummy gate electrode.

At this time, due to the different rates of polishing silicon nitride and silicon dioxide, the silicon dioxide film is excessively polished and the upper surface of the silicon dioxide film is recessed, resulting in the problem of so-called dishing. The dishing may cause a residue, defective contact plug formation, a short circuit between a gate electrode and source/drain regions, or the like during the manufacturing process.

Other problems and novel features of the present invention will become apparent from a statement in the present specification and the accompanying drawings.

The following is a brief description of the outline of representative ones of the embodiments disclosed in the present application.

In a method of manufacturing a semiconductor device in one of the embodiments, when a MISFET is formed by a gate last process, a cap insulating film made of a silicon nitride film and formed over a dummy gate electrode is exposed by polishing an upper surface of an interlayer insulating film. Then, the cap insulating film is removed by etching. Subsequently, the upper surface of the interlayer insulating film is polished. Then, the dummy gate electrode is replaced with a metal gate electrode.

In a semiconductor device in another one of the embodiments, an interlayer insulating film is embedded in the space between the respective gate electrodes of a plurality of MISFETs to expose the upper surfaces of the gate electrodes, and the position of an upper surface of the interlayer insulating film is higher than the position of the upper surface of each of the gate electrodes.

According to the one embodiment, the reliability of the semiconductor device can be improved. In particular, it is possible to prevent the occurrence of a contact failure resulting from dishing.

BRIEF DESCRIPTION OF THE DRAWINGS

FIG. 25 is a table showing an example of conditions under which voltages are applied to the individual portions of a selected memory cell during "Write", "Erase", and "Read" operations;

DETAILED DESCRIPTION

Figure 1:
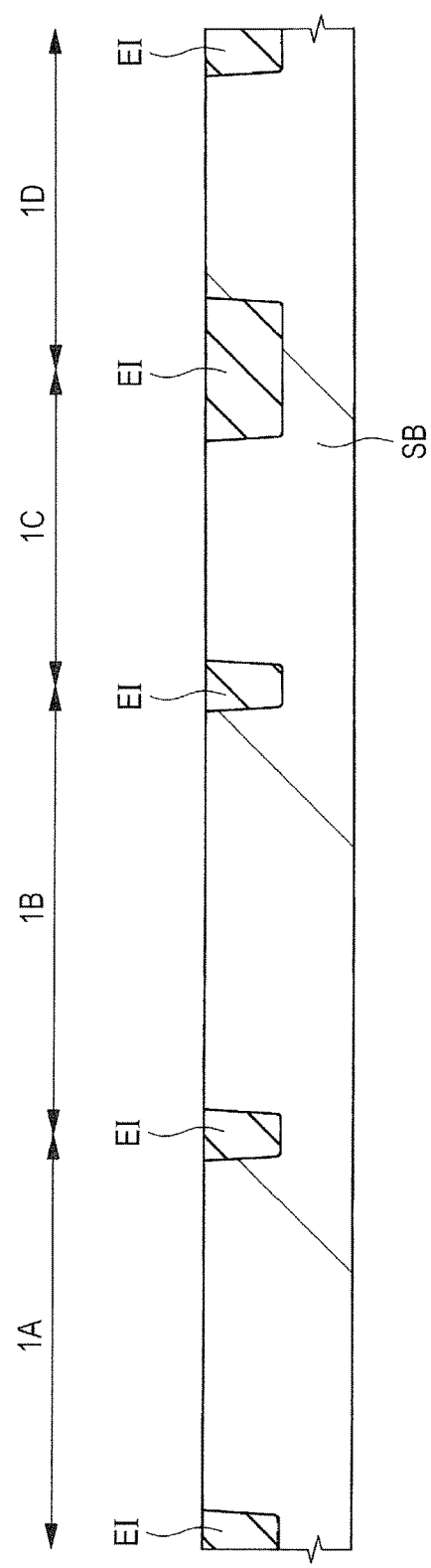
FIG. 1 is a cross-sectional view of a semiconductor device in Embodiment 1 during the manufacturing process thereof.

The following will describe the embodiments in detail on the basis of the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

A semiconductor device in each of the present and following embodiments is a semiconductor device including a nonvolatile memory (nonvolatile storage element, flash memory, or nonvolatile semiconductor storage device). In the present embodiment, the nonvolatile memory will be described on the basis of a memory cell based on an n-channel MISFET (Metal Insulator Semiconductor Field Effect Transistor).

Also, in each of the present and following embodiments, polarities (polarities of voltages applied during write/erase/read operations or carriers) are intended to describe operations to the memory cell based on the n-channel MISFET. In the case of a memory cell based on a p-channel MISFET, operations which are the same in principle can be obtained by inverting all the polarities of the applied potentials, all the conductivity types of the carriers, and the like. In the description given in the present application, a silicide layer formed through the reaction between a metal film and a semiconductor film is distinguished from a semiconductor film. That is, the silicide mentioned in the present application is a compound of a metal and silicon, not a semiconductor.

Embodiment 1

<About Manufacturing Process of Semiconductor Device>

Referring to FIGS. 1 to 24, a method of manufacturing a semiconductor device in Embodiment 1 will be described.

FIGS. 1 to 24 are cross-sectional views of the semiconductor device in Embodiment 1 during the manufacturing process thereof. Each of FIGS. 1 to 24 shows a memory cell region 1A, a first lower-breakdown-voltage transistor region 1B, a higher-breakdown-voltage transistor region 1C, and a second lower-breakdown-voltage transistor region 1D in this order in a left-to-right direction. Each of FIGS. 1 to 24 shows the formation of memory cells in a nonvolatile memory in a memory cell region 1A, the formation of respective lower-breakdown-voltage MISFETs in the first and second lower-breakdown-voltage transistor regions 1B and 1D, and the formation of higher-breakdown-voltage transistors in the higher-breakdown-voltage transistor region 1C.

In the case described herein, the memory cells including n-channel MISFETs (control transistor and memory transistor) are formed in the memory cell region 1A. However, it is also possible to invert the conductivity type and form p-channel MISFETs (control transistor and memory transistor) in the memory cell region 1A. Likewise, in the case described herein, n-channel MISFETs are formed in the first lower-breakdown-voltage transistor region 1B, the higher-breakdown-voltage transistor region 1C, and the second lower-breakdown-voltage transistor region 1D. However, it is also possible to invert the conductivity type and form p-channel MISFETs therein.

It is also possible to form both of n-channel MISFETs and p-channel MISFETs, i.e., CMISFETs (Complementary MISFETs) in the first lower-breakdown-voltage transistor region 1B, the higher-breakdown-voltage transistor region 1C, and the second lower-breakdown-voltage transistor region 1D. In the first lower-breakdown-voltage transistor region 1B, lower-breakdown-voltage transistors are formed relatively densely. In the second lower-breakdown-voltage transistor region 1D, lower-breakdown-voltage transistors are formed relatively coarsely. In other words, the distance between the gate patterns of a plurality of dummy gate electrodes, metal gate electrodes, or the like formed in the first lower-breakdown-voltage transistor region 1B is smaller than the distance between the gate patterns of a plurality of dummy gate electrodes, metal gate electrodes, or the like formed in the second lower-breakdown-voltage transistor region 1D.

In the manufacturing process of the semiconductor device in Embodiment 1, first, as shown in FIG. 1, a semiconductor substrate (semiconductor wafer) SB made of p-type monocrystalline silicon (Si) having a specific resistance of, e.g., about 1 to 10 Ωcm or the like is provided. Then, in a main surface of the semiconductor substrate SB, a plurality of isolation regions EI defining active regions are formed.

The isolation regions EI are made of an insulator such as silicon dioxide and can be formed by, e.g., a STI (Shallow Trench Isolation) method, a LOCOS (Local Oxidation of Silicon) method, or the like. The isolation regions EI are made of an insulating film embedded in the main surface of the semiconductor substrate SB located between, e.g., the memory cell region 1A, the first lower-breakdown-voltage transistor region 1B, the higher-breakdown-voltage transistor region 1C, and the second lower-breakdown-voltage transistor region 1D.

Next, in the main surface of the semiconductor substrate SB located in the memory cell region 1A, the first lower-breakdown-voltage transistor region 1B, the higher-breakdown-voltage transistor region 1C, and the second lower-breakdown-voltage transistor region 1D, p-type wells are formed. The p-type wells can be formed by ion-implanting a p-type impurity such as, e.g., boron (B) into the semiconductor substrate SB. Note that the p-type wells formed in the respective regions where the memory cells, the higher-breakdown-voltage MISFET, the lower-breakdown-voltage MISFETs, and the like are formed can be formed in the same ion implantation step, but can also be formed in the respective regions in different ion implantation steps for the optimization of the characteristics of the individual elements.

Figure 2:
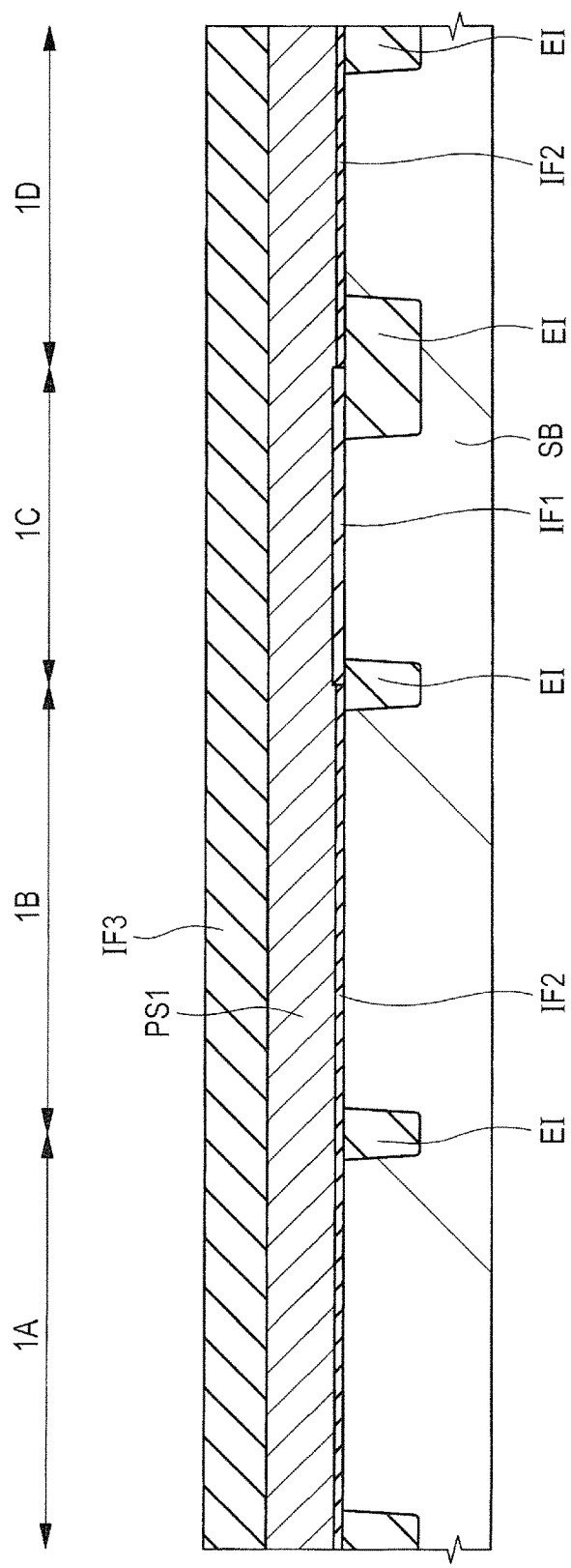
FIG. 2 is a cross-sectional view of the semiconductor device during the manufacturing process thereof, which is subsequent to FIG. 1.

Next, as shown in FIG. 2, over the main surface of the semiconductor substrate SB, an insulating film IF1 for the gate insulating film of the higher-breakdown-voltage transistor is formed. That is, the insulating film IF1 having a relatively large thickness is formed over the upper surface of the semiconductor substrate SB located in the memory cell region 1A, the first lower-breakdown-voltage transistor region 1B, the higher-breakdown-voltage transistor region 1C, and the second lower-breakdown-voltage transistor region 1D. As the insulating film IF1, e.g., a silicon dioxide film can be used.

The insulating film IF1 located in the higher-breakdown-voltage transistor region 1C is a film which is to serve as the gate insulating film of the higher-breakdown-voltage transistor formed later. Accordingly, the insulating film IF1 needs to have a withstand performance of about 5 to 12 V and consequently needs to have a film thickness of about 15 to 20 nm. The thickness of the insulating film IF1 formed herein is, e.g., 16 nm. The insulating film IF1 can be formed by, e.g., a dry oxidation method, a wet oxidation method, or an ISSG (In-Situ Steam Generation) oxidation method.

Alternatively, the insulating film IF1 may also be formed by, e.g., a CVD (Chemical Vapor Deposition) method. In this case, the insulating film IF1 is made of, e.g., a TEOS (Tetra Ethyl Ortho Silicate) film or a HTO (High-temperature silicon dioxide) film. The insulating film IF1 may also be formed by a combination of any of the oxidation methods shown above and the CVD method. In this case, e.g., an insulating film having a film thickness of 6 nm is formed first by the oxidation method, and then an insulating film having a thickness of 10 nm is deposited thereover by the CVD method to form the insulating film IF1 having a multilayer structure including these insulating films.

Subsequently, using a photolithographic technique and an etching method, the insulating film IF1 is patterned to expose the main surface of the semiconductor substrate SB located in each of the memory cell region 1A, the first lower-breakdown-voltage transistor region 1B, and the second lower-breakdown-voltage transistor region 1D.

Subsequently, over the main surface of the semiconductor substrate SB located in each of the memory cell region 1A, the first lower-breakdown-voltage transistor region 1B, and the second lower-breakdown-voltage transistor region 1D, an insulating film IF2 made of, e.g., a silicon dioxide film is formed. The insulating film IF2 is to serve as the respective gate electrodes of the lower-breakdown-voltage transistors and control transistors which are formed in a subsequent process step. The thickness of the insulating film IF2 is smaller than that of the insulating film IF1. The insulating film IF2 is formed by, e.g., a thermal oxidation method.

Then, using, e.g., a CVD method, a polysilicon film PS1 made of a polycrystalline silicon film is formed over the semiconductor substrate SB so as to cover the upper surface of the insulating film IF1. It is also possible to form an amorphous silicon film as the polysilicon film PS1 during the deposition thereof and then change the polysilicon film PS1 made of the amorphous silicon film to the polysilicon film PS1 made of the polycrystalline silicon film by subsequent heat treatment. The polysilicon film PS1 can also be changed to a low-resistance semiconductor film (doped polysilicon film) by performing the introduction of an impurity into the polysilicon film PS1 during the deposition thereof, the ion implantation of an impurity into the polysilicon film PS1 after the deposition thereof, or the like. As an n-type impurity to be introduced into the polysilicon film PS1, e.g., phosphorus (P) can be used appropriately. The film thickness of the polysilicon film PS1 is, e.g., about 100 nm.

Then, over the polysilicon film PS1, an insulating film IF3 is formed using, e.g., a CVD method. The insulating film IF3 is a cap insulating film made of, e.g., silicon nitride (SiN). The insulating film IF3 has a film thickness of, e.g., not less than 60 nm. The insulating film IF3 formed herein has a thickness of, e.g., 80 nm.

Figure 3:
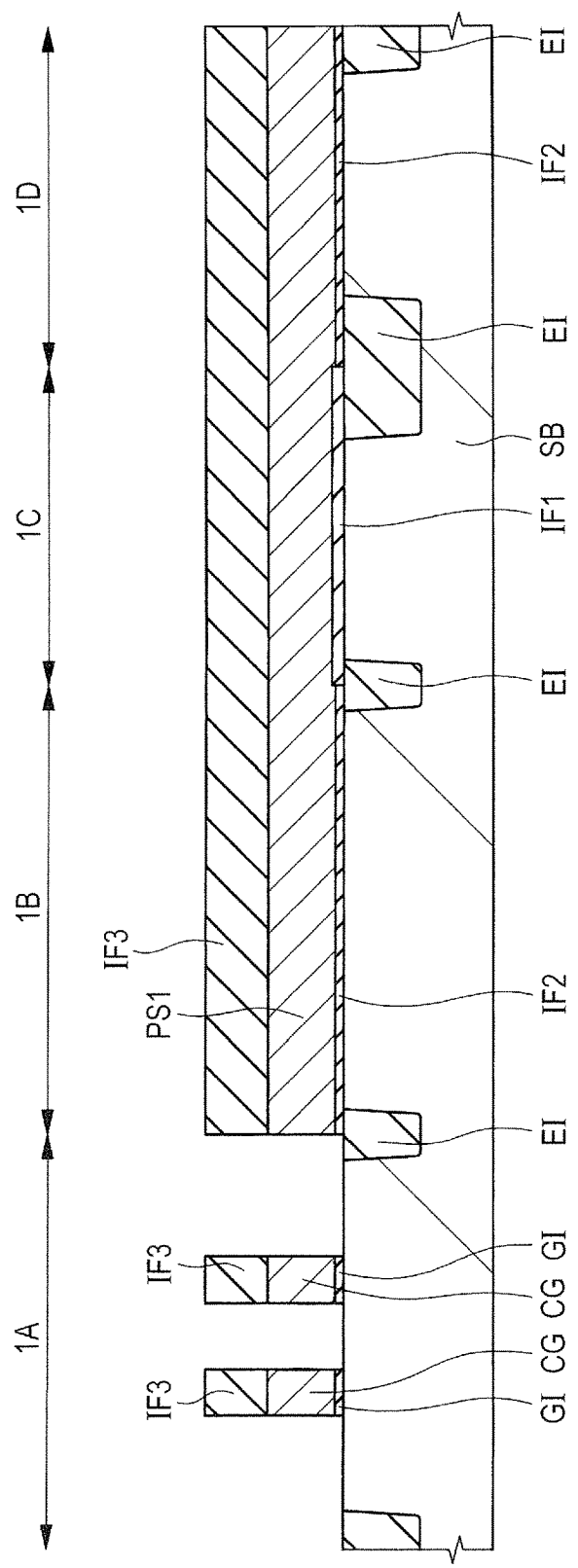
FIG. 3 is a cross-sectional view of the semiconductor device during the manufacturing process thereof, which is subsequent to FIG. 2.

Next, as shown in FIG. 3, a multilayer film including the insulating film IF3, the polysilicon film PS1, and the insulating film IF2 in the memory cell region 1A is patterned using a photolithographic technique and an etching technique. As a result, in the memory cell region 1A, gate insulating films GI made of the insulating film IF2 are formed. Also, by the etching step, control gate electrodes CG made of the polysilicon film PS1 are formed in the memory cell region 1A. Each of the control gate electrodes CG has a pattern extending in a predetermined direction in plan view. The predetermined direction, i.e., gate width direction corresponds to a depth direction in FIG. 3.

The patterning step mentioned above can be performed, e.g., as follows. That is, the insulating film IF3, the polysilicon film PS1, and the insulating film IF1 in the memory cell region 1A are processed using a photolithographic technique and a dry etching method. Thus, the control gate electrodes CG and the gate insulating films GI are formed. Note that, since the first lower-breakdown-voltage transistor region 1B, the higher-breakdown-voltage transistor region 1C, and the second lower-breakdown-voltage transistor region 1D are covered with a photoresist film (mask pattern), the polysilicon film PS1 and the insulating film IF3 in those regions are not processed and remain.

Alternatively, it is also possible to form the photoresist film first, process the insulating film IF3 in the memory cell region 1A using the photoresist film as a mask, then remove the photoresist film, and subsequently process the polysilicon film PS1 and the insulating film IF1 using the insulating film IF3 as a mask.

Figure 4:
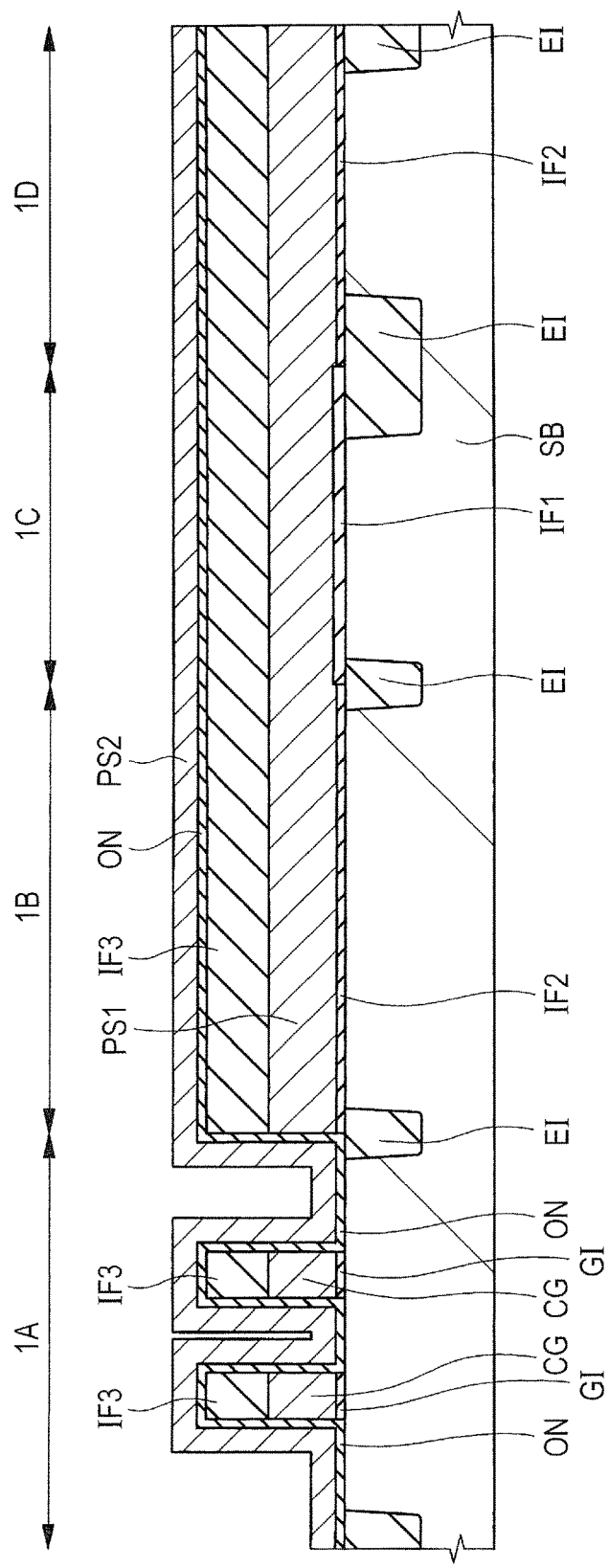
FIG. 4 is a cross-sectional view of the semiconductor device during the manufacturing process thereof, which is subsequent to FIG. 3.

Next, as shown in FIG. 4, over the entire main surface of the semiconductor substrate SB, an ONO (oxide-nitride-oxide) film ON for the gate insulating films of the memory transistors included in the memory cells formed later is formed. The ONO film ON covers the upper surface of the semiconductor substrate SB and the side walls and upper surfaces of the multilayer films each including the gate insulating film GI, the insulating film IF3, and the control gate electrode CG in the memory cell region 1A, while covering the side wall and upper surface of a multilayer film including the insulating films IF1 and IF2, the polysilicon film PS1, and the insulating film IF3 in the first lower-breakdown-voltage transistor region 1B, the higher-breakdown-voltage transistor region 1C, and the second lower-breakdown-voltage transistor region 1D.

The ONO film ON is an insulating film having an internal charge storage portion. Specifically, the ONO film ON is made of a multilayer film including a first silicon dioxide film (bottom oxide film) formed over the semiconductor substrate SB, a silicon nitride film (charge storage film) formed over the first silicon dioxide film, and a second silicon dioxide film (top oxide film) formed over the silicon nitride film. In each of the cross-sectional views used in the following description, for improved clarity of illustration, the depiction of the multilayer structure of the ONO film ON is omitted. That is, the ONO film ON has the multilayer structure including the insulating films in three layers shown above but, in the drawings used in the following description, the depiction of the boundaries between the films included in the ONO film ON is omitted and the ONO film ON is shown as one film.

The first and second silicon dioxide films can be formed using, e.g., an oxidation process (thermal oxidation process), a CVD method, or a combination thereof. At this time, for the oxidation process, ISSG oxidation can also be used. The silicon nitride film can be formed using, e.g., a CVD method.

In Embodiment 1, as the insulating film (charge storage layer) included in each of the memory cells and having a trap level, the silicon nitride film is formed. As the film used as the charge storage layer, a silicon nitride film is appropriate in terms of reliability or the like. However, the film used as the charge storage layer is not limited to the silicon nitride film. For example, a high-dielectric-constant film (high-dielectric-constant insulating film) having a dielectric constant higher than that of the silicon nitride film, such as, e.g., an aluminum oxide (alumina) film, a hafnium oxide film, or a tantalum oxide film, can also be used as the charge storage layer or charge storage portion.

The thickness of the first silicon dioxide film can be adjusted to, e.g., about 2 to 10 nm. The thickness of the silicon nitride film can be adjusted to, e.g., about 5 to 15 nm. The thickness of the second silicon dioxide film can be adjusted to, e.g., about 2 to 10 nm.

Subsequently, over the entire main surface of the semiconductor substrate SB, a polycrystalline polysilicon film PS2 is formed using, e.g., a CVD method so as to cover the top surface of the ONO film ON. As a result, the side walls and the upper surfaces of the ONO film ON exposed in the memory cell region 1A are covered with the polysilicon film PS2. That is, over the side walls of the control gate electrodes CG, the polysilicon film PS2 is formed via the ONO film ON.

The thickness of the polysilicon film PS2 is, e.g., 40 nm. It is also possible to form an amorphous silicon film as the polysilicon film PS2 during the deposition thereof and then change the polysilicon film PS2 made of the amorphous silicon film to the polysilicon film PS2 made of the polycrystalline silicon film by subsequent heat treatment. In the polysilicon film PS2, e.g., a p-type impurity (e.g., boron (B)) is introduced at a relatively high concentration. The polysilicon film PS2 is intended to form the memory gate electrodes described later.

In the case of a specific film, the film thickness mentioned herein refers to the thickness of the specific film in a direction perpendicular to the top surface of the film underlying the specific film. In the case where, e.g., the polysilicon film PS2 is formed over and along a surface along the main surface of the semiconductor substrate SB such as the upper surface of the ONO film ON, the film thickness of the polysilicon film PS2 refers to the thickness of the polysilicon film PS2 in a direction perpendicular to the main surface of the semiconductor substrate SB. In the case of the portion of the polysilicon film PS2 which is formed in contact with a wall perpendicular to the main surface of the semiconductor substrate SB, such as the side wall of the ONO film ON, the film thickness thereof refers to the thickness of the polysilicon film PS2 in a direction perpendicular to the side wall.

Figure 5:
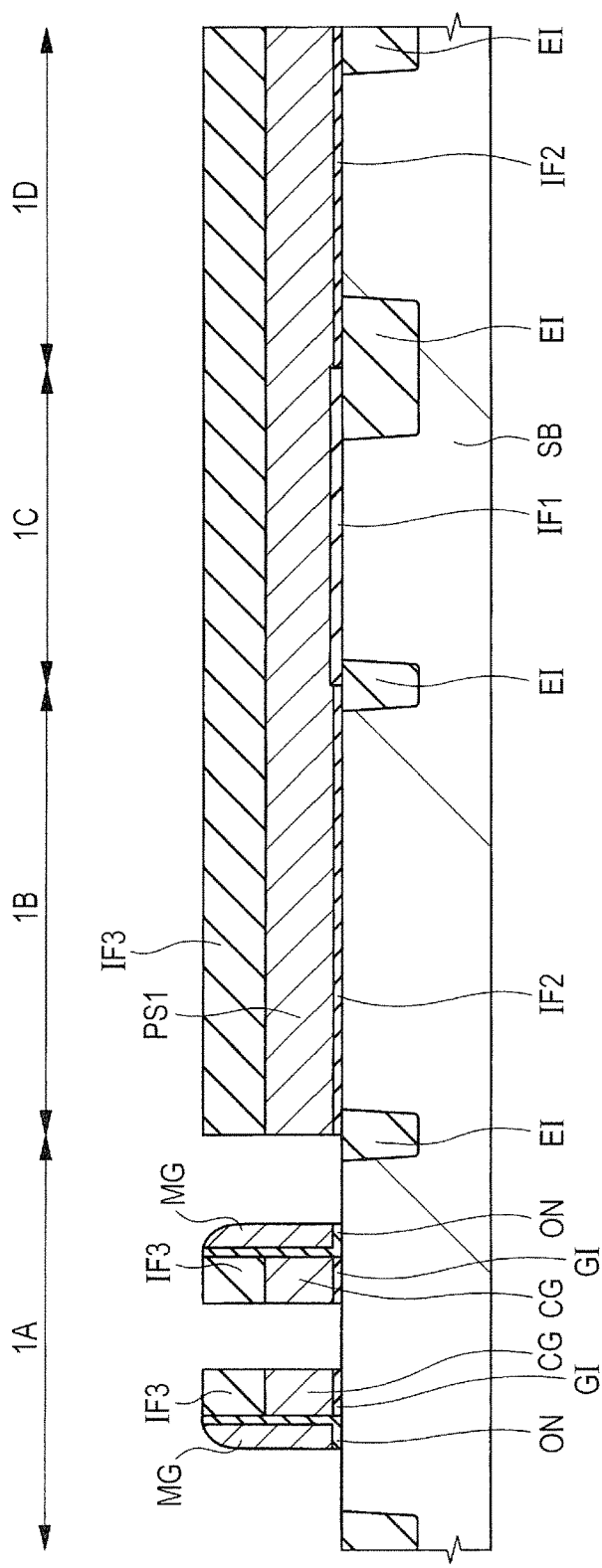
FIG. 5 is a cross-sectional view of the semiconductor device during the manufacturing process thereof, which is subsequent to FIG. 4.

Next, as shown in FIG. 5, the polysilicon film PS2 is etched back (etched, dry-etched, or anisotropically etched) using an anisotropic etching technique to expose the upper surfaces of the ONO films ON. In the etch-back step, the polysilicon film PS2 is anisotropically etched (etched back) to be left in sidewall spacer shapes over the both side walls of each of the multilayer films including the gate insulating film GI, the insulating film IF3, and the control gate electrode CG via the ONO films ON.

Thus, in the memory cell region 1A, memory gate electrodes MG made of the polysilicon film PS2 remaining in the sidewall spacer shapes over the both side walls of the foregoing multilayer films are formed via the ONO film ON. Also, by the foregoing etch-back process, the upper surface of the ONO film ON is exposed in the first lower-breakdown-voltage transistor region 1B, the higher-breakdownvoltage transistor region 1C, and the second lower-breakdown-voltage transistor region 1D.

Subsequently, using a photolithographic technique, a resist film (not shown) is formed over the semiconductor substrate SB to cover the memory gate electrode MG adjacent to one of the side walls of each of the control gate electrodes CG and expose the polysilicon film PS2 adjacent to the other side wall of the control gate electrode CG. Then, using the resist film as an etching mask, etching is performed to remove the polysilicon film PS2 formed opposite to the memory gate electrodes MG relative to the control gate electrodes CG interposed therebetween. Then, the resist film is removed. In the etching step, the memory gate electrodes MG covered with the resist film are not etched and remain. In the etching step performed herein, the sidewall-shaped polysilicon film PS2 adjacent to the side walls of the polysilicon films PS1 via the ONO film ON is also removed.

Subsequently, the exposed portion of the ONO film ON which is uncovered with the memory gate electrodes MG is removed by etching. At this time, in the memory cell region 1A, the ONO film ON immediately under the memory gate electrodes MG is not removed and remains. Likewise, the ONO film ON located between the multilayer films each including the gate insulating film GI, the insulating film IF3, and the control gate electrode CG and the memory gate electrodes MG is not also removed and remains. Since the ONO film ON is removed from the other region, in the memory cell region 1A, the upper surface of the semiconductor substrate SB is exposed and the upper surfaces of the foregoing multilayer films are exposed. On the other hand, in the first lower-breakdown-voltage transistor region 1B, the higher-breakdown-voltage transistor region 1C, and the second lower-breakdown-voltage transistor region 1D, the upper surface of the insulating film IF3 is exposed. In addition, the side walls of the control gate electrodes CG which are not adjacent to the memory gate electrodes MG are exposed.

Thus, over the semiconductor substrate SB, the memory gate electrodes MG are formed via the ONO films ON each having the internal charge storage portion so as to be adjacent to the control gate electrodes CG.

Figure 6:
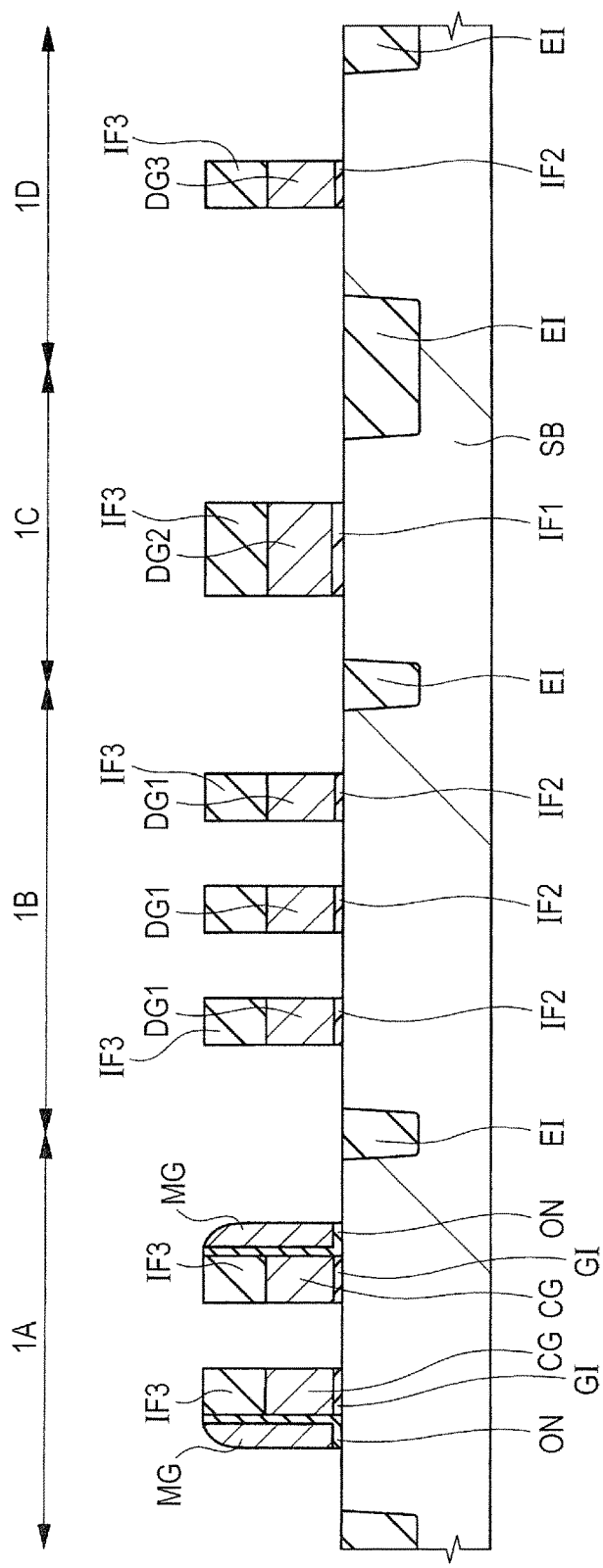
FIG. 6 is a cross-sectional view of the semiconductor device during the manufacturing process thereof, which is subsequent to FIG. 5.

Next, as shown in FIG. 6, in the first lower-breakdown-voltage transistor region 1B, the higher-breakdown-voltage transistor region 1C, and the second lower-breakdown-voltage transistor region 1D, the insulating film IF3, the polysilicon film PS1, and the insulating films IF1 and IF2 are patterned using a photolithographic technique and an etching technique. Thus, in the first lower-breakdown-voltage transistor region 1B, a plurality of dummy gate electrodes DG1 made of the polysilicon film PS1 are formed. In the higher-breakdown-voltage transistor region 1C, a dummy gate electrode DG2 made of the polysilicon film PS1 is formed. In the second lower-breakdown-voltage transistor region 1D, dummy gate electrodes DG3 made of the polysilicon film PS1 are formed.

In the first lower-breakdown-voltage transistor region 1B, the plurality of dummy gate electrodes DG1 are formed to be close to each other. That is, in the first lower-breakdown-voltage transistor region 1B, the patterns of the plurality of dummy gate electrodes DG1 are highly dense. By contrast, in the second lower-breakdown-voltage transistor region 1D, a plurality of the dummy gate electrodes DG3 may also be formed, but these dummy gate electrodes DG3 are formed to be widely spaced apart from each other. That is, in the second lower-breakdown-voltage transistor region 1D, the patterns of the dummy gate electrodes DG3 are less dense. In other words, the distance between the adjacent dummy gate electrodes DG1 is smaller than the distance between the adjacent dummy gate electrodes DG3.

The respective gate lengths of the dummy gate electrodes DG1 and DG3 in the first and second lower-breakdown-voltage transistor regions 1B and 1D are smaller than the gate length of the dummy gate electrode DG2 in the higher-breakdown-voltage transistor region 1C.

Figure 7:
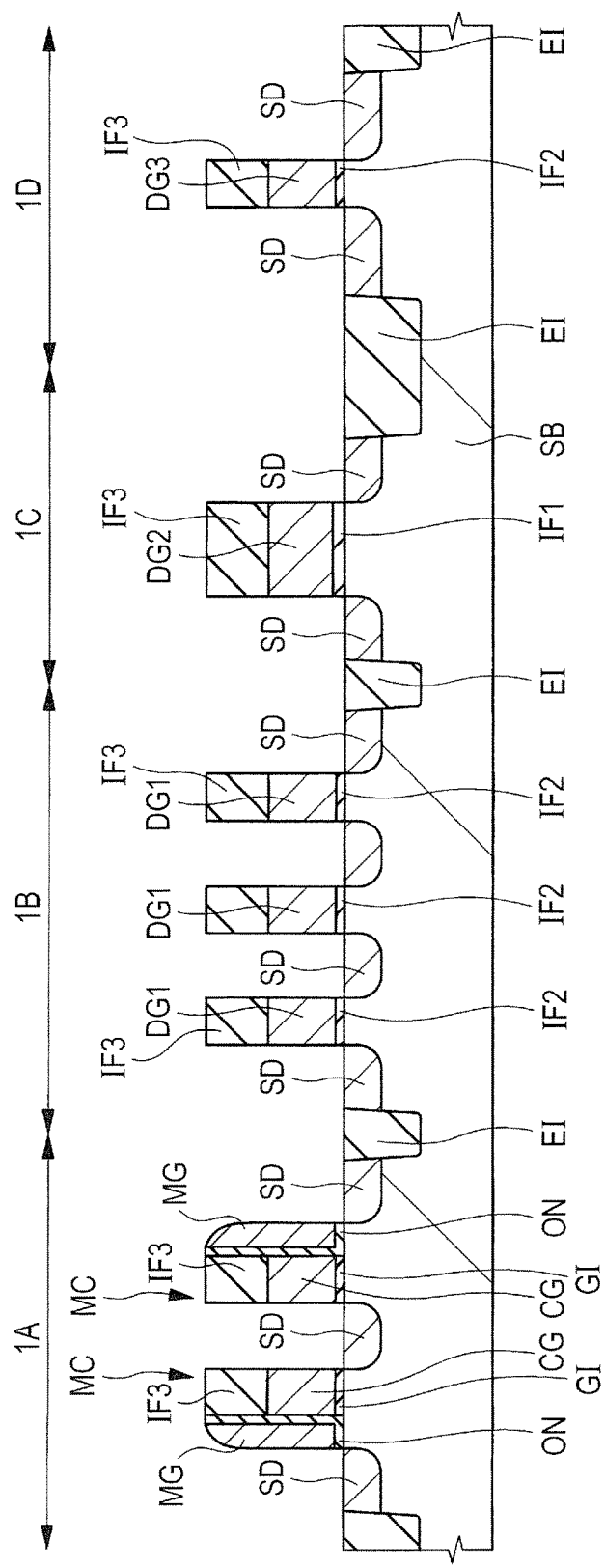
FIG. 7 is a cross-sectional view of the semiconductor device during the manufacturing process thereof, which is subsequent to FIG. 6.

Next, as shown in FIG. 7, pairs of source/drain regions SD are formed in the main surface of the semiconductor substrate SB. Each of the source/drain regions SD includes an extension region having a relatively low impurity concentration and a diffusion region having an impurity concentration higher than that of the extension region and has a LDD (Lightly Doped Drain) structure. However, in FIG. 7 and the drawings subsequent thereto which are used for description, the distinction between the extension region and the diffusion region is omitted in illustration. That is, in FIG. 7 and the subsequent drawings, the extension region and the diffusion region are collectively shown as each of the source/drain regions SD.

In the step of forming the source/drain regions SD, first, the plurality of extension regions ($n^-$-type semiconductor regions or impurity diffusion regions) are formed using an ion implantation method or the like. That is, an n-type impurity such as, e.g., arsenic (As) or phosphorus (P) is introduced into the semiconductor substrate SB by an ion implantation method using the insulating films IF3, the memory gate electrodes MG, and the like as a mask to form the plurality of extension regions. Before the formation of the extension regions, offset spacers covering the respective side walls of patterns each including the gate insulating film GI, the control gate electrode CG, the insulating film IF3, the ONO film ON, and the memory gate electrode MG or the respective side walls of the dummy gate electrodes DG1 to DG3 may also be formed of, e.g., a silicon nitride film, a silicon dioxide film, or a multilayer film thereof.

The respective extension regions in the memory cell region 1A, the first lower-breakdown-voltage transistor region 1B, the higher-breakdown-voltage transistor region 1C, and the second lower-breakdown-voltage transistor region 1D can be formed by the same ion implantation step, but can also be formed by different ion implantation steps. Note that, before or after the step of forming the extension regions, it may also be possible to, e.g., implant a p-type impurity (e.g., boron (B)) into the main surface of the semiconductor substrate SB in the first lower-breakdown-voltage transistor region 1B, the higher-breakdown-voltage transistor region 1C, and the second lower-breakdown-voltage transistor region 1D using the insulating films IF3 as a mask and thus form halo regions.

The extension regions are formed at positions closer to regions immediately under the respective middle points of the dummy gate electrodes DG1 to DG3 than the diffusion regions. The halo regions are formed at positions closer to regions immediately under the respective middle points of the dummy gate electrodes DG1 to DG3 than the extension regions. By forming the halo regions, it is possible to improve the short-channel characteristics of the MISFETs formed later.

Subsequently, in the memory cell region 1A, sidewalls (not shown) are formed to cover the both side walls of the foregoing patterns each including the control gate electrode CG and the memory gate electrode MG. Also, by the same step, sidewalls (not shown) are formed to cover the respective both side walls of the multilayer films each including the insulating film IF2, the dummy gate electrode DG1, and the insulating film IF3, the multilayer film including the insulating film IF1, the dummy gate electrode DG2, and the insulating film IF3, and the multilayer films each including the insulating film IF2, the dummy gate electrode DG3, and the insulating film IF3.

The sidewalls can be formed by self-alignment by successively forming, e.g., a silicon dioxide film and a silicon nitride film over the semiconductor substrate SB using a CVD method or the like and then removing a portion of each of the silicon dioxide film and the silicon nitride film by anisotropic etching to expose the respective upper surfaces of the semiconductor substrate SB and the insulating films IF3. That is, it can be considered to form each of the sidewalls of the multilayer film.

Subsequently, using an ion implantation method or the like, the diffusion regions ($n^+$-type semiconductor regions, impurity diffusion regions, or diffusion layers) are formed in the memory cell region 1A, the first lower-breakdown-voltage transistor region 1B, the higher-breakdown-voltage transistor region 1C, and the second lower-breakdown-voltage transistor region 1D. That is, by introducing an n-type impurity (e.g., arsenic (As) or phosphorus (P)) into the semiconductor substrate SB by an ion implantation method using the insulating films IF3, the memory gate electrodes MG, and the sidewalls as a mask (ion implantation inhibiting mask), the diffusion regions can be formed. The diffusion regions have impurity concentrations higher than those of the extension regions and junction depths deeper than those thereof.

In the memory cell region 1A, the extension regions and the diffusion regions which are formed in the upper surface of the semiconductor substrate SB located beside the patterns each including the control gate electrode CG and the memory gate electrode MG form the respective source/drain regions SD of control transistors and memory transistors which will be formed later in the memory cell region 1A. On the other hand, in the first and second lower-breakdown-voltage transistor regions 1B and 1D, the extension regions and the diffusion regions which are formed in the upper surface of the semiconductor substrate SB located beside the dummy gate electrodes DG1 and DG3 form the source/drain regions of the lower-breakdown-voltage transistors formed later. Also, in the higher-breakdown-voltage transistor region 1C, the extension regions and the diffusion regions which are formed in the upper surface of the semiconductor substrate SB located beside the dummy gate electrode DG2 form the source/drain regions of the higher-breakdown-voltage transistor formed later.

The respective diffusion regions in the memory cell region 1A, the first lower-breakdown-voltage transistor region 1B, the higher-breakdown-voltage transistor region 1C, and the second lower-breakdown-voltage transistor region 1D can be formed by the same ion implantation step, but can also be formed by the different ion implantation steps.

In the ion implantation performed herein to form the extension regions and the diffusion regions, to prevent impurity ions as an implantation species from being implanted into the control gate electrodes CG and the dummy gate electrodes DG1 to DG3, it is necessary for the insulating film IF3 to have a sufficient film thickness. This is because, when the impurity is implanted into the control gate electrodes CG, the characteristics of the control transistors formed later may vary and, when the impurity is implanted into the dummy gate electrodes DG1 to DG3, it may be difficult to remove the dummy gate electrodes DG1 to DG3 in the step described later using FIG. 15. Accordingly, the insulating film IF3 needs to have a film thickness of, e.g., not less than 60 nm.

Subsequently, activation anneal as heat treatment for activating the impurity introduced in the source and drain semiconductor regions (extension regions and diffusion regions) and the like is performed. In this manner, the structure shown in FIG. 7 is obtained.

Figure 8:
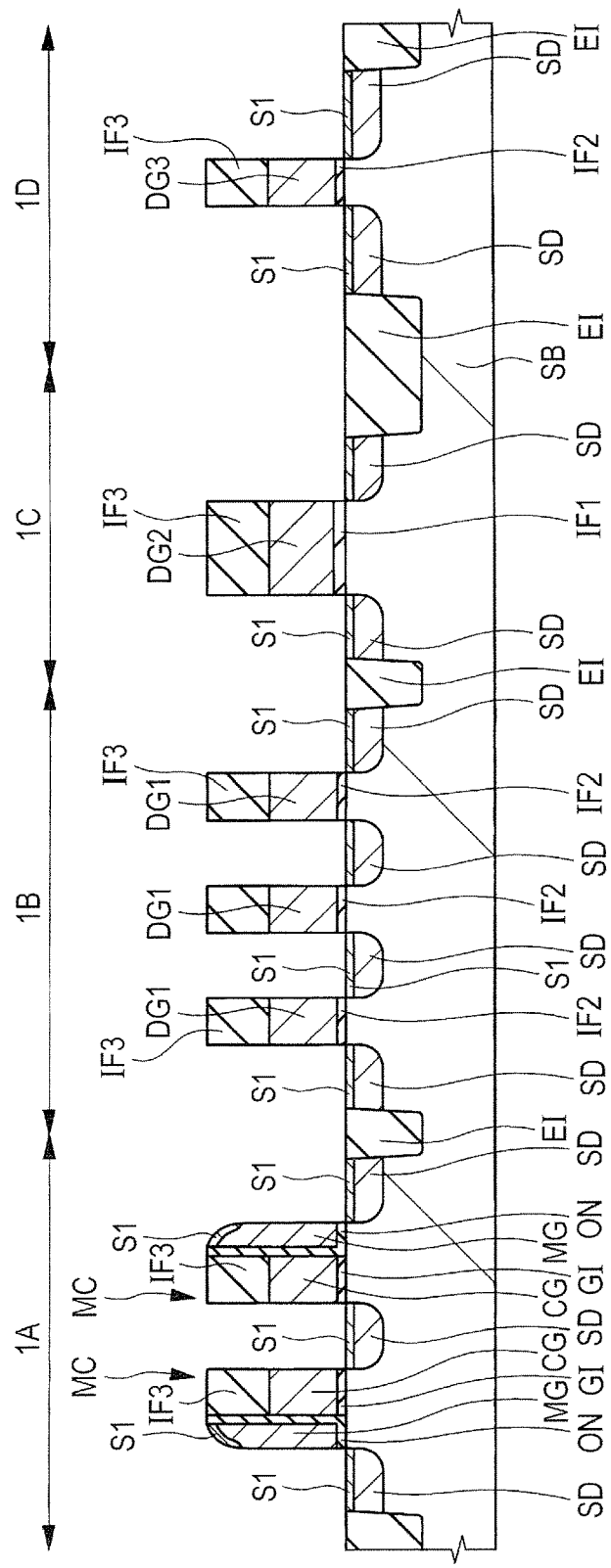
FIG. 8 is a cross-sectional view of the semiconductor device during the manufacturing process thereof, which is subsequent to FIG. 7.

Next, as shown in FIG. 8, a so-called salicide (Self Aligned Silicide) process is performed to form silicide layers. Specifically, the silicide layers can be formed as follows.

That is, as pretreatment, chemical dry etching is performed on the main surface of the semiconductor substrate SB to remove an unneeded silicon dioxide film over the semiconductor substrate SB or the like and expose the top surface of the semiconductor. Subsequently, over the entire main surface of the semiconductor substrate SB including the respective upper surfaces of the diffusion regions and the memory gate electrodes MG, a metal film for forming the silicide layers is formed (deposited). The film thickness of the metal film is, e.g., 20 to 25 nm.

The metal film is made of an alloy film of, e.g., nickel (Ni) and platinum (Pt) and can be formed using a sputtering method. A material to be added to nickel in the alloy film is not limited to platinum and may also be aluminum (Al), carbon (C), or the like. However, since platinum has a heat resistance higher than that of aluminum, carbon, or the like, platinum can be used appropriately for the alloy film. Note that the metal film may also contain cobalt (Co) instead of nickel.

Subsequently, heat treatment is performed on the semiconductor substrate SB to cause the respective surface layer portions of the source/drain regions SD and the memory gate electrodes MG to react with the metal film. By this reaction, i.e., silicidation, silicide layers S1 are formed in the respective upper portions of the source/drain regions SD and the memory gate electrodes MG. Then, the metal film that has not reacted even when the foregoing heat treatment was performed is removed by wet etching or the like. The silicide layers S1 thus formed are made of, e.g., a nickel platinum (NiPt) silicide. Each of the memory gate electrodes MG has one side wall covered with the ONO film ON and the other side wall covered with the sidewall not shown. Consequently, the silicide layer S1 covering the top surface of each of the memory gate electrodes MG is formed only over the upper surface of the memory gate electrode MG.

Note that, since the upper surface of each of the control gate electrodes CG is covered with the insulating film IF3 as the cap insulating film, the silicide layer S1 is not formed in the upper portion of the control gate electrode CG. Likewise, since the upper portion of each of the dummy gate electrodes DG1 to DG3 in the first lower-breakdown-voltage transistor region 1B, the higher-breakdown-voltage transistor region 1C, and the second lower-breakdown-voltage transistor region 1D is covered with the insulating film IF3 as the cap insulating film, the silicide layer S1 is not formed in the upper portion of each of the dummy gate electrodes DG1 to DG3. On the other hand, the upper portion of each of the sidewall-shaped memory gate electrodes MG is exposed so that the silicide layer S1 is formed in the exposed portion thereof. However, the silicide layer S1 in contact with the upper surface of each of the memory gate electrodes MG is removed by a polishing step performed in a subsequent process step by a CMP method.

Figure 9:
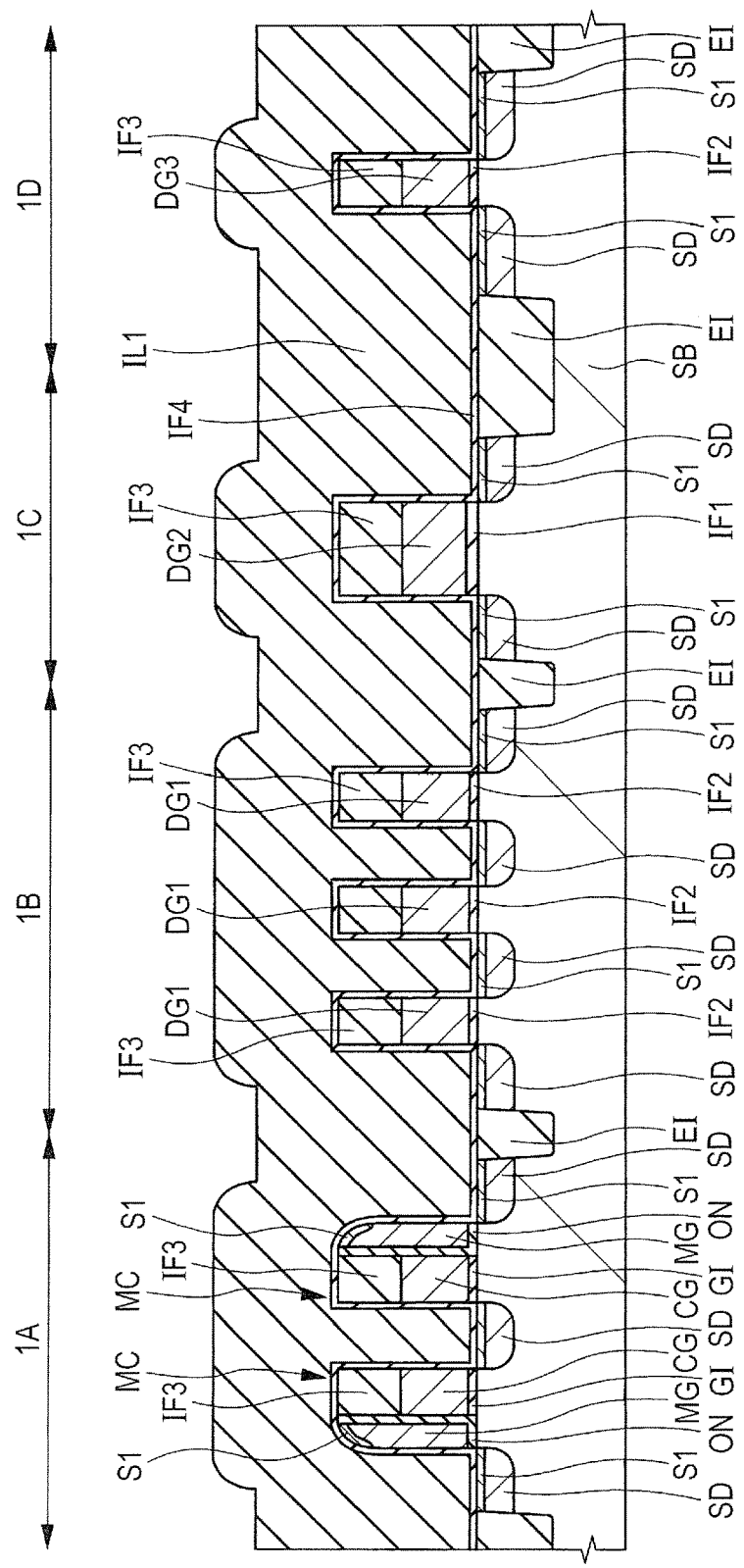
FIG. 9 is a cross-sectional view of the semiconductor device during the manufacturing process thereof, which is subsequent to FIG. 8.

Next, as shown in FIG. 9, over the entire main surface of the semiconductor substrate SB, an insulating film (liner insulating film or an etching stopper film) IF4 and an interlayer insulating film IL1 are successively formed so as to cover the control gate electrodes CG, the memory gate electrodes MG, the silicide layers S1, the insulating films IF3, the dummy gate electrodes DG1 to DG3, and the sidewalls. The insulating film IF4 is made of, e.g., a silicon nitride film and can be formed by, e.g., a CVD method. The insulating film IF4 can be used as an etching stopper film when contact holes are formed in a subsequent process step. The film thickness of the insulating film IF4 is, e.g., 20 nm.

The interlayer insulating film IL1 is made of, e.g., a single-layer silicon dioxide film and can be formed using, e.g., a CVD method or the like. The film thickness of the interlayer insulating film IL1 is larger than the film thickness of a multilayer film including the gate insulating film GI, the control gate electrode CG, and the insulating film IF3. The upper surface of the interlayer insulating film IL1 has roughness under the influence of the shapes of the various gate electrodes and the like underlying the interlayer insulating film IL1.

Figure 10:
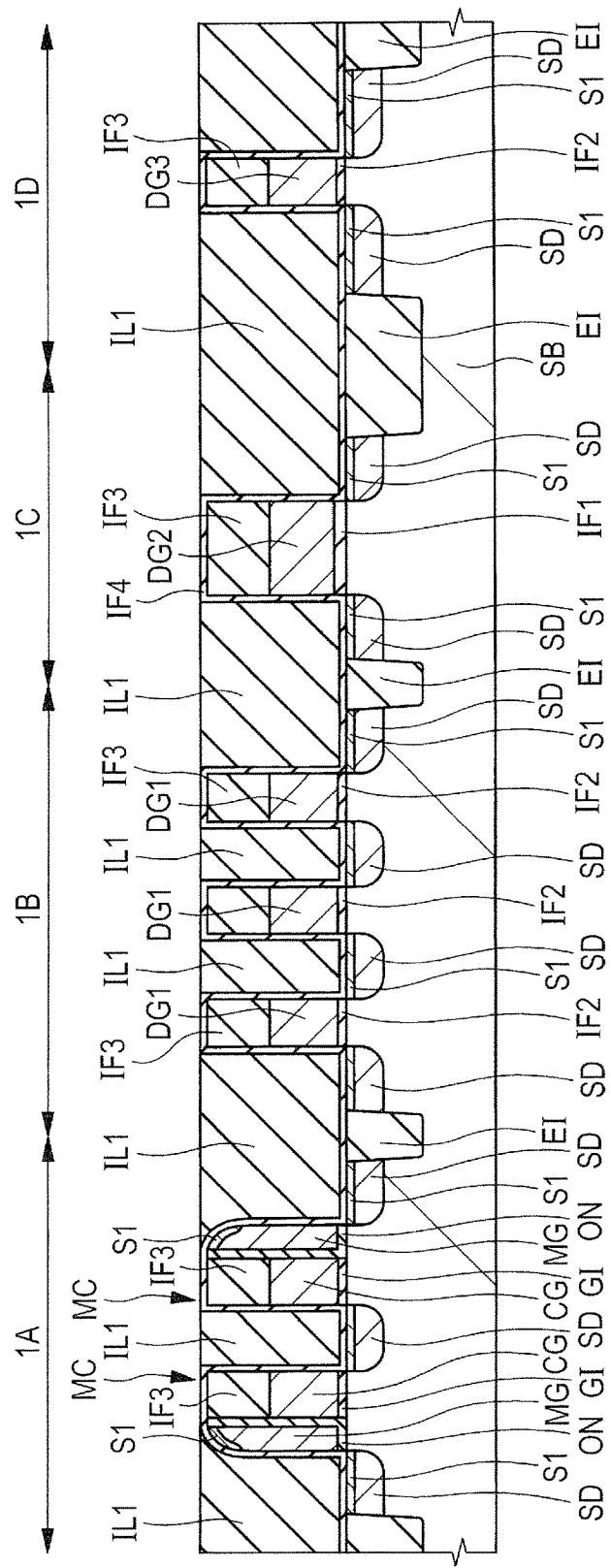
FIG. 10 is a cross-sectional view of the semiconductor device during the manufacturing process thereof, which is subsequent to FIG. 9.

Next, as shown in FIG. 10, the upper surface of the interlayer insulating film IL1 is polished using a CMP method. The polishing is stopped herein at the time when the upper surface of the insulating film IF4 over the insulating films IF3 is exposed. That is, the insulating films IF3 and IF4 are exposed from the interlayer insulating film IL1. Thus, the respective upper surfaces of the insulating film IF4 and the interlayer insulating film IL1 are planarized at the same plane.

In this process step, only the silicon dioxide film forming the interlayer insulating film IL1 is polished. Since a plurality of materials having different polishing rates are thus not polished, as a result of the polishing, the upper surface of the interlayer insulating film IL1 has a planar surface with no roughness. That is, the upper surface of the interlayer insulating film IL1 and the exposed upper surface of the insulating film IF4 are planarized at the same plane. Note that the polishing rate mentioned in the present application refers to the amount of a film made of a predetermined material which is polished off per unit time.

Figure 11:
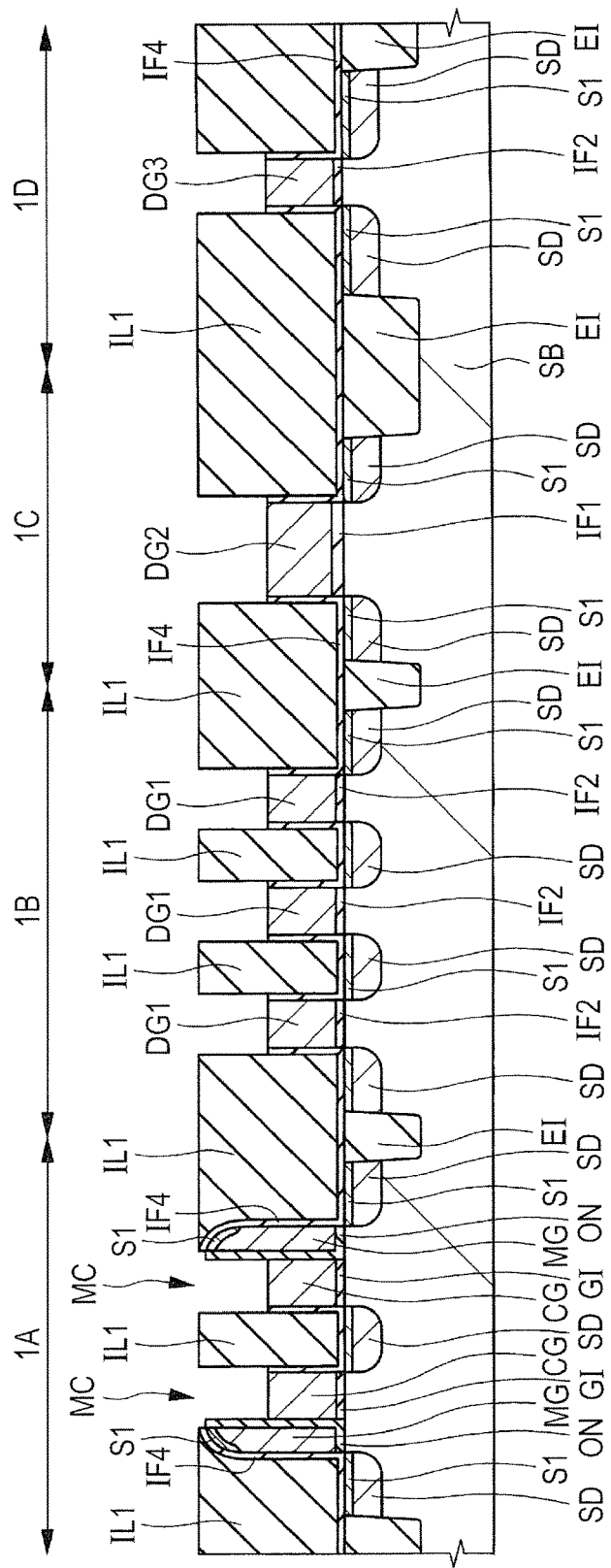
FIG. 11 is a cross-sectional view of the semiconductor device during the manufacturing process thereof, which is subsequent to FIG. 10.

Next, as shown in FIG. 11, dry etching is performed to remove the respective insulating films IF3 and IF4 over the control gate electrodes CG and the dummy gate electrodes DG1 to DG3. As a result, in the regions from which the insulating films IF3 and IF4 are removed, a plurality of trenches are formed. The respective side walls of the trenches are made of the side walls of the interlayer insulating film IL1. At the bottom portion of each of the trenches, the upper surface of any of the control gate electrodes CG and the dummy gate electrodes DG1 to DG3 is exposed. That is, in the region located above the upper surface of each of the control gate electrodes CG and the dummy gate electrodes DG1 to DG3, only the interlayer insulating film IL1 made of the silicon dioxide film is formed except in the vicinity of each of the memory gate electrodes MG.

In the dry etching step, the insulating films IF3 and IF4 are selectively removed. That is, etching is performed under conditions in which the selectivity to the silicon dioxide film is higher than the selectivity to the silicon nitride film. Accordingly, by the etching, the silicon nitride film is removed more significantly in a shorter time than the silicon dioxide film. In other words, the etching rate of the silicon nitride film is higher than the etching rate of the silicon dioxide film herein. Therefore, it is possible to remove the insulating films IF3 and IF4, while preventing the interlayer insulating film IL1 from being exposed.

Note that, between the side wall of each of multilayer films including the individual gate electrodes and the insulating films IF3 located thereover and the insulating film IF4, the sidewall having a multilayer structure including, e.g., a silicon dioxide film and a silicon nitride film is formed, though not illustrated. Accordingly, it can be considered that, when the foregoing dry etching step is performed, the silicon dioxide film as a portion of the sidewall is left over, e.g., the region between the control gate electrode CG and the insulating film IF4 adjacent to the control gate electrode CG.

Figure 12:
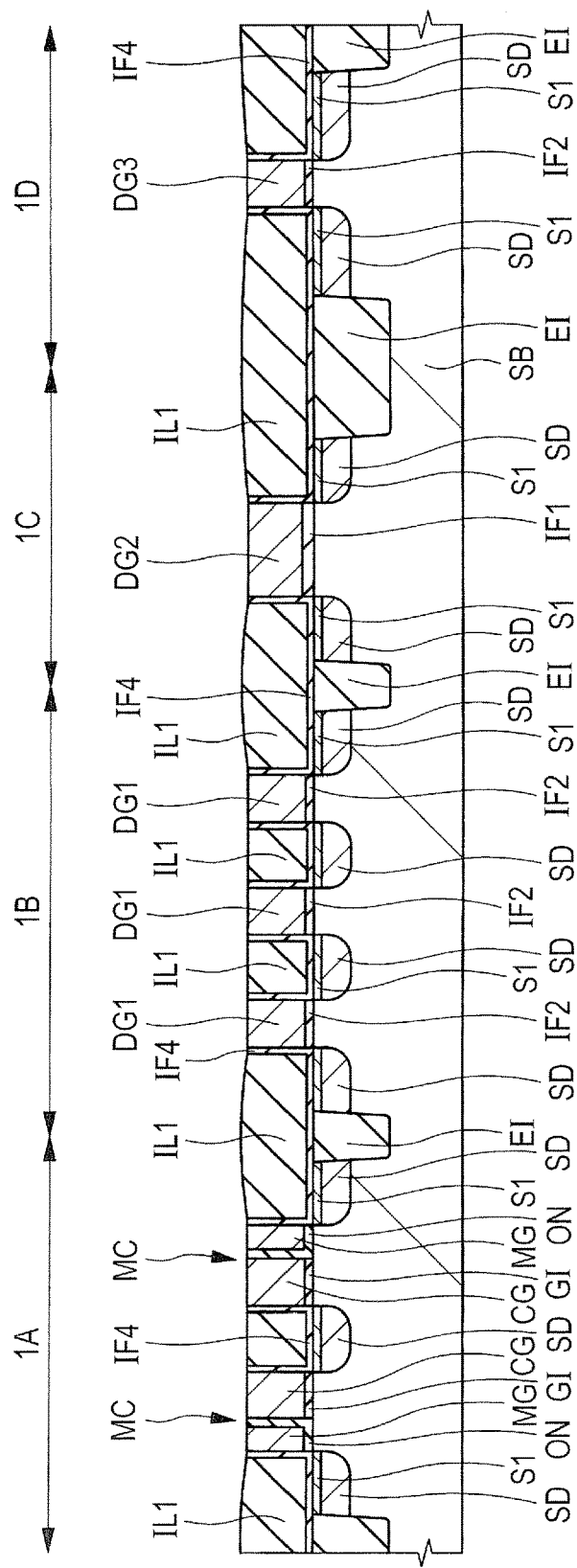
FIG. 12 is a cross-sectional view of the semiconductor device during the manufacturing process thereof, which is subsequent to FIG. 11.

Next, as shown in FIG. 12, polishing is performed using a CMP method to polish the upper surface of the interlayer insulating film IL1. As a result, the upper surface of the interlayer insulating film IL1 is lowered in height, but located at a position higher than the positions where the respective upper surfaces of the control gate electrodes CG and the dummy gate electrodes DG1 to DG3 are located. Note that the height of a position mentioned in the present application refers to a distance from the main surface of the semiconductor substrate SB in a direction perpendicular to the main surface and extending upwardly from the main surface, i.e., direction different from a direction toward the bottom surface of the semiconductor substrate SB opposite to the main surface thereof.

That is, for example, the distance from the main surface of the semiconductor substrate SB to the upper surface of each of the control gate electrodes CG is larger than the distance from the main surface of the semiconductor substrate SB to the upper surface of the interlayer insulating film IL1. The height of the upper surface of the interlayer insulating film IL1 compared to that of the upper surface of each of the control gate electrodes CG and the dummy gate electrodes DG1 to DG3 refers herein to the height of the upper surface of the interlayer insulating film IL1 at the uppermost position.

In the vicinity of each of the control gate electrodes CG and the dummy gate electrodes DG1 to DG3, the upper surface of the interlayer insulating film IL1 is at a position equal to or higher than that of the upper surface of each of the individual gate electrodes. Also, the upper surface of the interlayer insulating film IL1 is higher with distance from each of the control gate electrodes CG and the dummy gate electrodes DG1 to DG3. Accordingly, the upper surface of the interlayer insulating film IL1 is highest at a middle point between the plurality of gate electrodes. In other words, the upper surface of the interlayer insulating film IL1 has a upwardly protruding mountain-like shape between the plurality of gate electrodes. As the distance between the adjacent gate electrodes is larger, the upper surface of the interlayer insulating film IL1 between the gate electrodes is higher. Consequently, in the region where the gate electrodes are densely formed, the height of the upper surface of the interlayer insulating film IL1 is relatively low.

The amount in which (distance or dimension by which) the upper surface of the interlayer insulating film IL1 is lowered in height by the polishing performed herein is not more than the film thickness (e.g., 100 nm) of the multilayer film including the insulating films IF3 and IF4 and removed in the dry etching step described using FIG. 11. This allows the interlayer insulating film IL1 having the upper surface upwardly protruding to a position higher than those of the upper surfaces of the control gate electrodes CG and the like as described above to be formed.

In the polishing step using the CMP method, a portion of the upper surface of each of the control gate electrodes CG and the dummy gate electrodes DG1 to DG3 is polished. Thus, in the dry etching step described using FIG. 11, it is possible to remove the upper surface of each of the gate electrodes damaged by the implantation of, e.g., carbon (C) or the like therein. In this polishing step, the upper portion of each of the memory gate electrodes MG and the sidewalls not shown is also removed. As a result, the upper surface of each of the sidewalls and the memory gate electrodes MG is planarized to have the same height as that of the upper surface of each of the control gate electrodes CG and the dummy gate electrodes DG1 to DG3.

Also, by this step, the silicide layer S1 over each of the memory gate electrodes MG is removed together with a part of the upper portion of the memory gate electrode MG. That is, the silicide layer S1 is not left over the upper surface of each of the memory gate electrodes MG. Note that, after the polishing, the position of the upper surface of the interlayer insulating film IL1 is higher than the position of the upper surface of each of the memory gate electrodes MG.

Through the shaping of the control gate electrodes CG and the memory gate electrodes MG, memory cells MC in a split-gate MONOS memory each including the control gate electrode CG, the ONO film ON, the memory gate electrode MG, and the source/drain regions SD are formed in the memory cell region 1A. Each of the memory cells MC as a MONOS nonvolatile storage element includes the control transistor and the memory transistor.

That is, in the memory cell region 1A, each of the control gate electrodes CG and the pair of source/drain regions SD formed in the upper surface of the semiconductor substrate SB located beside the control gate electrode CG form the control transistor. On the other hand, in the memory cell region 1A, each of the memory gate electrodes MG and the pair of source/drain regions SD formed in the upper surface of the semiconductor substrate SB located beside the memory gate electrode MG form the memory transistor. Also, the ONO film ON under the memory gate electrode MG forms the gate insulating film of the memory transistor. Thus, the control transistor and the memory transistor share the pair of source/drain regions SD.

Since the control transistor is a memory cell selection transistor, the control transistor can also be regarded as a selection transistor. Accordingly, the control gate electrode CG can also be regarded as a selection gate electrode. The memory transistor is a storage transistor.

Figure 13:
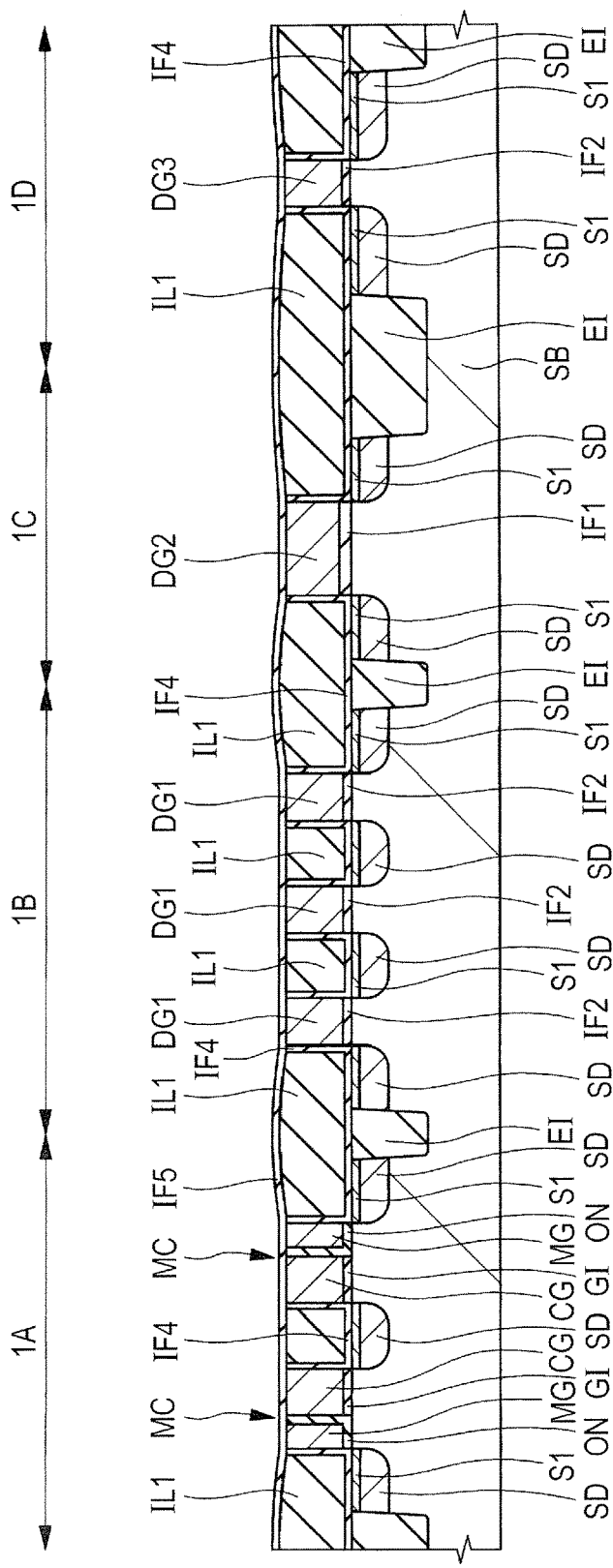
FIG. 13 is a cross-sectional view of the semiconductor device during the manufacturing process thereof, which is subsequent to FIG. 12.

Next, as shown in FIG. 13, over the interlayer insulating film IL1, a hard mask IF5 is formed using, e.g., a CVD method. The hard mask IF5 covers the respective upper surfaces of the control gate electrodes CG, the memory gate electrodes, and the dummy gate electrodes DG1 to DG3. The hard mask IF5 is made of, e.g., a titanium nitride (TiN) film.

Figure 14:
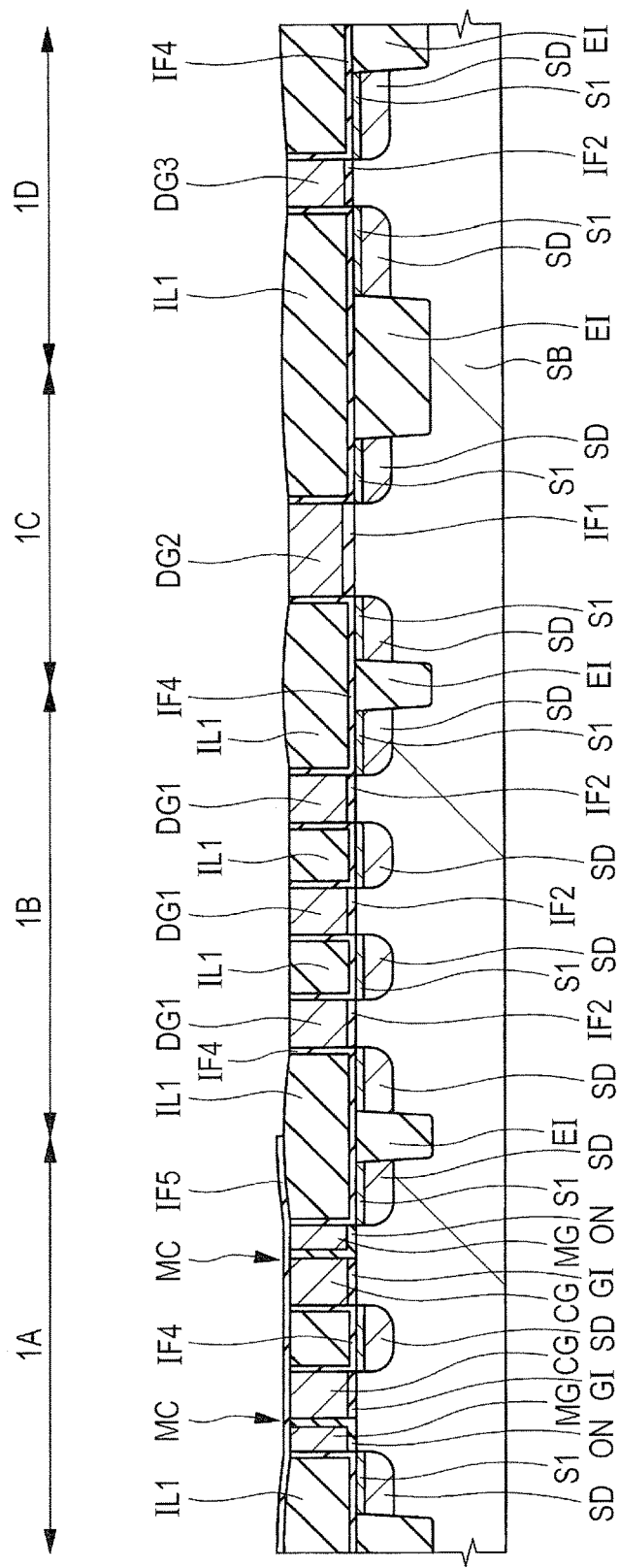
FIG. 14 is a cross-sectional view of the semiconductor device during the manufacturing process thereof, which is subsequent to FIG. 13.

Next, as shown in FIG. 14, using a photolithographic technique and an etching method, the hard mask IF5 is removed from the first lower-breakdown-voltage transistor region 1B, the higher-breakdown-voltage transistor region 1C, and the second lower-breakdown-voltage transistor region 1D. As a result, the hard mask IF5 is left in the memory cell region 1A. That is, the hard mask IF5 covers the respective upper surfaces of the control gate electrodes CG and the memory gate electrodes MG and exposes the upper surfaces of the dummy gate electrodes DG1 to DG3.

Figure 15:
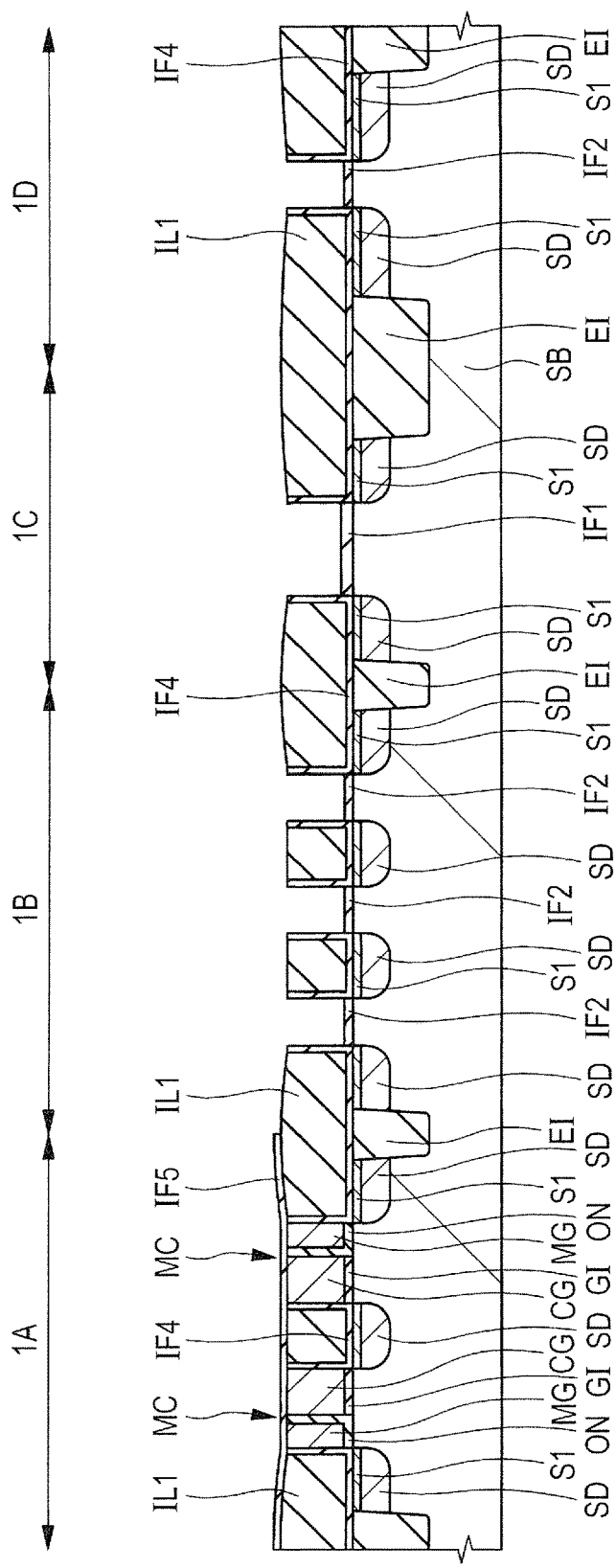
FIG. 15 is a cross-sectional view of the semiconductor device during the manufacturing process thereof, which is subsequent to FIG. 14.

Next, as shown in FIG. 15, wet etching is performed using the hard mask IF5 and the interlayer insulating film IL1 as a protective film to remove the dummy gate electrodes DG1 to DG3. This exposes the insulating film IF2 at the bottom portions of trenches (depressed portions or recessed portions) formed by removing the dummy gate electrodes DG1 to DG3. On the other hand, at the bottom portion of the trench (depressed portion or recessed portion) formed by removing the dummy gate electrode DG2, the insulating film IF1 is exposed. These trenches are regions from which the dummy gate electrodes DG1 to DG3 are removed. The both side walls of the trenches are formed of the sidewalls not shown. The dummy gate electrodes DG1 to DG3 are removed herein to be replaced with metal gate electrodes formed later.

To expose the respective upper surfaces of the insulating films IF1 and IF2 and prevent the main surface of the semiconductor substrate SB from being exposed, in the wet etching, etching having a higher selectivity to silicon dioxide is performed. In the wet etching, an aqueous alkaline solution is used as an etching solution. That is, as the etching solution, e.g., aqueous ammonia ($NH_4OH$) is used.

It can also be considered to use dry etching, not the wet etching, when the dummy gate electrodes DG1 to DG3 are removed. However, Embodiment 1 uses a so-called high-k last manufacturing method which forms a high-k film or the like described later after removing the dummy gate electrodes DG1 to DG3. Accordingly, when the dummy gate electrodes DG1 to DG3 are removed, the insulating films IF1 and IF2 each made of a silicon dioxide film are exposed. In a dry etching method, it is more difficult to perform etching having a high selectivity to a silicon dioxide film than in a wet etching method. Therefore, in terms of leaving the insulating films IF1 and IF2 and preventing the semiconductor substrate SB from being damaged, it is not appropriate to remove the dummy gate electrodes DG1 to DG3 by a dry etching step.

Figure 16:
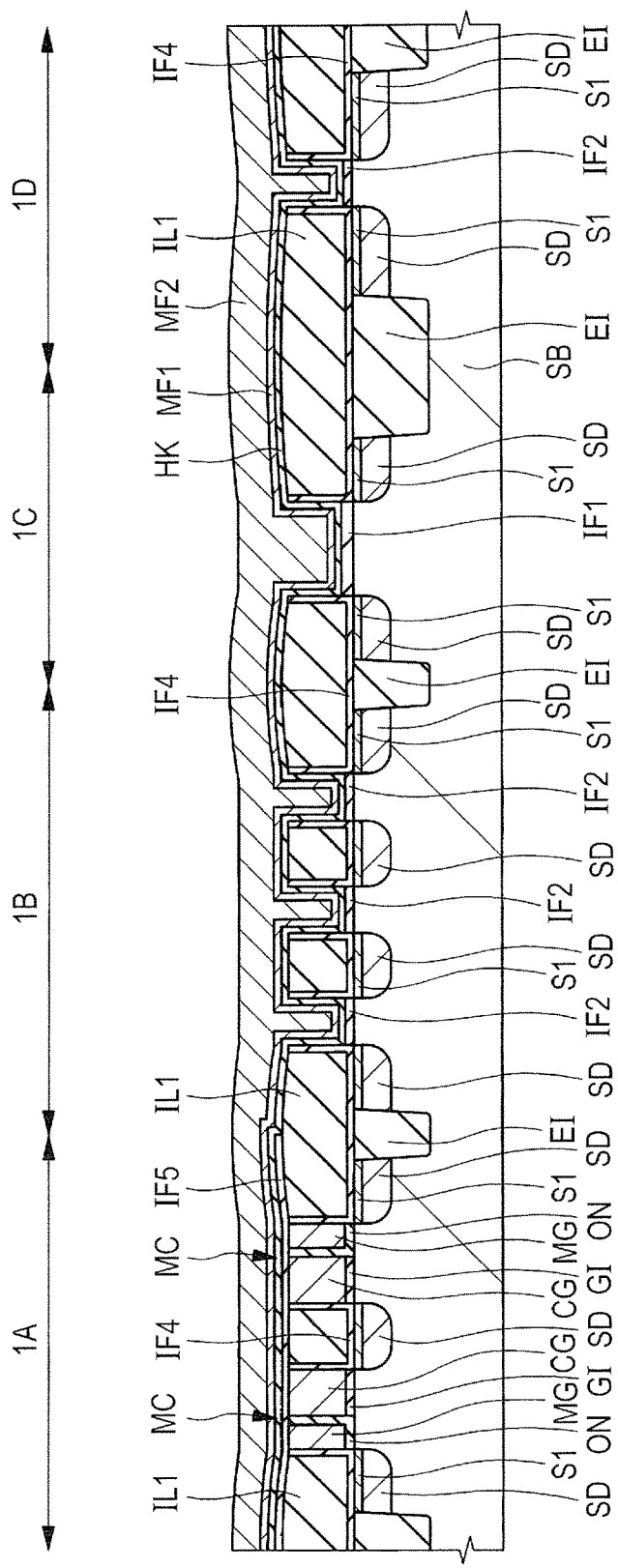
FIG. 16 is a cross-sectional view of the semiconductor device during the manufacturing process thereof, which is subsequent to FIG. 15.

Next, as shown in FIG. 16, over the semiconductor substrate SB, i.e., over the interlayer insulating films IL1 including the inner surfaces (bottom surfaces and side walls) of the trenches described above, an insulating film HK and metal films MF1 and MF2 as conductive films for the gate electrodes are formed so as to completely fill the trenches described above.

In the step of forming the insulating film HK and the metal films MF1 and MF2, the trenches described above are internally completely filled. The insulating film HK and the metal films MF1 and MF2 are formed also over the interlayer insulating films IL1.

The insulating film HK is intended for the gate insulating films. Specifically, the insulating film HK forms the gate insulating films of the MISFETs formed later in the first lower-breakdown-voltage transistor region 1B, the higher-breakdown-voltage transistor region 1C, and the second lower-breakdown-voltage transistor region 1D. The insulating film HK is an insulating material film having a dielectric constant (specific permittivity) higher than that of either of silicon dioxide and silicon nitride, i.e., a so-called high-k film (high-dielectric-constant film).

As the insulating film HK, a metal oxide film such as a hafnium oxide film, a zirconium oxide film, an aluminum oxide film, a tantalum oxide film, or a lanthanum oxide film can be used. Such a metal oxide film can also contain either one or both of nitrogen (N) and silicon (Si). The insulating film HK can be formed by, e.g., an ALD (Atomic layer Deposition) method or the like. The film thickness of the insulating film HK is, e.g., 1.5 nm. When a high-dielectric-constant film (which is the insulating film HK herein) is used as a gate insulating film, the physical film thickness of the gate insulating film can be increased compared to that in the case where a silicon dioxide film is used. This allows the advantage of being able to reduce a leakage current to be obtained.

The metal film MF1 is made of, e.g., a titanium nitride (TiN) film and can be formed by, e.g., a sputtering method.

As the metal film MF2, e.g., an aluminum (Al) film or the like can be used. It is assumed that the metal films mentioned herein refer to conductive films showing metal conduction and include not only a single-element metal film (pure metal film) and an alloy film, but also a metal compound film showing metal conduction. Between the insulating film HK and the metal film MF1, a metal film made of, e.g., tantalum nitride (TaN) may also be formed.

The metal films MF1 and MF2 are to serve as the metal gate electrodes later. To reduce the resistances of the metal gate electrodes, the metal film MF2 made of an aluminum film is preferably formed thicker than the metal film MF1. Since the aluminum film has a low resistance, it is possible to reduce the respective resistances of the gate electrodes G1 to G3 formed later. The metal film MF2 is formed using a PVD (Physical Vapor Deposition) method, i.e., a sputtering method.

The position of the bottom surface of a multilayer film including the insulating film HK and the metal films MF1 and MF2 stacked herein increases with distance from the foregoing trenches. This is because the upper surfaces of the interlayer insulating films IL1 have the upwardly protruding shapes. That is, between the foregoing plurality of trenches formed by removing the dummy gate electrodes DG1 to DG3, the bottom surface of the multilayer film is located at a position higher than those of the side walls of the trenches.

Figure 17:
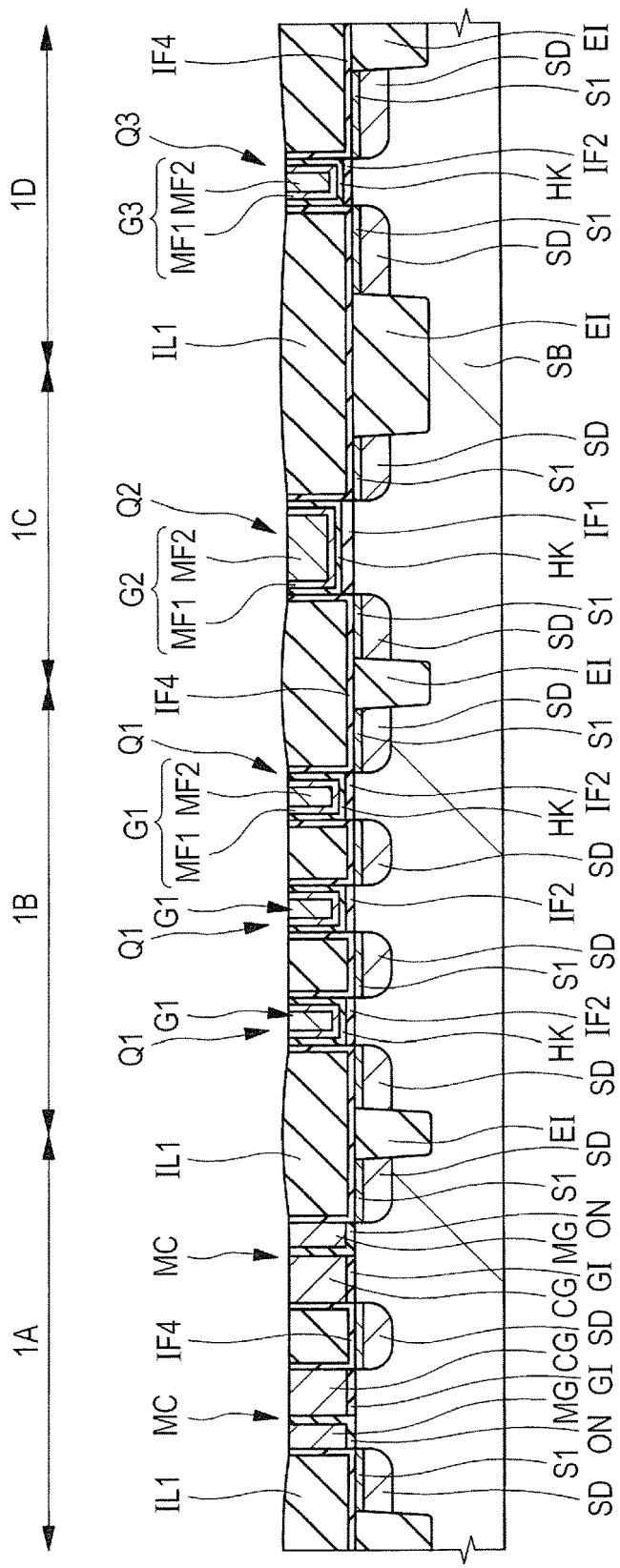
FIG. 17 is a cross-sectional view of the semiconductor device during the manufacturing process thereof, which is subsequent to FIG. 16.

Next, as shown in FIG. 17, the unneeded insulating film HK, the unneeded metal films MF1 and MF2, the unneeded hard mask IF5, and the like which are located outside the trenches described above are removed by performing polishing using, e.g., a CMP method to expose the upper surfaces of the interlayer insulating films IL1 and leave the insulating film HK and the metal films MF1 and MF2 which are embedded in each of the foregoing trenches. Thus, the control gate electrodes CG and the memory gate electrodes MG are exposed from the metal films MF1 and MF2 and the hard mask IF5. Since the polishing is performed under polishing conditions in which the selectivity to the silicon dioxide film is high, even after the polishing, the interlayer insulating films IL1 retain the state where the upper surfaces thereof are upwardly protruding from the respective upper surfaces of the control gate electrodes CG and the metal films MF1 and MF2.

With the upper surfaces of the interlayer insulating films IL1 having the protruding shapes, the insulating film HK and the metal films MF1 and MF2 are deposited, as shown in FIG. 16. Then, with the upper surfaces of the interlayer insulating films IL1 having the protruding shapes, the insulating film HK and the metal films MF1 and MF2 are removed by a polishing method. As a result, over the upper surfaces of the interlayer insulating films IL1, the insulating film HK and the metal films MF1 and MF2 are not left.

By performing the polishing, the gate electrodes G1 as metal gate electrodes each including the metal films MF1 and MF2 embedded in the trench over the insulating film IF2 in the first lower-breakdown-voltage transistor region 1B are formed. The insulating films IF2 and HK in the first lower-breakdown-voltage transistor region 1B form the gate insulating films. Thus, in the first lower-breakdown-voltage transistor region 1B, MISFETs Q1 are formed. Each of the lower-breakdown-voltage MISFETs Q1 has the gate electrode G1 and the source/drain regions located beside the gate electrode G1. The MISFETs Q1 are field effect transistors forming, e.g., peripheral circuits for the memory cells MC.

Also, by performing the polishing, the gate electrode G2 as the metal gate electrode including the metal films MF1 and MF2 embedded in the trench over the insulating film IF1 in the higher-breakdown-voltage transistor region 1C is formed. The insulating films IF1 and HK in the higher-breakdown-voltage transistor region 1C form the gate insulating film. Thus, in the higher-breakdown-voltage transistor region 1C, the MISFET Q2 is formed. The higher-breakdown-voltage MISFET Q2 has the gate electrode G2 and the source/drain regions beside the gate electrode G2. The MISFET Q2 is a field effect transistor forming, e.g., a peripheral circuit for the memory cells MC.

Also, by performing the polishing, the gate electrodes G3 as the metal gate electrodes each including the metal films MF1 and MF2 embedded in the trench over the insulating film IF2 in the second lower-breakdown-voltage transistor region 1D are formed. The insulating films IF2 and HK in the second lower-breakdown-voltage transistor region 1D form the gate insulating films. Thus, in the second lower-breakdown-voltage transistor region 1D, the MISFETs Q3 are formed. Each of the lower-breakdown-voltage MISFETs Q3 has the gate electrode G3 and the source/drain regions located beside the gate electrode G3. The MISFETs Q3 are field effect transistors forming, e.g., peripheral circuits for the memory cells MC.

The MISFET Q2 as the higher-breakdown-voltage transistor is used in a circuit which drives the memory cells MC or inputs/outputs power between a semiconductor chip as the semiconductor device and the outside of the semiconductor chip. That is, the MISFET Q2 is driven with a voltage higher than those with which the MISFETs Q1 and Q3 are driven. Accordingly, the MISFET Q2 is required to have a breakdown voltage higher than those required of the MISFETs Q1 and Q3 and the like which are used in a logic circuit or the like and required to operate at a high speed. Therefore, the gate insulating film of the MISFET Q2 has a thickness larger than those of the respective gate insulating films of the MISFETs Q1 and Q3. Also, the gate length of the gate electrode G2 is larger than the gate lengths of the gate electrodes G1 and G3.

Each of the gate electrodes G1 to G3 including the insulating film HK located thereunder and having a film thickness of about 2 nm has a thickness of about 60 nm. Accordingly, to form the metal gate electrodes each having such a thickness, the polysilicon film PS1 (see FIG. 2) serving as the dummy gate electrodes and the like is formed to have a film thickness of not less than 60 nm.

In the first lower-breakdown-voltage transistor region 1B, the MISFETs Q1 are densely formed. It may be possible that the MISFETs Q1 adjacent to each other share the source region or the drain region. In the second lower-breakdown-voltage transistor region 1D, the MISFETs Q3 are coarsely formed. It may be possible that the MISFETs Q3 do not share the source/drain regions SD with another element. Accordingly, the gate electrodes G1 are densely formed but, in the vicinities of the gate electrodes G3, there is no pattern of another gate electrode or the like. That is, the distance between the adjacent gate electrodes G1 is smaller than the distance between the adjacent gate electrodes G3.

In Embodiment 1, the dummy gate electrodes DG1 to DG3 (see FIG. 18) are removed to be replaced with the metal gate electrodes. Therefore, the dummy gate electrodes DG1 to DG3 are pseudo gate electrodes and can be regarded as to-be-replaced gate electrodes.

Thus, in Embodiment 1, the MISFETs Q1 to Q3 are formed using a method in which, after the dummy gate electrodes DG are formed over the semiconductor substrate SB and the source/drain regions are formed in the semiconductor substrate SB, the dummy gate electrodes are replaced with the metal gate electrodes, i.e., a gate last process. Also, in Embodiment 1, since the gate electrodes G1 are made of the metal gate electrodes, the sizes of the transistor elements can be reduced (gate insulating films can be thinned).

Figure 18:
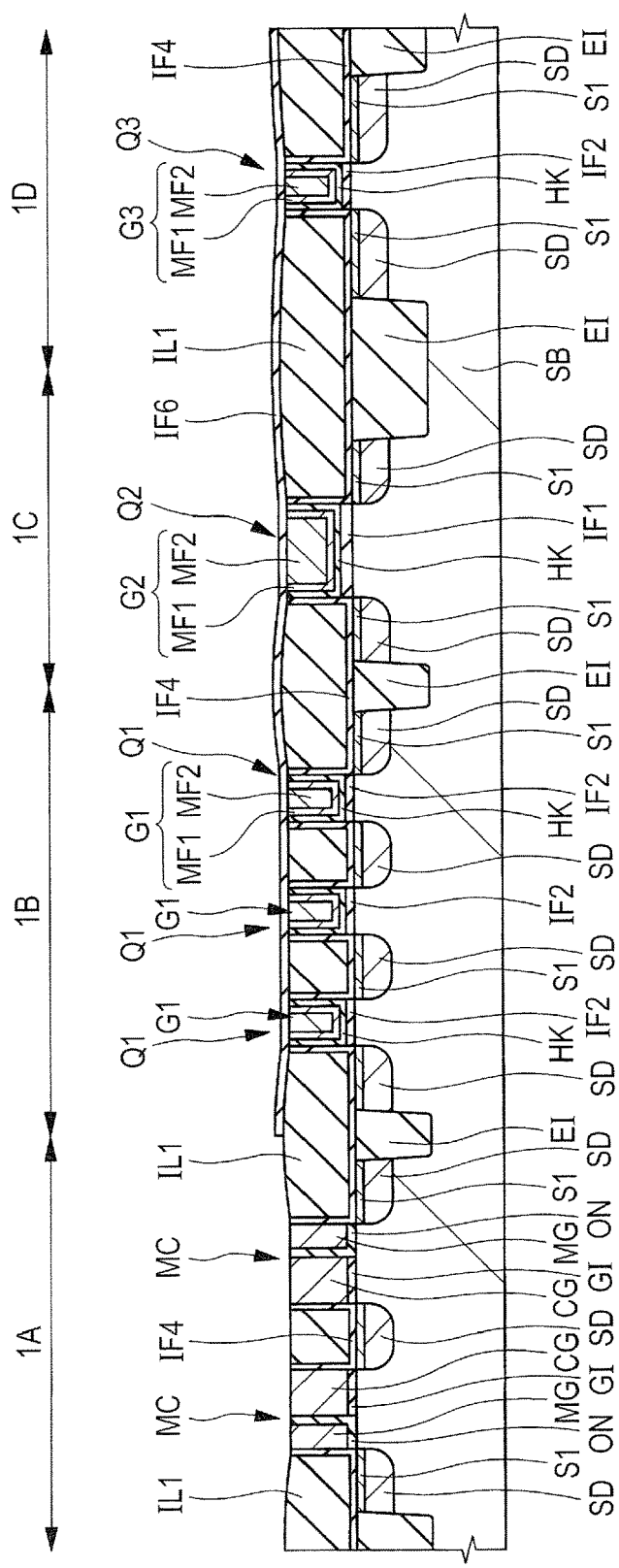
FIG. 18 is a cross-sectional view of the semiconductor device during the manufacturing process thereof, which is subsequent to FIG. 17.
Figure 19:
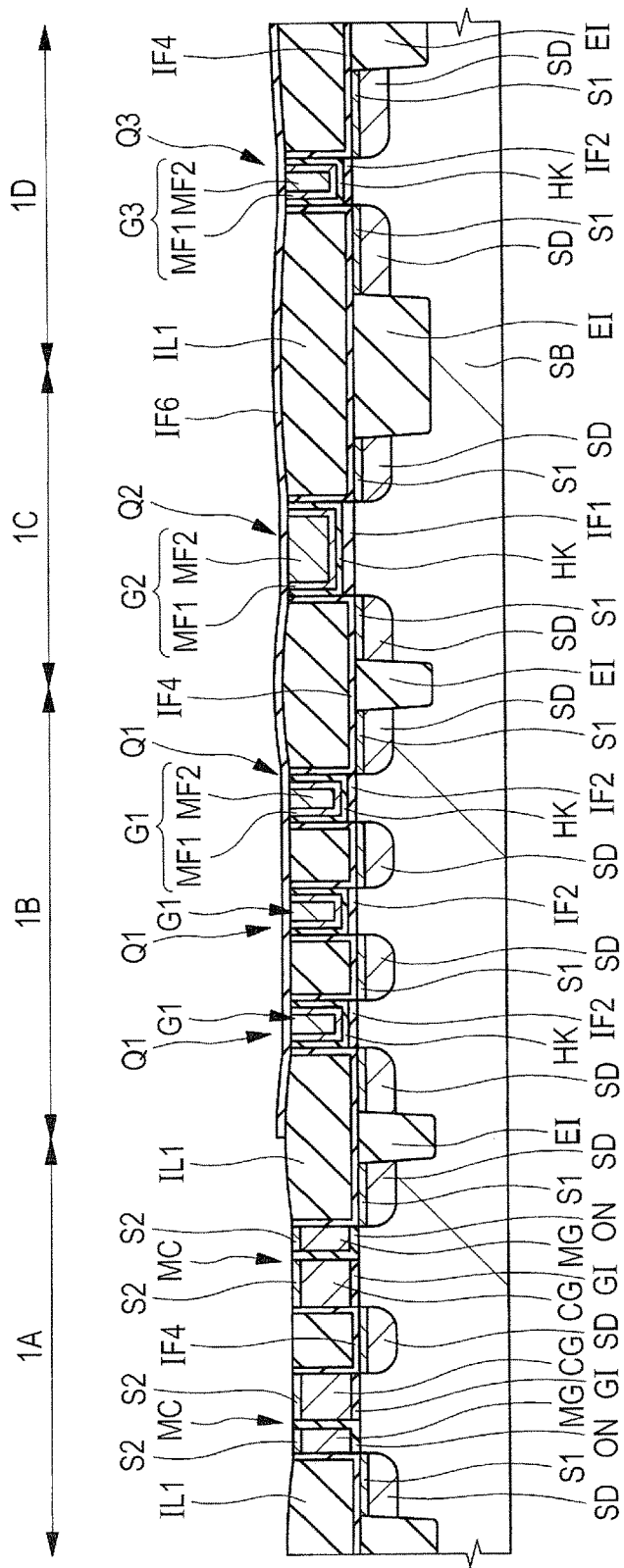
FIG. 19 is a cross-sectional view of the semiconductor device during the manufacturing process thereof, which is subsequent to FIG. 18.

Next, a salicide process is performed as described using FIGS. 18 and 19 to form respective silicide layers over individual electrodes made of the polysilicon film. Specifically, the silicide layers can be formed as follows.

That is, as shown in FIG. 18, the pattern of an insulating film IF6 covering the first lower-breakdown-voltage transistor region 1B, the higher-breakdown-voltage transistor region 1C, and the second lower-breakdown-voltage transistor region 1D is formed using, e.g., a CVD method, a photolithographic technique, and an etching method. The insulating film IF6 does not cover the respective upper surfaces of the control gate electrodes CG and the memory gate electrodes MG in the memory cell region 1A, but covers the gate electrodes G1 to G3. The insulating film IF6 is made of, e.g., a silicon dioxide film or the like.

When the pattern of the insulating film IF6 is formed, the insulating film IF6 is formed over the interlayer insulating film IL1 by, e.g., a CVD method, then etched using a dry etching method using a mask (not shown) made of a resist pattern, and subsequently wet-etched using a hydrofluoric acid (HF) to be processed. This exposes the respective upper surfaces of the interlayer insulating film IL1, the ONO film ON, the control gate electrodes CG, the memory gate electrodes MG, and the sidewalls (not shown) in the memory cell region 1A.

Next, as shown in FIG. 19, over the entire main surface of the semiconductor substrate SB including the respective upper surfaces of the control gate electrodes CG and the memory gate electrodes MG, a metal film (not shown) for forming the silicide layers is formed (deposited). The film thickness of the metal film is, e.g., 20 to 25 nm.

The metal film is made of an alloy film of, e.g., nickel (Ni) and platinum (Pt) and can be formed using a sputtering method. The metal film formed herein is an alloy film containing nickel. A material to be added to nickel in the alloy film is not limited to platinum and may also be aluminum (Al), carbon (C), or the like. However, since platinum has a heat resistance higher than that of aluminum, carbon, or the like, platinum can be used appropriately in the alloy film. Note that 5% of the metal film is made of platinum (Pt) and the metal film may also contain cobalt (Co) instead of nickel. The metal film can be formed by, e.g., a sputtering method.

Subsequently, heat treatment is performed on the semiconductor substrate SB to cause the respective surface layer portions of the control gate electrodes CG and the memory gate electrodes MG to react with the metal film. By this silicidation, in the respective upper portions of the control gate electrodes CG and the memory gate electrodes MG, silicide layers S2 are formed. The silicide layers S2 thus formed are made of, e.g., a nickel platinum (NiPt) silicide. The metal film that has not reacted even when the foregoing heat treatment was performed is removed by wet etching performed after the heat treatment or the like. At this time, since the gate electrodes G1 to G3 made of the metal film are protected by the insulating film IF6, the gate electrodes G1 to G3 are not removed.

Figure 20:
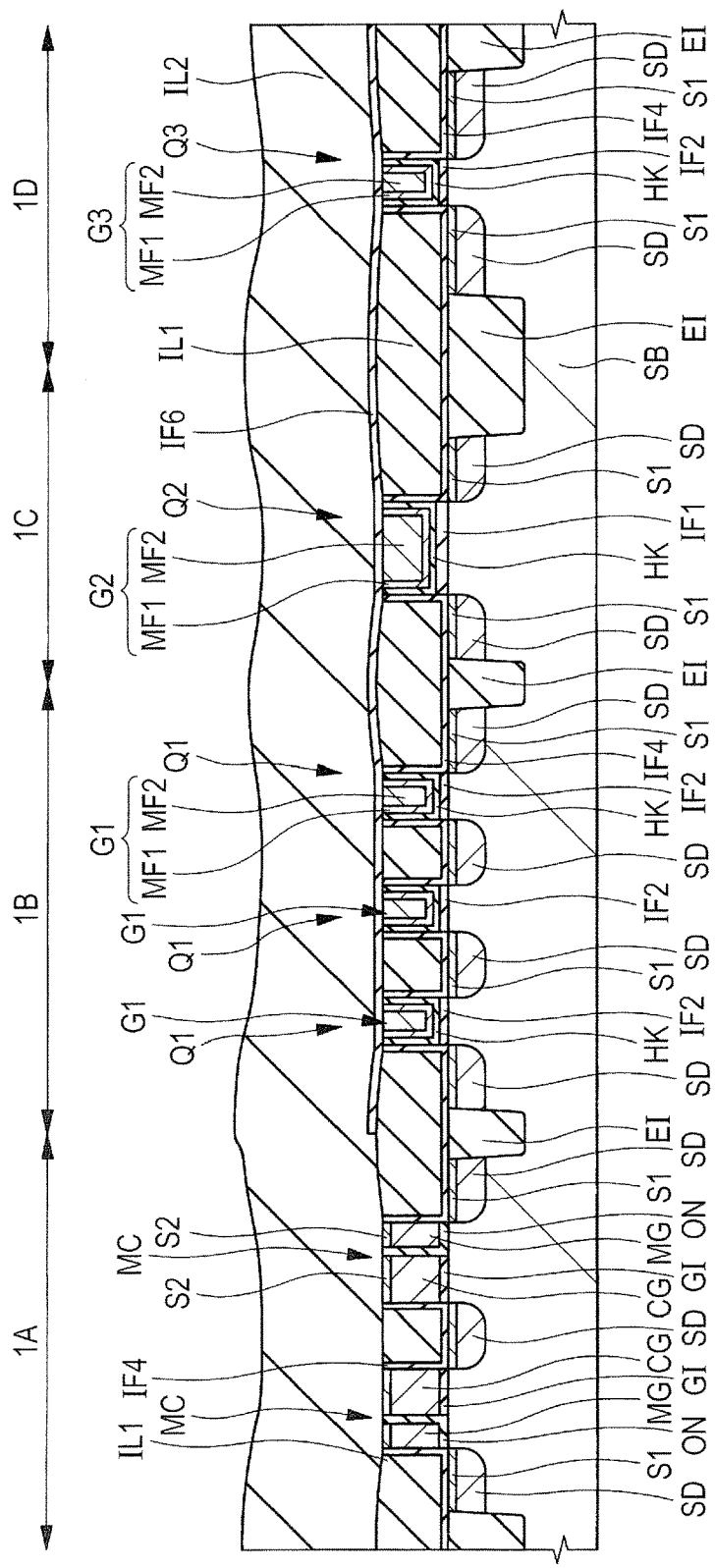
FIG. 20 is a cross-sectional view of the semiconductor device during the manufacturing process thereof, which is subsequent to FIG. 19.

Next, as shown in FIG. 20, an interlayer insulating film IL2 is formed using, e.g., a CVD method to cover the entire upper surface of the semiconductor substrate SB including the memory cell region 1A, the first lower-breakdown-voltage transistor region 1B, the higher-breakdown-voltage transistor region 1C, and the second lower-breakdown-voltage transistor region 1D. The interlayer insulating film IL2 is made of, e.g., a silicon dioxide film and covers the respective upper surfaces of the control gate electrodes CG, the memory gate electrodes MG, the gate electrodes G1 to G3, and the interlayer insulating film IL1. Since the interlayer insulating film IL2 is formed herein over the upwardly protruding interlayer insulating film IL1, the upper surface of the interlayer insulating film IL2 is not planar, but has roughness.

Figure 21:
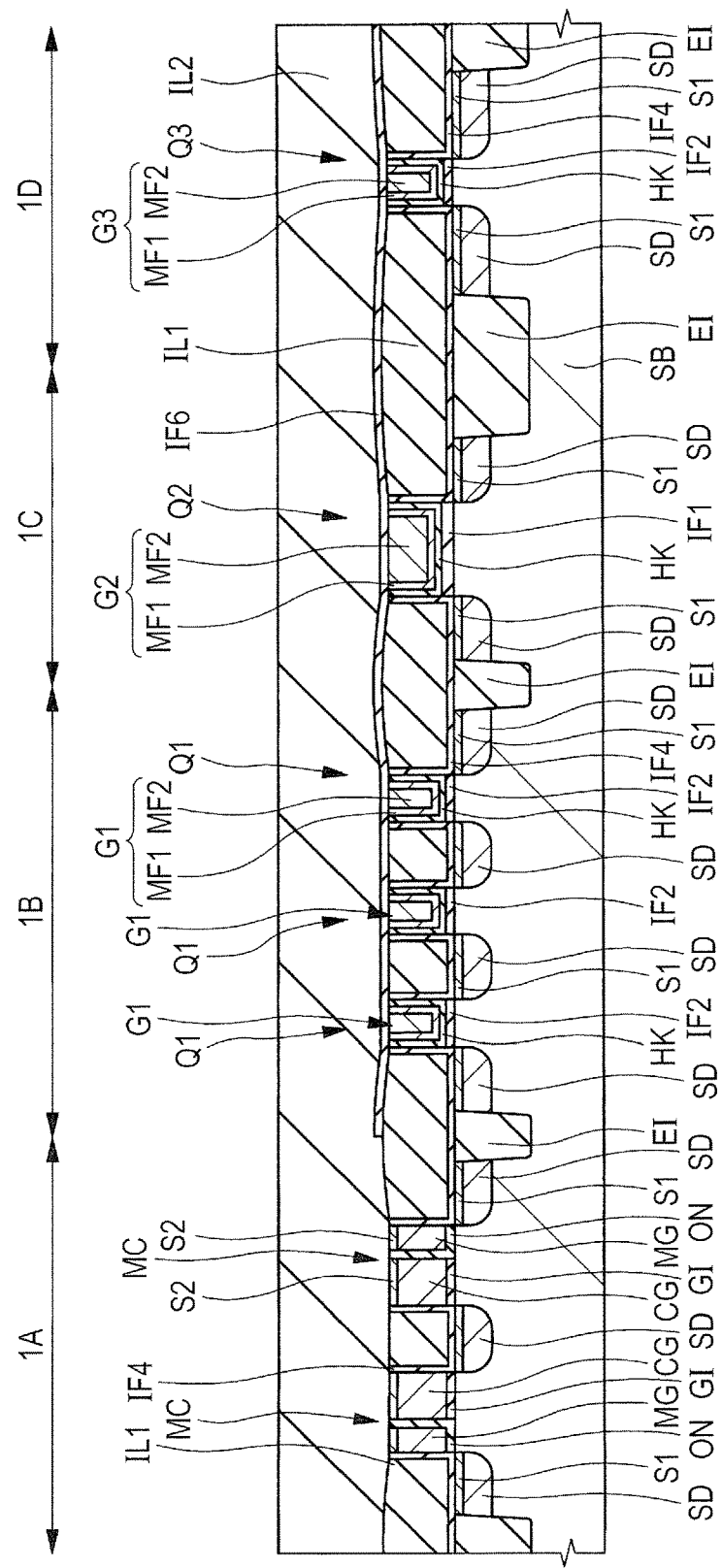
FIG. 21 is a cross-sectional view of the semiconductor device during the manufacturing process thereof, which is subsequent to FIG. 20.

Next, as shown in FIG. 21, using, e.g., a CMP method, the upper surface of the interlayer insulating film IL2 is polished to be planarized.

Figure 22:
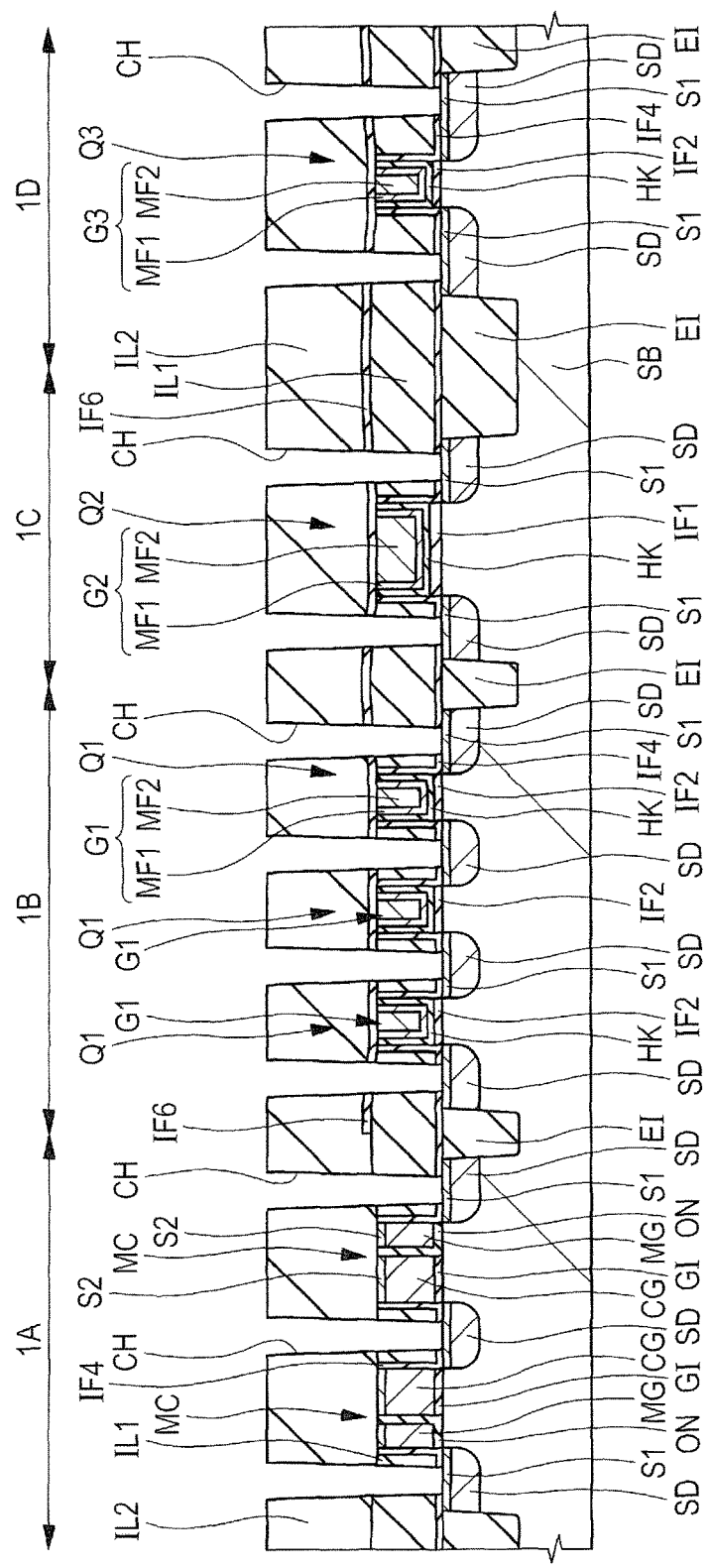
FIG. 22 is a cross-sectional view of the semiconductor device during the manufacturing process thereof, which is subsequent to FIG. 21.

Next, as shown in FIG. 22, using a resist film (not shown) formed over the interlayer insulating film IL2 using a photolithographic technique as an etching mask, the interlayer insulating films IL2 and IL1 and the insulating films IF6 and IF4 are dry-etched. Thus, a plurality of contact holes (openings or through holes) CH are formed to extend through the interlayer insulating film IL2, while the plurality of contact holes CH are formed to extend through the interlayer insulating films IL1 and IL2 and the insulating film IF4. Note that the contact holes CH in the first lower-breakdown-voltage transistor region 1B, the higher-breakdown-voltage transistor region 1C, and the second lower-breakdown-voltage transistor region 1D extend through the insulating film IF6.

At the respective bottom portions of the contact holes CH, portions of the main surface of the semiconductor substrate SB such as, e.g., portions of the silicide layers S1 over the top surfaces of the diffusion regions, portions of the silicide layers S2 over the top surfaces of the control gate electrodes CG, portions of the silicide layers S2 over the top surfaces of the memory gate electrodes MG, and portions of the gate electrodes G1 to G3 are exposed. Note that the contact holes CH over the individual gate electrodes are formed in a region not shown in FIG. 22.

Figure 23:
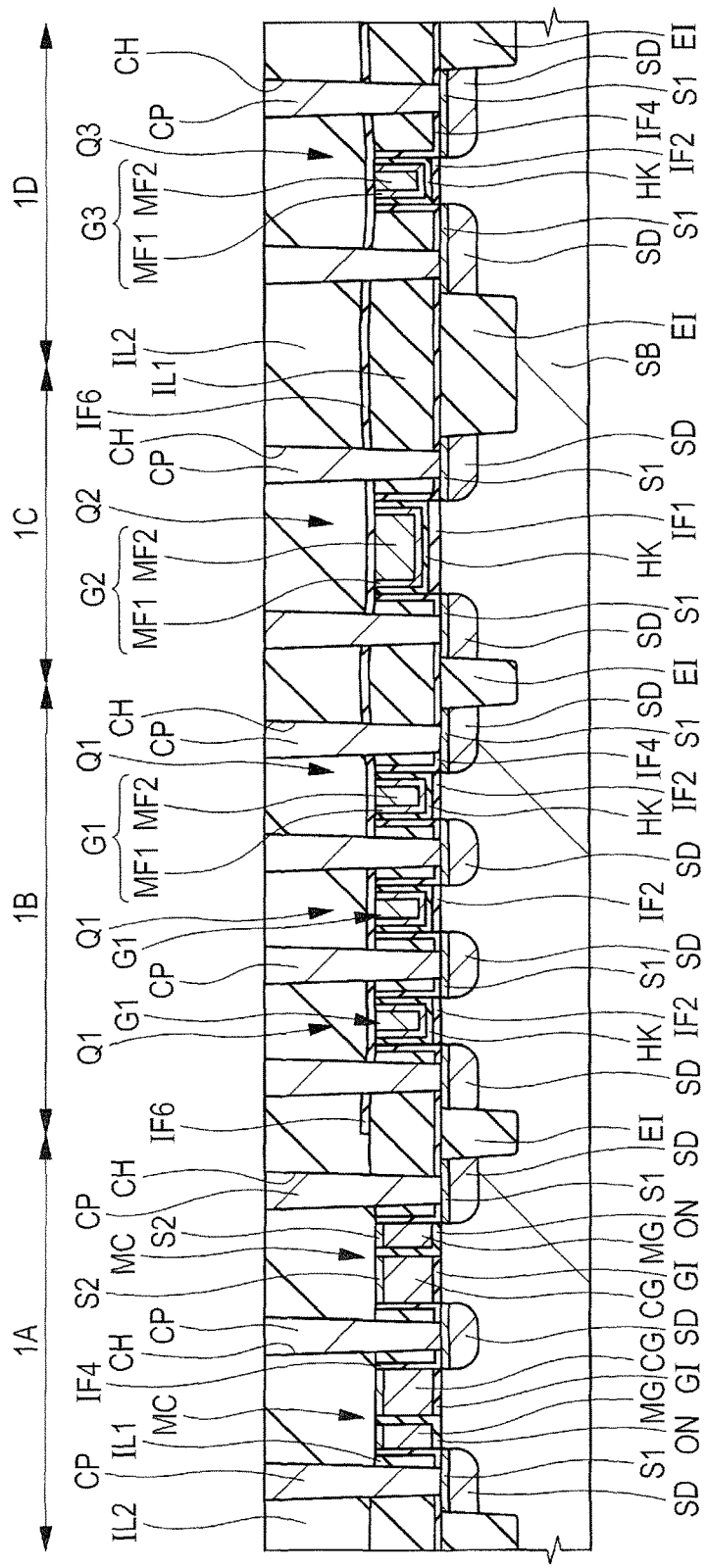
FIG. 23 is a cross-sectional view of the semiconductor device during the manufacturing process thereof, which is subsequent to FIG. 22.

Next, as shown in FIG. 23, in the individual contact holes CH, respective conductive contact plugs (coupling portions) CP made of tungsten (W) or the like are formed as coupling conductors. In the step of forming the contact plugs CP, first, over the interlayer insulating film IL2 including the inner portions of the contact holes CH, a barrier conductor film (e.g., a titanium film, a titanium nitride film, or a multilayer film thereof) is formed. Then, over the barrier conductor film, a main conductor film made of a tungsten film or the like is formed so as to completely fill each of the contact holes CH. Then, by removing the unneeded main conductor film and the unneeded barrier conductor film which are located outside the contact holes CH by a CMP method, an etch-back method, or the like, the contact plugs CP can be formed. Note that, for simpler illustration, in FIG. 23, the barrier conductor film and the main conductor film (tungsten film) which are included in each of the contact plugs CP are integrally shown.

The contact plugs CP embedded in the contact holes CH are formed so as to be coupled to the respective upper portions of the diffusion regions, the control gate electrodes CG, the memory gate electrodes MG, and the gate electrodes G1 to G3. That is, to the respective upper surfaces of the diffusion regions of the memory cells MC and the MISFETs Q1, the contact plugs CP are coupled via the silicide layers S1. To the respective upper surfaces of the control gate electrodes CG and the memory gate electrodes MG, the contact plugs CP are coupled via the silicide layers S2.

One of the purposes of providing the silicide layers S1 and S2 is to reduce the contact resistances between the contact plugs CP and the diffusion regions, the control gate electrodes CG, and the memory gate electrodes MG which are made of a semiconductor. Therefore, between the gate electrodes G1 to G3 as the metal gate electrodes and the contact plugs CP, the silicide layers are not provided.

Figure 24:
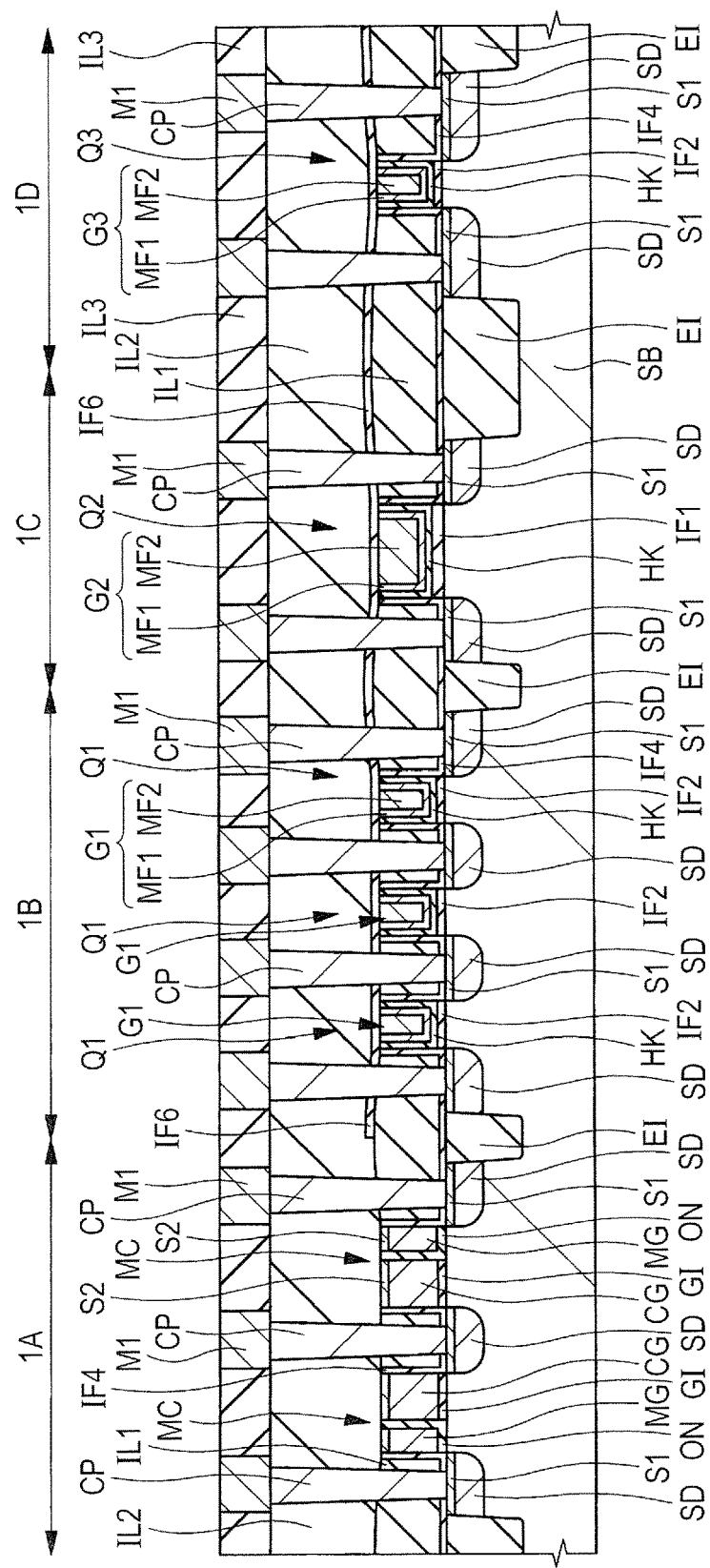
FIG. 24 is a cross-sectional view of the semiconductor device during the manufacturing process thereof, which is subsequent to FIG. 23.

Next, as shown in FIG. 24, over the interlayer insulating film IL2, an interlayer insulating film IL3 is formed (deposited) using, e.g., a CVD method. The interlayer insulating film IL3 is made of, e.g., a silicon dioxide film. Subsequently, using a photolithographic technique and a dry etching method, the interlayer insulating film IL3 is processed. Thus, the interlayer insulating film IL3 is opened to form a plurality of trenches (wire trenches) exposing the upper surfaces of the contact plugs CP.

Subsequently, using a sputtering method, a barrier conductor film and a main conductor film are successively formed over the interlayer insulating films IL2 and IL3 and the contact plugs CP. A barrier conductor film BM is made of, e.g., tantalum (Ta), tantalum nitride (TaN), or the like and can be formed by, e.g., a sputtering method. The main conductor film is made of, e.g., copper (Cu) and formed by depositing a seed film made of copper (Cu) over the barrier conductor film by a sputtering method or the like and then forming a thick copper (Cu) film over the seed film by a plating method.

Subsequently, the unneeded barrier conductor film and the unneeded main conductor film over the interlayer insulating film IL3 are removed using a CMP method or the like to expose the upper surface of the interlayer insulating film IL3. Thus, wires Ml each including the barrier conductor film and the main conductor film which are embedded in each of the plurality of trenches (wire trenches) of the interlayer insulating film IL3 are formed. The wires Ml and the interlayer insulating film IL3 form a first wiring layer. The barrier conductor film has the function of preventing copper forming the wires embedded in the trenches of the interlayer insulating film IL3 to form the wires from being diffused into an insulating film around the wires Ml, such as the interlayer insulating film IL3.

The plurality of first-layer wires Ml are electrically coupled to the respective upper surfaces of the contact plugs CP. Consequently, some of the wires Ml are electrically coupled to the source/drain regions SD via the contact plugs CP and the silicide layers S1. Others of the wires Ml are electrically coupled to the control gate electrodes CG or the memory gate electrodes MG via the contact plugs CP and the silicide layers S2. The others of the wires Ml are electrically coupled to the gate electrodes G1 to G3 via the contact plugs CP.

Then, over the first wiring layer, a second wiring layer, a third wiring layer, and the like are successively formed to form multiple wiring layers. Then, a semiconductor wafer is singulated by a dicing step to provide the plurality of semiconductor chips. In this manner, each of the semiconductor devices in Embodiment 1 is manufactured.

In the semiconductor device in Embodiment 1, the position of the upper surface of each of the interlayer insulating films IL1 embedded in the spaces between the gate electrodes G1, G2, ad G3 adjacent to each other is higher than the position of the upper surface of each of the control gate electrodes CG, the memory gate electrodes MG, and the gate electrodes G1, G2, and G3. In other words, the position of the upper surface of each of the interlayer insulating films IL1 embedded in the spaces between the gate electrodes G1, G2, and G3 adjacent to each other is higher than the position of the bottom surface of the interlayer insulating film IL2 immediately over each of the control gate electrodes CG, the memory gate electrodes MG, and the gate electrodes G1, G2, and G3.

<About Operations in Nonvolatile Memory>

Next, a description will be given of an example of operations in the nonvolatile memory with reference to FIG. 25.

Each of the memory cells in Embodiment 1 has a MISFET structure, uses a charge storage state in a trapping insulating film in the gate electrode of the MISFET as stored information, and reads the stored information as the threshold of the transistor. The trapping insulating film refers to an insulating film capable of storing charges therein, and examples thereof include the silicon nitride film included in the ONO film ON (see FIG. 24). By injection/release of charges into/from such a charge storage region, the threshold of the MISFET is shifted to allow the MISFET to operate as a storage element. Examples of a nonvolatile semiconductor storage device using a trapping insulating film include a split-gate MONOS memory, such as the memory cells in Embodiment 1.

FIG. 25 is a table showing an example of conditions under which voltages are applied to the individual portions of the selected memory cell during "Write", "Erase", and "Read" operations in Embodiment 1. In the table of FIG. 25, a voltage Vmg applied to the memory gate electrode MG of each of the memory cells MC as shown in FIG. 24, a voltage Vs applied to the source region thereof, a voltage Vcg applied to the control gate electrode CG thereof, a voltage Vd applied to the drain region thereof, and a base voltage Vb applied to the p-type well thereof in the upper surface of the semiconductor substrate during each of the "Write", "Erase", and "Read" operations are shown. The selected memory cell mentioned herein refers to a memory cell selected as a target to which the "Write", "Erase", or "Read" operation is to be performed.

Note that, in the example of the nonvolatile memory shown in FIG. 24, the source region is formed closer to the memory gate electrode MG and the drain region is formed closer to the control gate electrode CG. Also, what is shown in the table of FIG. 25 is a preferred example of the conditions for voltage application. The conditions for voltage application are not limited thereto and can variously be changed as necessary. In Embodiment 1, the injection of electrons into the silicon nitride film as the internal charge storage portion of the ONO film ON of the memory transistor is defined as the "Write" operation, and the injection of holes (positive holes) into the silicon nitride film is defined as the "Erase" operation.

Note that, in the table of FIG. 25, the row A corresponds to the case where an SSI method is used as a write method and a BTBT method is used as an erase method. The row B corresponds to the case where the SSI method is used as the write method and a FN method is used as the erase method. The row C corresponds to the case where the FN method is used as the write method and the BTBT method is used as the erase method. The row D corresponds to the case where the FN method is used as each of the write method and the erase method.

The SSI method can be regarded as an operation method which injects hot electrons into the silicon nitride film to perform a write operation to the memory cell. The BTBT method can be regarded as an operation method which injects hot holes into the silicon nitride film to perform an erase operation to the memory cell. The FN method can be regarded as an operation method which uses the tunneling of electrons or holes to perform a write operation or an erase operation. In other words, a write operation in accordance with the FN method can be regarded as an operation method which injects electrons into the silicon nitride film using a FN tunnel effect to perform a write operation to the memory cell, and an erase operation in accordance with the FN method can be regarded as an operation method which injects holes into the silicon nitride film using the FN tunnel effect to perform an erase operation to the memory cell. A specific description will be given below.

A write method is subdivided into a write method (hot electron injection write method) called the SSI (Source Side Injection) method which performs a write operation by performing hot electron injection in accordance with source side injection, and a write method (tunneling write method) called the FN (Fowler Nordheim) method which performs a write operation using FN tunneling.

A write operation in accordance with the SSI method is performed by applying, e.g., voltages (Vmg=10 V, Vs=5 V, Vcg=1 V, Vd=0.5 V, and Vb=0 V) as shown as "Write Operation Voltages" in the row A or B in the table of FIG. 25 to the individual portions of the selected memory cell to which the write operation is to be performed and injecting electrons into the silicon nitride film in the ONO film ON of the selected memory cell.

At this time, hot electrons are generated in the channel region (between the source and drain regions) under the space between the two gate electrodes (memory gate electrode MG and control gate electrode CG) and injected into the silicon nitride film as the internal charge storage portion of the ONO film ON under the memory gate electrode MG. The injected hot electrons (electrons) are trapped by the trap level in the silicon nitride film in the ONO film ON, resulting in an increase in the threshold voltage of the memory transistor. That is, the memory transistor is brought into a written state.

A write operation in accordance with the FN method is performed by applying, e.g., voltages (Vmg=−12 V, Vs=0 V, Vcg=0 V, Vd=0 V, and Vb=0 V) as shown as "Write Operation Voltages" in the row C or D in the table of FIG. 25 to the individual portions of the selected memory cell to which the write operation is to be performed and causing tunneling of electrons from the memory gate electrode MG in the selected memory cell and injection thereof into the silicon nitride film in the ONO film ON. At this time, the electrons from the memory gate electrode MG tunnel through the silicon dioxide film (top oxide film) forming the upper surface of the ONO film ON by FN tunneling (under the FN tunnel effect) to be injected into the ONO film ON and trapped by the trap level in the silicon nitride film in the ONO film ON, resulting in an increase in the threshold voltage of the memory transistor. That is, the memory transistor is brought into the written state.

Note that the write operation in accordance with the FN method can also be performed by causing tunneling of electrons from the semiconductor substrate SB and injection thereof into the silicon nitride film in the ONO film ON. In this case, the write operation voltages can be, e.g., voltages obtained by inverting the positive/negative signs of the "Write Operation Voltages" in the row C or D in the table of FIG. 25.

An erase method is subdivided into an erase method (hot hole injection erase method) called the BTBT (Band-To-Band Tunneling phenomenon) method which performs an erase operation by hot hole injection using the BTBT, and an erase method (tunneling erase method) called the FN (Fowler Nordheim) method which performs an erase operation using the FN tunneling.

An erase operation in accordance with the BTBT method is performed by injecting holes (positive holes) generated by the BTBT into the charge storage portion (silicon nitride film in the ONO film ON). For example, voltages (Vmg=−6 V, Vs=6 V, Vcg=0 V, Vd=open, and Vb=0 V) as shown as "Erase Operation Voltages" in the row A or C in the table of FIG. 25 are applied to the individual portions of the selected memory cell to which the erase operation is to be performed. Thus, the holes are generated using the BTBT phenomenon and subjected to electric field acceleration to be injected into the silicon nitride film in the ONO film ON of the selected memory cell, thus reducing the threshold voltage of the memory transistor. That is, the memory transistor is brought into an erased state.

An erase operation in accordance with the FN method is performed by applying, e.g., voltages (Vmg=12 V, Vs=0 V, Vcg=0 V, Vd=0 V, and Vb=0 V) as shown as "Erase Operation Voltages" in the row B or D in the table of FIG. 25 to the individual portions of the selected memory cell to which the erase operation is to be performed and causing tunneling of holes from the memory gate electrode MG in the selected memory cell and injection thereof into the silicon nitride film in the ONO film ON. At this time, the holes from the memory gate electrode MG tunnel through the silicon dioxide film (top oxide film) by the FN tunneling (under the FN tunnel effect) to be injected into the ONO film ON and trapped by the trap level in the silicon nitride film in the ONO film ON, resulting in a reduction in the threshold voltage of the memory transistor. That is, the memory transistor is brought into an erased state.

Note that the erase operation in accordance with the FN method can also be performed by causing tunneling of holes from the semiconductor substrate SB and injection thereof into the silicon nitride film in the ONO film ON. In this case, the erase operation voltages can be, e.g., voltages obtained by inverting the positive/negative signs of the "Erase Operation Voltages" in the row B or D in the table of FIG. 25.

During a read operation, e.g., voltages as shown as "Read Operation Voltages" in the row A, B, C, or D in the table of FIG. 25 are applied to the individual portions of the selected memory cell to which the read operation is to be performed. By setting the voltage Vmg to be applied to the memory gate electrode MG during the read operation to a value between the threshold voltage of the memory transistor in the written state and the threshold voltage thereof in the erased state, the written state or the erased state can be determined.

<About Effects of Embodiment 1>

The following will describe the effects of the manufacturing method and the semiconductor device in Embodiment 1 using a comparative example shown in FIGS. 32 to 35. FIGS. 32 to 35 are cross-sectional views showing the manufacturing process of a semiconductor device in the comparative example. In FIGS. 32 to 35, in the same manner as in FIGS. 1 to 24, the memory cell region 1A, the first lower-breakdown-voltage transistor region 1B, the higher-breakdown-voltage transistor region 1C, and the second lower-breakdown-voltage transistor region 1D are shown in this order in the left-to-right direction.

In a semiconductor device having a MISFET, by making the gate electrodes of the MISFET of metal gate electrodes, it is possible to reduce the resistances of the gate electrodes. However, in the case of forming the source/drain regions after forming the metal gate electrodes, when heat treatment for diffusing the impurities in the source/drain regions is performed, the metal gate electrodes are damaged and the MISFET no longer normally operates. By contrast, when dummy gate electrodes made of a semiconductor film are formed in a peripheral circuit region for a memory cell region, the source/drain regions SD are formed therein and subjected to heat treatment, and then the dummy gate electrodes are replaced with metal gate electrodes, the metal gate electrodes can be formed without being damaged by the heat treatment. That is, in the case of forming the metal gate electrodes, it is desirable to use a gate last process.

It can be considered that, in the gate last process, the dummy gate electrodes are replaced with the metal gate electrodes in the manner as described below in the comparative example. In the manufacturing process of the semiconductor device in the comparative example, first, the process steps described using FIGS. 1 to 10 are performed. That is, after the control gate electrodes CG and the dummy gate electrodes DG1 to DG3 are formed, the insulating films IF3 made of the silicon nitride film are formed thereover. Then, the insulating film IF4 and the interlayer insulating film IL1 are formed to cover the individual gate electrodes and the insulating films IF3. Then, the upper surface of the interlayer insulating film IL1 is polished to expose the insulating films IF3 and IF4 made of the silicon nitride film from the interlayer insulating film IL1.

Figure 32:
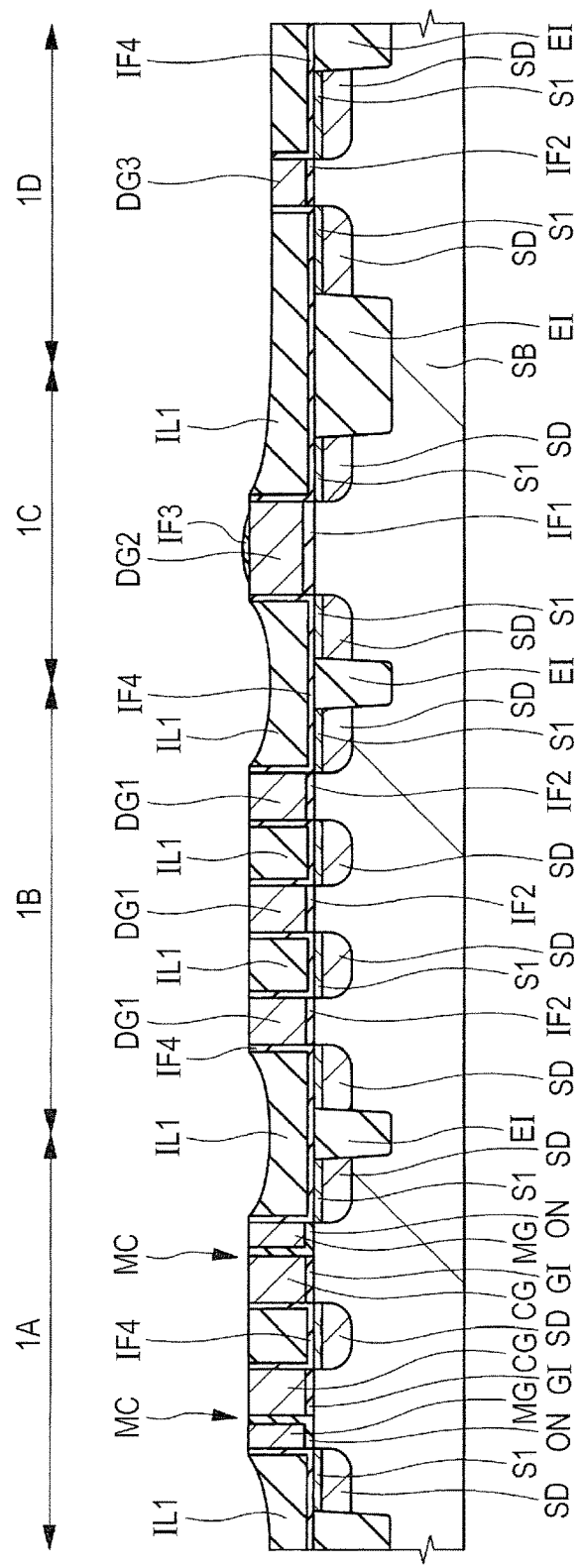
FIG. 32 is a cross-sectional view of a semiconductor device in a comparative example during the manufacturing process thereof.

Next, as shown in FIG. 32, the respective upper surfaces of the interlayer insulating film IL1 and the insulating films IF4 and IF3 are polished using a CMP method to expose the respective upper surfaces of the control gate electrodes CG, the memory gate electrodes MG, and the dummy gate electrodes DG1 to DG3. In the polishing step, the interlayer insulating film IL1 made of the silicon dioxide film and the insulating films IF3 and IF4 made of the silicon nitride film are simultaneously polished. The polishing is performed under conditions in which a selectivity to the silicon film is high.

However, in the polishing using the CMP method, it is difficult to polish the silicon nitride film and the silicon dioxide film at the same polishing rate. The silicon dioxide film is polished more significantly in a shorter time than the silicon nitride film. Consequently, at the time when the respective upper surfaces of the control gate electrodes CG, the memory gate electrodes MG, and the dummy gate electrodes DG1 to DG3 are exposed by the removal of the insulating film IF3, the upper surface of the interlayer insulating film IL1 made of the silicon dioxide film is significantly polished off.

As a result, the upper surfaces of the interlayer insulating films IL1 have shapes recessed from the respective upper surfaces of the insulating film IF4, the control gate electrodes CG, the memory gate electrodes MG, and the dummy gate electrodes DG1 to DG3 toward the main surface of the semiconductor substrate SB. That is, the problem of so-called dishing in which the polished surface is not planarized but has roughness arises.

In addition, since the silicon nitride film is less likely to be polished than the silicon dioxide film, the silicon nitride film may remain over a pattern having a large width. For example, as shown in the higher-breakdown-voltage transistor region 1C in FIG. 32, the dummy gate electrode DG2 to be replaced later with the metal gate electrode having a large width has a large gate length. Therefore, it can be considered that, over the dummy gate electrode DG2, a portion of the insulating film IF3 is not polished and remains.

In the second lower-breakdown-voltage transistor region 1D where the dummy gate electrodes DG3 are coarsely formed, the dummy gate electrodes DG3 each including the polysilicon film and the insulating film IF4 covering the dummy gate electrodes DG3 are not densely formed and the interlayer insulating film IL1 is formed to occupy a large area. Accordingly, in the foregoing polishing step, in the second lower-breakdown-voltage transistor region 1D, the respective upper surfaces of not only the interlayer insulating films IL1, but also the dummy gate electrodes DG3 and the insulating films IF4 and the sidewalls (not shown) which cover the side walls thereof are significantly polished off. As a result, the entire upper surface of the second lower-breakdown-voltage transistor region 1D including the dummy gate electrodes DG3 and the interlayer insulating films IL1 is relatively low. That is, the height of the upper surface of each of the dummy gate electrodes DG3 is lower than the heights of the respective upper surfaces of the control gate electrodes CG and the dummy gate electrodes DG1 and DG3.

Figure 33:
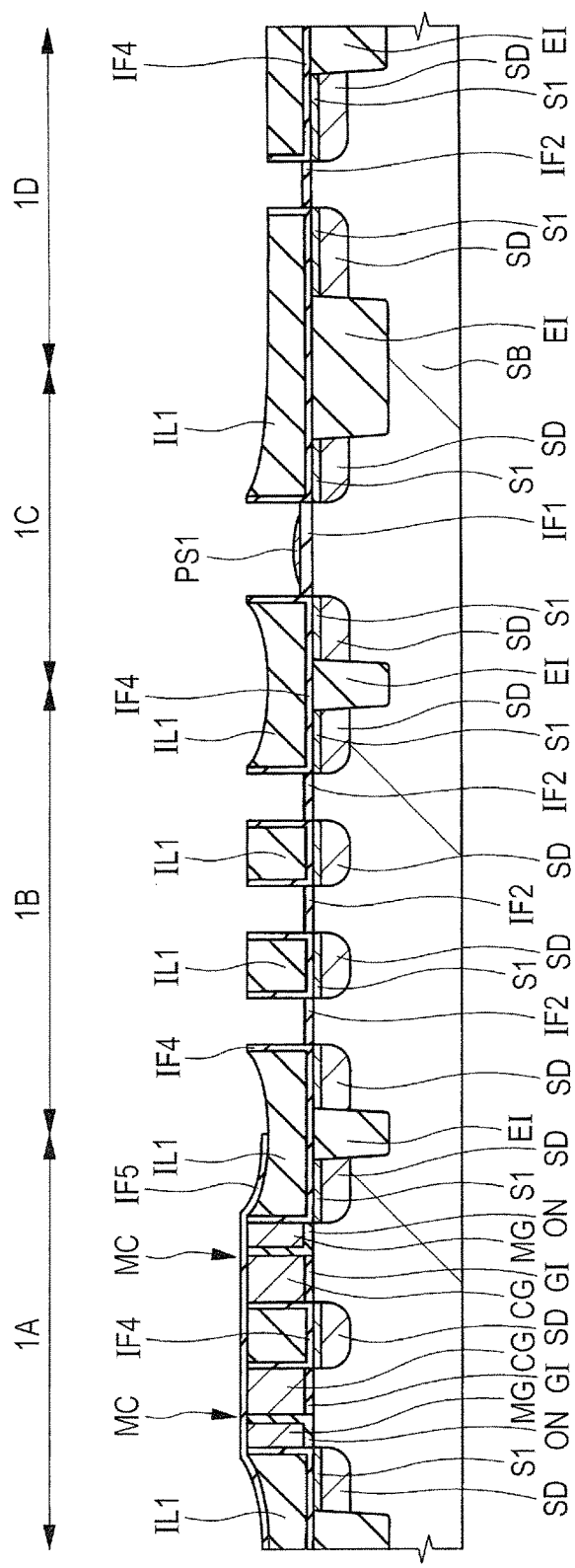
FIG. 33 is a cross-sectional view of the semiconductor device during the manufacturing process thereof, which is subsequent to FIG. 32.

Next, as shown in FIG. 33, the same process steps as those described using FIGS. 13 to 15 are performed to cover the memory cell region 1A with the hard mask IF5 and then remove the dummy gate electrodes DG1 to DG3 by a wet etching method. It can be considered herein that the insulating film IF3 remaining over the dummy gate electrode DG2 in the higher-breakdown-voltage transistor region 1C is detached by the removal of the dummy gate electrode DG2. However, since the wet etching is performed under conditions in which the selectivity to the silicon nitride film is high, the insulating film IF3 that has been detached may remain as a residue over the semiconductor substrate SB. Such a residue causes defective film deposition, a coupling failure, or the like.

Since the insulating film IF3 is formed, the removal of the dummy gate electrode DG2 located thereunder is inhibited and the polysilicon film PS1 as a portion of the dummy gate electrode DG2 may remain. That is, at the bottom portion of the trench formed by the removal of the other portion of the dummy gate electrode DG2, the polysilicon film PS1 covering a portion of the main surface of the semiconductor substrate SB and a portion of the upper surface of the insulating film IF1 remains.

Figure 34:
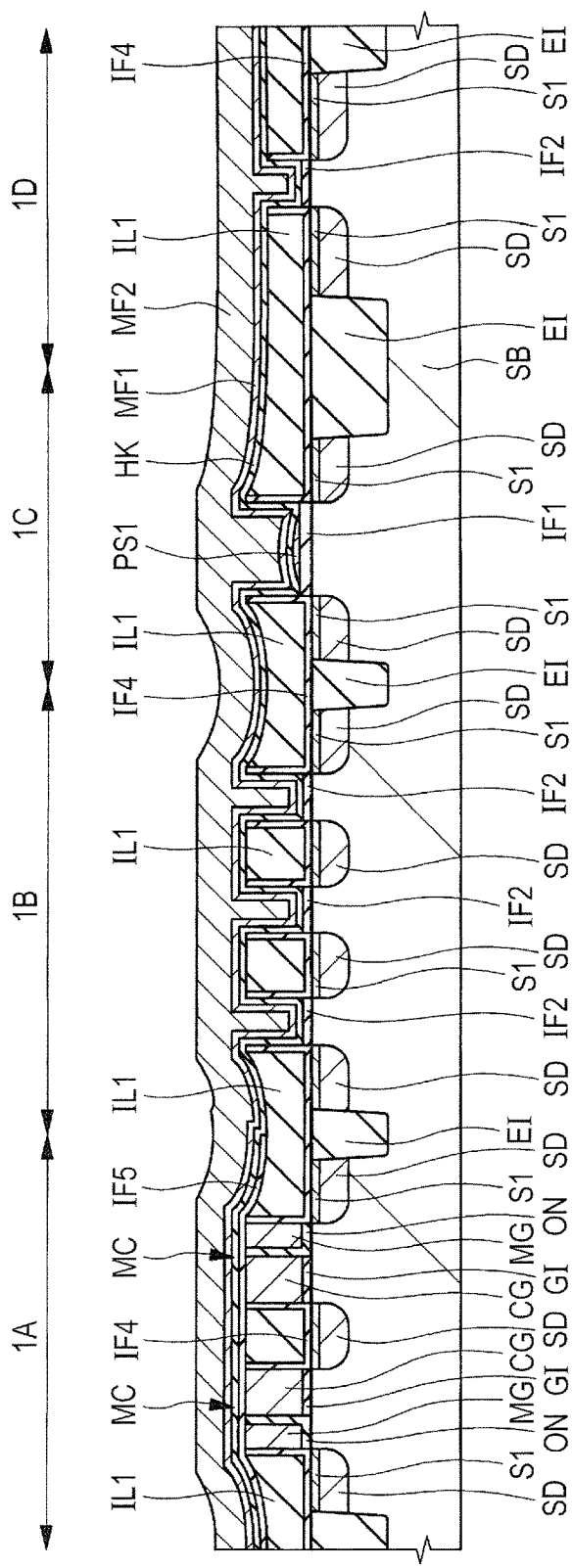
FIG. 34 is a cross-sectional view of the semiconductor device during the manufacturing process thereof, which is subsequent to FIG. 33.

Next, as shown in FIG. 34, the same process step as described using FIG. 16 is performed to successively form the insulating film HK and the metal films MF1 and MF2. Thus, each of the plurality of trenches formed by the removal of the foregoing dummy gate electrodes DG1 to DG3 is completely filled.

Figure 35:
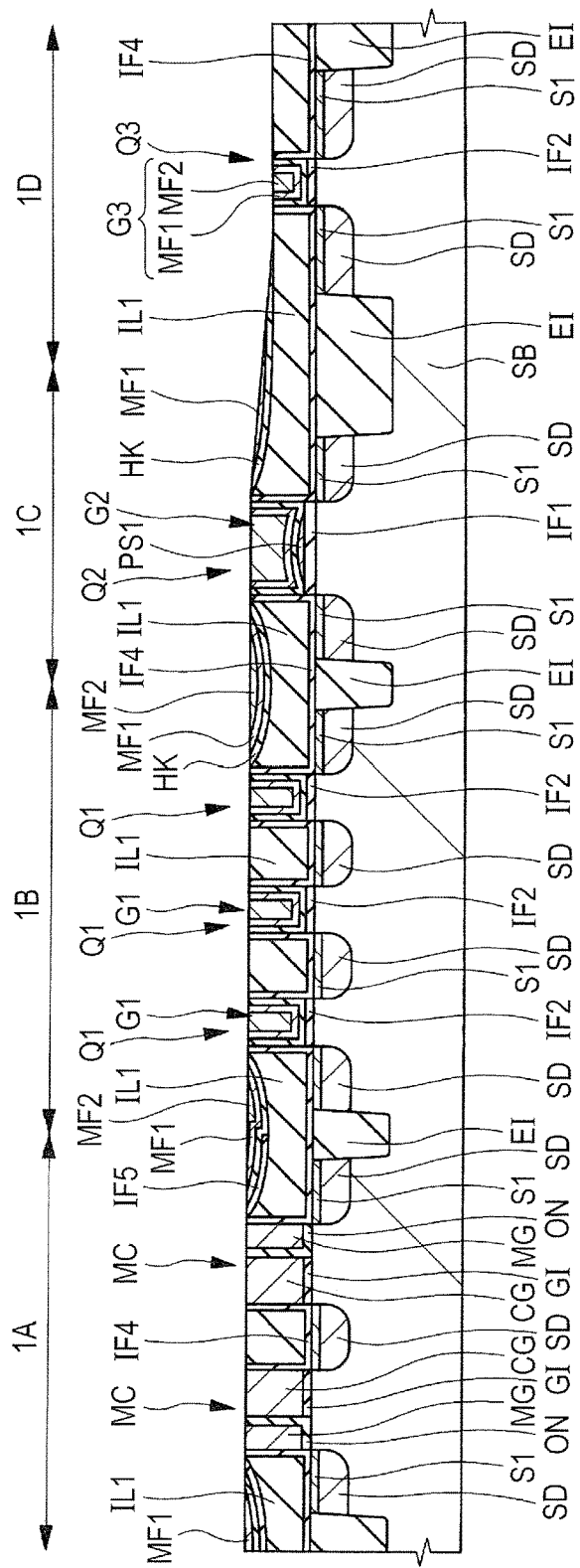
FIG. 35 is a cross-sectional view of the semiconductor device during the manufacturing process thereof, which is subsequent to FIG. 34.

Next, as shown in FIG. 35, using, e.g., a CMP method, the upper surface of a multilayer film including the insulating film HK and the metal films MF1 and MF2 is polished to expose the upper surfaces of the interlayer insulating films IL1. The polishing is performed to separate the multilayer films embedded in the foregoing plurality of trenches from each other and form the metal gate electrodes made of the respective multilayer films in the individual trenches. By the polishing step, the gate electrodes G1 are formed in the first lower-breakdown-voltage transistor region 1B, the gate electrode G2 is formed in the higher-breakdown-voltage transistor region 1C, and the gate electrodes G3 are formed in the second lower-breakdown-voltage transistor region 1D.

At this time, in the recessed portions formed in the upper surfaces of the interlayer insulating films IL1 by the polishing step described using FIG. 32, portions of the multilayer films each including the insulating film HK and the metal films MF1 and MF2 remain without being polished. Also, in the second lower-breakdown-voltage transistor region 1D, the upper surfaces of the dummy gate electrodes DG3 are lowered in height by the polishing step described using FIG. 32 so that the gate electrodes G3 are formed lower in height than the gate electrodes G1 and the like.

Then, the same process steps as described using FIGS. 17 to 24 are performed, though the illustration thereof is omitted, to allow the semiconductor device in the comparative example to be manufactured. In the semiconductor device in the comparative example thus formed, the following problem arises.

That is, when the recessed portions are formed in the upper surfaces of the interlayer insulating films IL1 and the upper surfaces of the interlayer insulating films IL1 are lower in height with distance from the gate electrodes, portions of the multilayer films each including the insulating film HK and the metal films MF1 and MF2 remain between the interlayer insulating films IL1 and the interlayer insulating film IL2 (see FIG. 24) formed thereover. Even when it is attempted to form the contact holes CH to expose the source/drain regions SD from the interlayer insulating films IL1 and IL2 by performing the same process step as that described using FIG. 22, a problem is encountered in which dry etching can be performed only to the upper surfaces of the multilayer films and the contact holes CH do not extend through the interlayer insulating films IL1.

This is because, in the dry etching for forming the contact holes CH, it is not assumed to process the metal films and the etching is performed under conditions in which the selectivity to the metal films is high. When the recessed portions are thus formed in the upper surfaces of the interlayer insulating films IL1 due to the dishing and the metal films remain, the problem of defective contact plug formation arises. Or when the foregoing multilayer films each including the metal films remain over the interlayer insulating films IL1, a short circuit may occur in an element or between elements via the multilayer films. This degrades the reliability of the semiconductor device.

Also, when the foregoing multilayer films remain over the interlayer insulating films IL1, in the step of forming the silicide layers S2 described using FIG. 19, the multilayer films exposed from the insulating film IF6 may be detached from the upper surfaces of the interlayer insulating films IL1 and remain as residues over the semiconductor substrate SB. It can be considered that the multilayer films are detached by the heat treatment when the silicide layers S2 are formed. It can also be considered that the multilayer films are detached by a cleaning step performed after the insulating film IF6 is processed, a cleaning step performed after the removal of the metal films used in the formation of the silicide layers S2, or the like.

Also, when the polysilicon film PS1 forming the dummy gate electrode DG2 (see FIG. 32) is left between the insulating film IF1 and the gate electrode G2, the characteristics of the MISFET Q2 significantly change and the MISFET Q2 no longer normally operates. This degrades the reliability of the semiconductor device.

As shown in the second lower-breakdown-voltage transistor region 1D in FIG. 35, in the case where the upper surfaces of the gate electrodes G3 are formed low together with the upper surfaces of the interlayer insulating films IL1, when the multilayer film including the foregoing metal films MF1 and MF2 remains in any of the recessed portions of the upper surfaces of the interlayer insulating films IL1, the problem of a short circuit between the gate electrode G3 and the gate insulating film of another gate electrode, the contact plug, or the like occurs. This degrades the reliability of the semiconductor device.

Such problems are more prominent as the film thickness of each of the insulating films IF3 as the cap insulating films over the respective upper surfaces of the control gate electrodes CG and the dummy gate electrodes DG1 to DG3 shown in FIG. 7 increases. This is because, when the film thickness of the insulating film IF3 made of the silicon nitride film is large, the time period of the polishing performed in the step described using FIG. 32 increases so that the upper surface of the interlayer insulating film IL1 made of the silicon dioxide film is more significantly recessed.

However, it is difficult to reduce the film thickness of the insulating film IF3 for the following two reasons. First, in the ion implantation performed to form the extension regions and the diffusion regions described using FIG. 7, it is necessary to prevent impurity ions from extending through the memory gate electrodes MG and being implanted into the ONO films ON in terms of avoiding the degradation of the reliability of the memory cells formed later. Accordingly, each of the memory gate electrodes MG needs to have a large film thickness in a direction perpendicular to the main surface of the semiconductor substrate SB. To form the memory gate electrodes MG each having such a film thickness, it is necessary to increase the film thickness of the insulating film IF3.

Second, in the case of removing the dummy gate electrodes DG1 to DG3 by wet etching in the process step described using FIG. 15, in the step of forming the foregoing source/drain regions SD (see FIG. 7), it is necessary to prevent the impurity from extending through the insulating films IF3 and being implanted into the dummy gate electrodes DG1 to DG3. This is because, in the wet etching performed in the process step described using FIG. 15, it is difficult to remove the dummy gate electrodes DG1 to DG3 in which the impurity is excessively introduced. It is particularly difficult to remove the polysilicon film in which B (boron) is excessively introduced as the p-type impurity by wet etching.

Note that, in the case of removing the dummy gate electrodes DG1 to DG3 using the dry etching in the process step described using FIG. 15, even when the impurity is introduced at a high concentration in each of the dummy gate electrodes DG1 to DG3, the dummy gate electrodes DG1 to DG3 can easily be removed. However, as described using FIG. 15, since Embodiment 1 uses the high-k last process and the dry etching method has a low selectivity to the silicon dioxide film, the dummy gate electrodes DG1 to DG3 cannot be removed using dry etching.

However, in the case of forming a high-k film over the semiconductor substrate and forming the dummy gate electrodes DG1 to DG3 over the high-k film via a titanium nitride (TiN) film or the like, i.e., in the case of performing a so-called high-k first process, the dummy gate electrodes DG1 to DG3 can be removed by dry etching. This is because, even when dry etching is performed, it is possible to perform etching at a high selectivity on a metal film such as a TiN film.

For the foregoing two reasons, the insulating films IF3 need to be formed to have large film thicknesses. Accordingly, as described using FIG. 32, when the insulating films IF3 made of a silicon nitride film and the interlayer insulating films IL1 made of a silicon dioxide film are simultaneously polished, the recessed portions are formed in the upper surfaces of the interlayer insulating films IL1.

To prevent this, in Embodiment 1, the insulating film IF3 made of the silicon nitride film and the interlayer insulating film IL1 made of the silicon dioxide film are not simultaneously polished. After the insulating films IF3 and IF4 each made of the silicon nitride film are exposed from the interlayer insulating film IL1 by performing polishing as shown in FIG. 10, the insulating films IF3 and IF4 over each of the gate electrodes are removed by dry etching and then the interlayer insulating film IL1 is polished. As a result, irrespective of the different polishing rates of the silicon nitride film and the silicon dioxide film in the polishing step, it is possible to expose the upper surface of each of the gate electrodes and prevent the upper surfaces of the interlayer insulating films IL1 from being recessed.

That is, as shown in FIG. 12, after the control gate electrodes CG and the dummy gate electrodes DG1 to DG3 are exposed, the upper surfaces of the interlayer insulating films IL1 are formed with no recessed portion, but conversely protrude upwardly.

Accordingly, as described using FIGS. 16 and 17, when the gate electrodes G1 to G3 are formed by forming the multilayer films each including the insulating film HK and the metal films MF1 and MF2 over the interlayer insulating film IL1 and then performing the polishing step, it is possible to prevent portions of the multilayer films from being left over the interlayer insulating films IL1. Therefore, it is possible to prevent the occurrence of defective contact plug formation due to the multilayer films remaining over the interlayer insulating films IL and the occurrence of a short circuit in an element or between elements.

In addition, since Embodiment 1 removes the insulating films IF3 by dry etching, it is possible to uniformly reduce the film thicknesses of the insulating films IF3 in a downward direction irrespective of the widths of the insulating films IF3 and completely remove the insulating films IF3 from over the control gate electrodes CG and the dummy gate electrodes DG1 to DG3. Therefore, it is possible to prevent the insulating films IF3 from remaining as residues.

As a result, it is possible to prevent defective film deposition, a coupling failure, or the like from occurring due to the residues of the insulating films IF3. It is also possible to prevent the insulating films IF3 from remaining over the dummy gate electrodes DG1 to DG3 and inhibiting the removal of the dummy gate electrodes DG1 to DG3 in the step of removing the dummy gate electrodes DG1 to DD3 described using FIG. 15. This can allow the dummy gate electrodes DG1 to DG3 to be appropriately removed and thus prevent a situation where the MISFETs no longer normally operate due to portions of the dummy gate electrodes DG1 to DG3 remaining under the metal gate electrodes.

In addition, in the step of forming the silicide layers S2 described using FIG. 19, it is possible to prevent the multilayer films each including the insulating film HK and the metal films MF1 and MF2, remaining over the interlayer insulating films IL1, and exposed from the insulating film IF6 from being detached from the upper surfaces of the interlayer insulating films IL1 and remaining as residues over the semiconductor substrate SB. This can prevent residues from being left over the semiconductor substrate SB.

Moreover, even in the region where the gate patterns are coarsely formed, i.e., in the second lower-breakdown-voltage transistor region 1D, in the step of polishing the interlayer insulating films IL1 (see FIG. 12), it is possible to prevent the respective upper surfaces of the interlayer insulating films IL1 and the dummy gate electrodes DG3 from being lowered in height to positions lower than those of the respective upper surfaces of the control gate electrodes CG and the dummy gate electrodes DG1 and DG2 in the other regions. Therefore, after the polishing step described using FIG. 17, it is possible to prevent portions of the multilayer films each including the insulating film HK and the metal films MF1 and MF2 from remaining over the interlayer insulating films IL1 in the second lower-breakdown-voltage transistor region 1D.

This can prevent the metal gate electrodes in the second lower-breakdown-voltage transistor region 1D, the source/drain regions SD electrically coupled to the contact plugs, and the like from being short-circuited in an element or between elements via the multilayer films due to the foregoing multilayer films remaining over the interlayer insulating films IL1.

Thus, Embodiment 1 allows the reliability of the semiconductor device to be improved.

Embodiment 2

Figure 26:
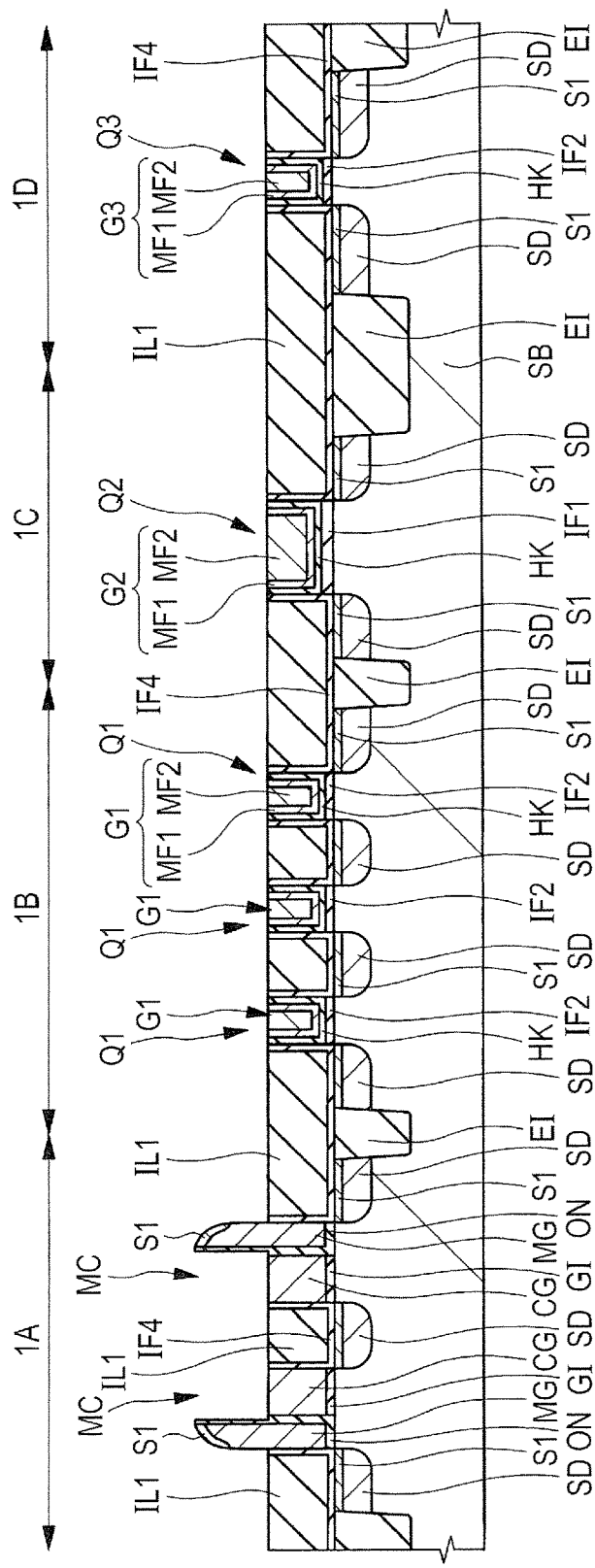
FIG. 26 is a cross-sectional view of a semiconductor device in Embodiment 2 during the manufacturing process thereof.
Figure 27:
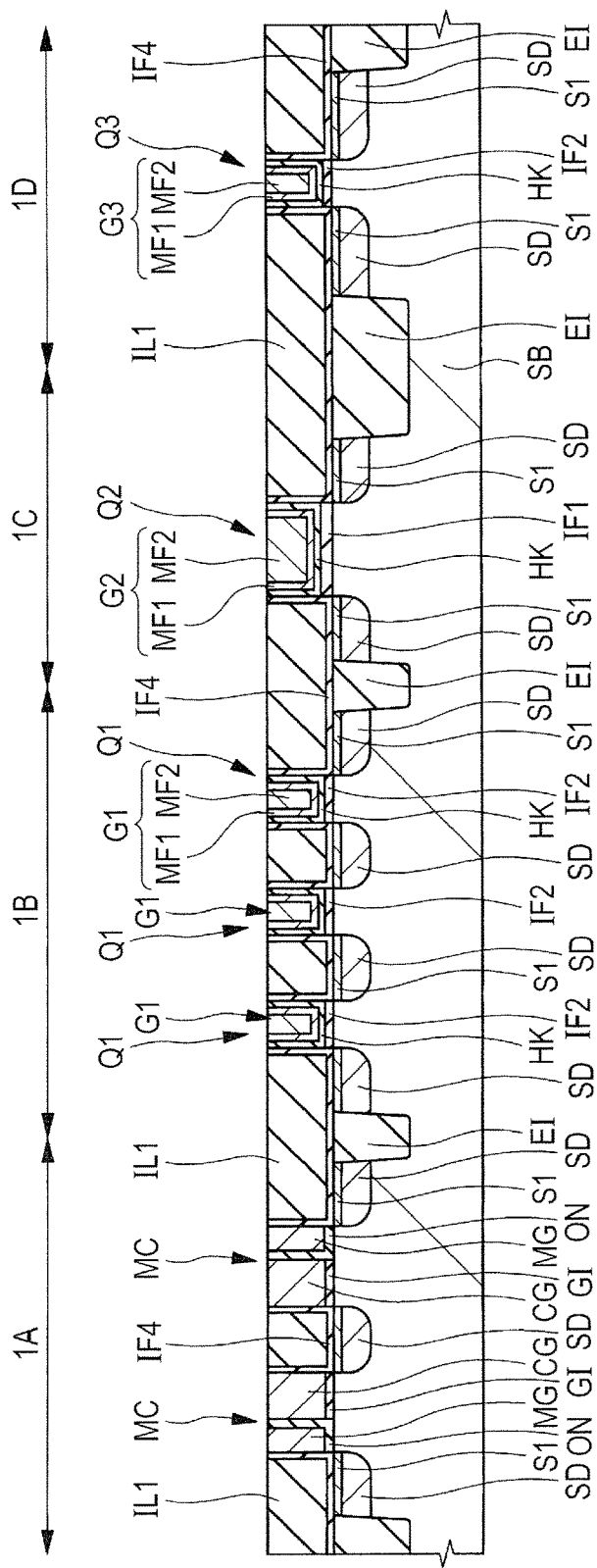
FIG. 27 is a cross-sectional view of the semiconductor device during the manufacturing process thereof, which is subsequent to FIG. 26.
Figure 28:
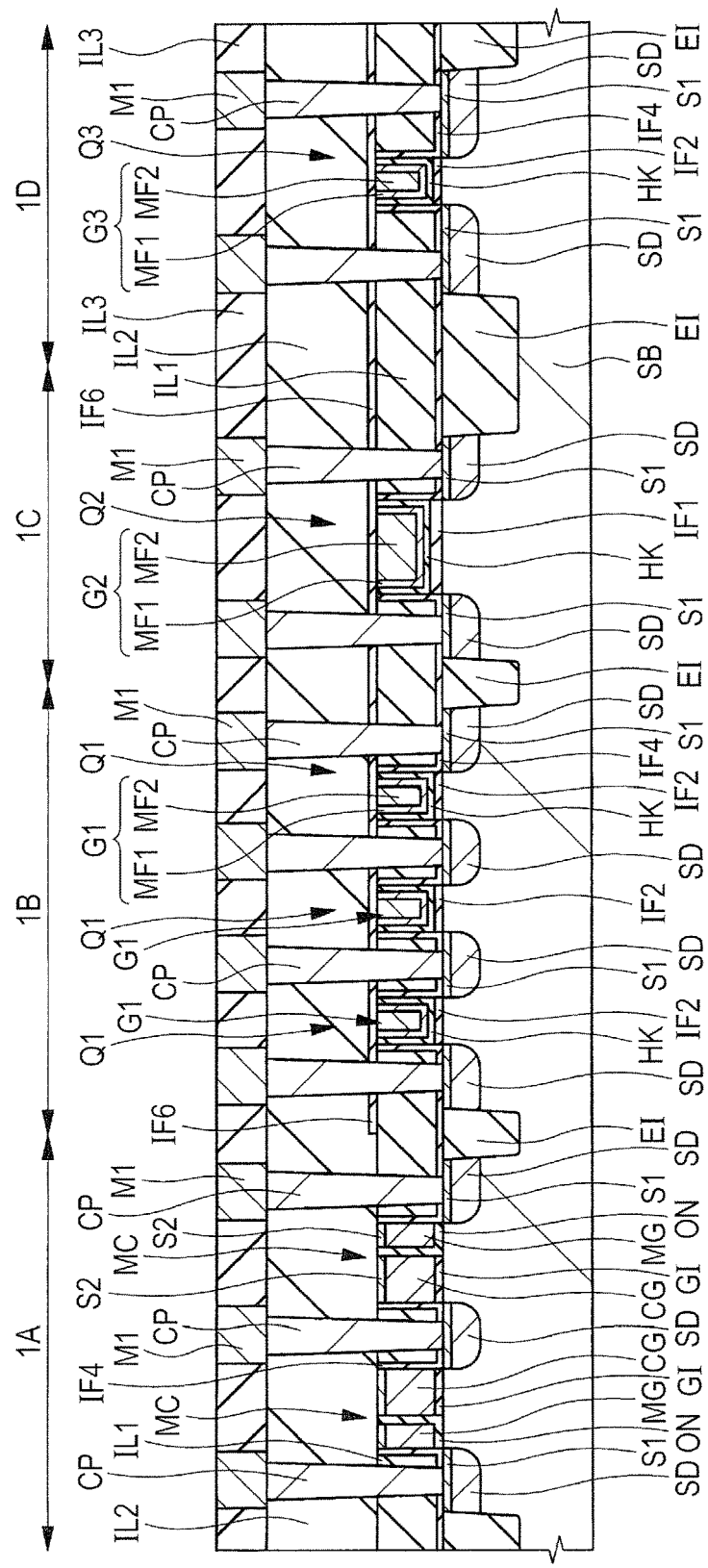
FIG. 28 is a cross-sectional view of the semiconductor device during the manufacturing process thereof, which is subsequent to FIG. 27.

The following will describe a method of manufacturing a semiconductor device in Embodiment 2 using FIGS. 26 to 28. In Embodiment 1 described above, as described using FIGS. 11 and 12, after the silicon nitride films (cap insulating films) are removed by dry etching, the silicon dioxide films (interlayer insulating films) are polished. By contrast, in Embodiment 2, the silicon nitride films and the silicon dioxide films are simultaneously etched back to expose the dummy gate electrodes. FIGS. 26 to 28 are cross-sectional views of the semiconductor device in Embodiment 2 during the manufacturing process thereof. Each of FIGS. 26 to 28 shows the memory cell region 1A, the first lower-breakdown-voltage transistor region 1B, the higher-breakdown-voltage transistor region 1C, and the second lower-breakdown-voltage transistor region 1D, similarly to FIG. 1.

In Embodiment 2, first, the process steps described using FIGS. 1 to 10 are performed. That is, the control gate electrodes CG and the dummy gate electrodes DG1 to DG3 are formed, and the insulating films IF3 made of the silicon nitride film are formed thereover. After the insulating film IF4 and the interlayer insulating film IL1 are formed to cover the gate electrodes and the insulating films IF3, the upper surface of the interlayer insulating film IL1 is polished to expose the insulating films IF3 and IF4 made of the silicon nitride film from the interlayer insulating films IL1. As described using FIG. 10, in the step of polishing the upper surface of the interlayer insulating film IL1 which is performed until the upper surface of the insulating film IL4 is exposed, the upper surfaces of the interlayer insulating films IL1 can be planarized to have no roughness.

Next, as shown in FIG. 26, an etch-back process is performed using a dry etching method to lower the respective upper surfaces of the insulating films IF4 and IF3 and the interlayer insulating films IL1 in height. By thus removing parts of the respective upper portions of the insulating films IF4 and the interlayer insulating films IL1 and entirely removing the insulating films IF3, the respective upper surfaces of the control gate electrodes CG and the dummy gate electrodes DG1 to DG3 are exposed. Also, a part of the upper portion of each of the memory gate electrodes MG and the silicide layer S1 covering the upper surface of the memory gate electrode MG are exposed.

Each of the memory gate electrodes MG is a conductor film formed in a sidewall shape over the side wall of the multilayer film including the control gate electrode CG and the insulating film IF3 located thereover. The upper surface of the memory gate electrode MG is at a position higher than that of the upper surface of the control gate electrode CG. In the step of etching back each of the insulating films IF4 and IF3 and the interlayer insulating films IL', the silicide layer S1 covering the upper surface of each of the memory gate electrodes MG is scarcely removed. Accordingly, the memory gate electrode MG immediately under the silicide layer S1 is protected with the silicide layer S1 and is not removed. As a result, in the regions over the respective upper surfaces of the control gate electrodes CG and the interlayer insulating films IL1 after the etch-back process, a part of the upper portion of each of the memory gate electrodes MG and the silicide layer S1 over the memory gate electrode MG protrude.

Note that the drawings show the structure in which one of the side walls of each of the memory gate electrodes MG located over the control gate electrode CG is covered with a portion of the ONO film ON. However, it can also be considered that the ONO film ON located over the control gate electrode CG is entirely removed and the side wall of the memory gate electrode MG is exposed.

In the etch-back step, to expose the respective upper surfaces of the control gate electrodes CG and the dummy gate electrodes DG1 to DG3, the respective upper surfaces of the interlayer insulating films IL1 and the insulating films IF3 and IF4 are lowered in height by a distance corresponding to the total film thickness of the insulating films IF3 and IF4. The total film thickness of the insulating films IF3 and IF4 is, e.g., 100 nm.

In the etch-back step, the silicon dioxide film and the silicon nitride film are removed at the same speed. Accordingly, the respective upper surfaces of the insulating films IF4 and IF3 and the interlayer insulating films IL1 are lowered in height at the same speed. Consequently, the surface planarized by the polishing step described using FIG. 10 is lowered to the height of the upper surface of each of the control gate electrodes CG or the like, while retaining the planar shape thereof. As a result, the surface including the respective upper surfaces of the insulating films IF4 and IF3 and the interlayer insulating films IL1 after the etch-back process retains the planarity of the surface including the respective upper surfaces of the interlayer insulating films IL1 and the insulating films IF4 after the polishing described using FIG. 10 is performed.

Next, as shown in FIG. 27, the respective upper surfaces of the interlayer insulating films IL1, the control gate electrodes CG, the memory gate electrodes MG, and the dummy control gate electrodes CG1 to CD3 are polished using a CMP method to be lowered in height. As a result, the upper portions of the memory gate electrodes MG protruding over the interlayer insulating films IL1 are removed and consequently the silicide layers S1 covering the upper surfaces of the memory gate electrodes MG are entirely removed. Thus, the respective upper surfaces of the interlayer insulating films IL1, the control gate electrodes CG, the memory gate electrodes MG, and the dummy gate electrodes DG1 to DG3 are planarized.

It can be considered that, in the etch-back process described using FIG. 26, by performing dry etching, the respective upper surfaces of the control gate electrodes CG and the dummy gate electrodes DG1 to DG3 are damaged by the introduction of carbon (C) or the like therein. Accordingly, in the polishing step described using FIG. 27, a portion of the upper surface of each of the control gate electrodes CG and the dummy gate electrodes DG1 to DG3 is removed to remove the damaged silicon layer. The distance by which the upper surface of the interlayer insulating film IL1 is lowered in height is smaller than 100 nm. Note that, unlike in Embodiment 1 described above, the upper surfaces of the interlayer insulating films IL1 do not protrude upwardly but have planar shapes at the same height as that of the upper surface of each of the gate electrodes such as the control gate electrodes CG.

Next, as shown in FIG. 28, by performing the same process steps as those described using FIGS. 18 to 24, the semiconductor device in Embodiment 2 can be manufactured.

In Embodiment 2, in the process step described using FIG. 26, a polishing step which removes the interlayer insulating films IL1 and the insulating films IF3 (cap insulating films) having different polishing rates is not performed, but the interlayer insulating films IL1 and the insulating films IF3 and IF4 are etched back. By thus lowering the respective upper surfaces of the interlayer insulating films IL1 and the insulating films IF3 and IF4 in height at the same speed, it is possible to expose the dummy gate electrodes DG1 to DG3 and the like, while retaining the planarity of the upper surfaces of the interlayer insulating films IL1 polished in the polishing step described using FIG. 10.

That is, since no roughness is produced in the upper surfaces of the interlayer insulating films IL1, it is possible to prevent recessed portions from being formed in the upper surfaces of the interlayer insulating films IL1 and thus prevent dishing from occurring. In the second lower-breakdown-voltage transistor region 1D where the gate patterns are coarsely formed also, it is possible to prevent the height of each of the interlayer insulating films IL1 and the dummy gate electrodes DG3 from becoming lower than that of each of the control gate electrodes CG, the dummy gate electrodes DG1, and the like. Accordingly, it is possible to prevent the metal films from being left over the upper surfaces of the interlayer insulating films IL1 in the process of forming the metal gate electrodes later. This allows the same effects as obtained in Embodiment 1 described above to be obtained.

After the structure shown in FIG. 10 is obtained, to planarize the respective upper surfaces of the dummy gate electrodes DG1 to DG3 and the like and the upper surfaces of the interlayer insulating films IL1 at the same plane, it can be considered to polish the upper surfaces of the interlayer insulating films IL1 and thus lower the upper surfaces of the interlayer insulating films IL1 in height by about 100 nm corresponding to the total film thickness of the insulating films IF3 and IF4. However, since polishing using a CMP method or the like is more likely to impair the planarity of a surface as the polishing is performed for a longer period, it is desirable that the period during which the polishing is performed is shorter.

Accordingly, in Embodiment 2, after the structure shown in FIG. 10 is obtained, the etch-back process is performed to lower the upper surfaces of the interlayer insulating films IL1 in height by about 100 nm and then a small amount of polishing is performed thereon to remove the damaged layers from the upper surfaces of the polysilicon films, as described using FIG. 27. That is, in Embodiment 2, the etch-back process is performed instead of the step of polishing the upper surfaces of the interlayer insulating films IL1 by a thickness of 100 nm. This can reduce the amount of the polishing performed after the structure shown in FIG. 10 is obtained to thus eliminate the need to perform the polishing for a long period. Therefore, it is possible to prevent roughness from being produced in the upper surfaces of the interlayer insulating films IL1 that have been lowered to the same height as that of the upper surface of each of the control gate electrodes CG and the dummy gate electrodes DG1 to DG3. In other words, it is possible to enhance the uniformity of the film thicknesses of the interlayer insulating films IL1 after the process step described using FIG. 47.

By thus enhancing the planarity of the upper surface of each of the control gate electrodes CG, the dummy gate electrodes DG1 to DG3, the insulating films IF4, and the interlayer insulating films IL1, it is possible to prevent the occurrence of defective film deposition when a film is formed later over the interlayer insulating films IL1, defocusing in the step of exposing a resist film to light, or the like. Also, by enhancing the planarity of the upper surfaces of the interlayer insulating films IL1 or the like as described above, it is possible to prevent metal films from being left as polishing residues when plugs or wires are embedded in the trenches formed over the interlayer insulating films IL1 using a polishing step. In this manner, the reliability of the semiconductor device can be improved.

It can be considered that, unlike in Embodiment 2, after the process step described using FIG. 10, the respective portions of the insulating films IF3 and IF4 which are located immediately over the control gate electrodes CG and the dummy gate electrodes DG1 to DG3 and exposed from the interlayer insulating film IL1 are removed by etching and then the upper surface of the interlayer insulating film IL1 is polished. However, in this case, even when the insulating films IF3 and IF4 are removed by the etching, the insulating film IF4 covering the side walls and upper surfaces of the memory gate electrodes MG is covered with the interlayer insulating film IL1 and therefore not removed.

As a result, even when the upper surface of the interlayer insulating film IL1 is polished after the etching to planarize the respective upper surfaces of the interlayer insulating film IL1 and the individual gate electrodes in generally the same plane, it is also necessary to simultaneously polish the insulating film IF4 made of the silicon nitride film adjacent to each of the memory gate electrodes MG. In this case, a relative amount of polishing performed on the memory gate electrodes MG tends to decrease so that the amount of the polishing needs to be set relatively large. This may cause the problem of variations in the respective heights of the various gate electrodes and the problem of dishing resulting from excessive polishing of the upper surface of the interlayer insulating film IL1.

By contrast, in Embodiment 2, by the etch-back process described using FIG. 26, the insulating film IF4 covering the memory gate electrodes MG is also removed from over the control gate electrodes CG. As a result, when the polishing step described using FIG. 27 is performed later, it is possible to prevent variations in the respective heights of the various gate electrodes and prevent the upper surface of the interlayer insulating film IL1 from being excessively polished. This can improve the reliability of the semiconductor device.

Embodiment 3

Figure 29:
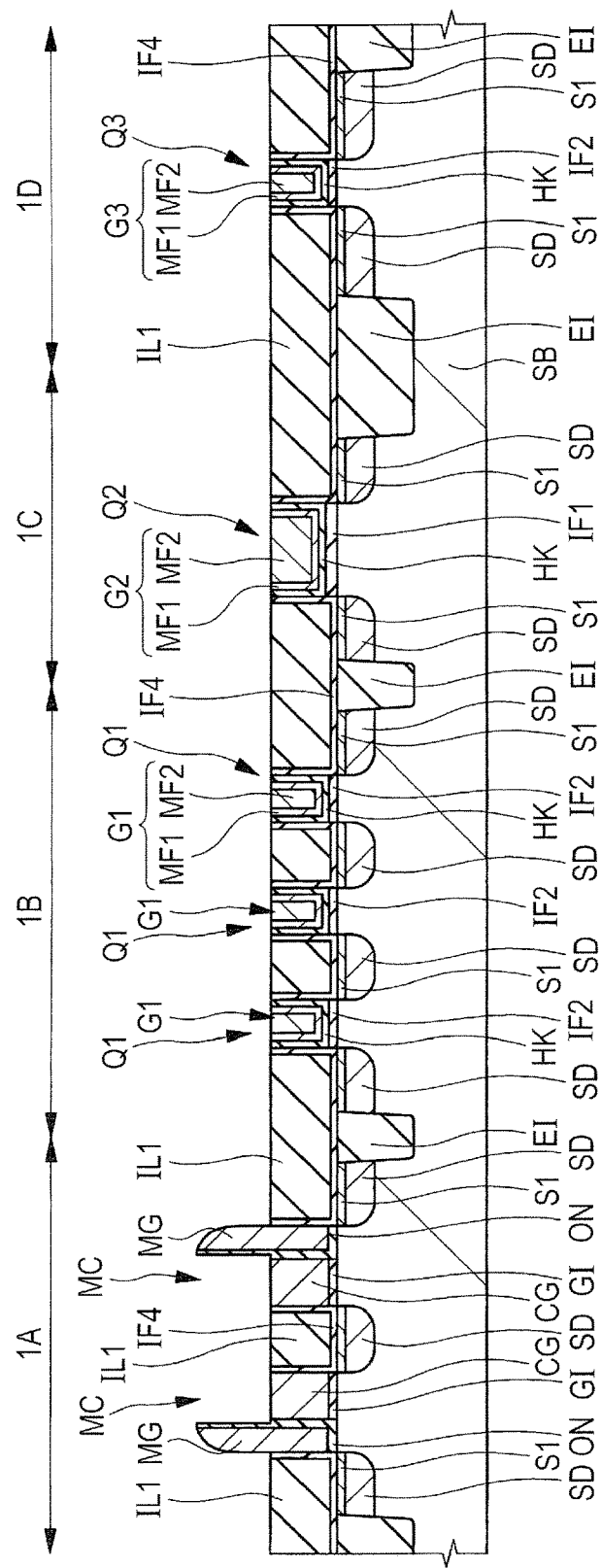
FIG. 29 is a cross-sectional view of a semiconductor device in Embodiment 3 during the manufacturing process thereof.
Figure 30:
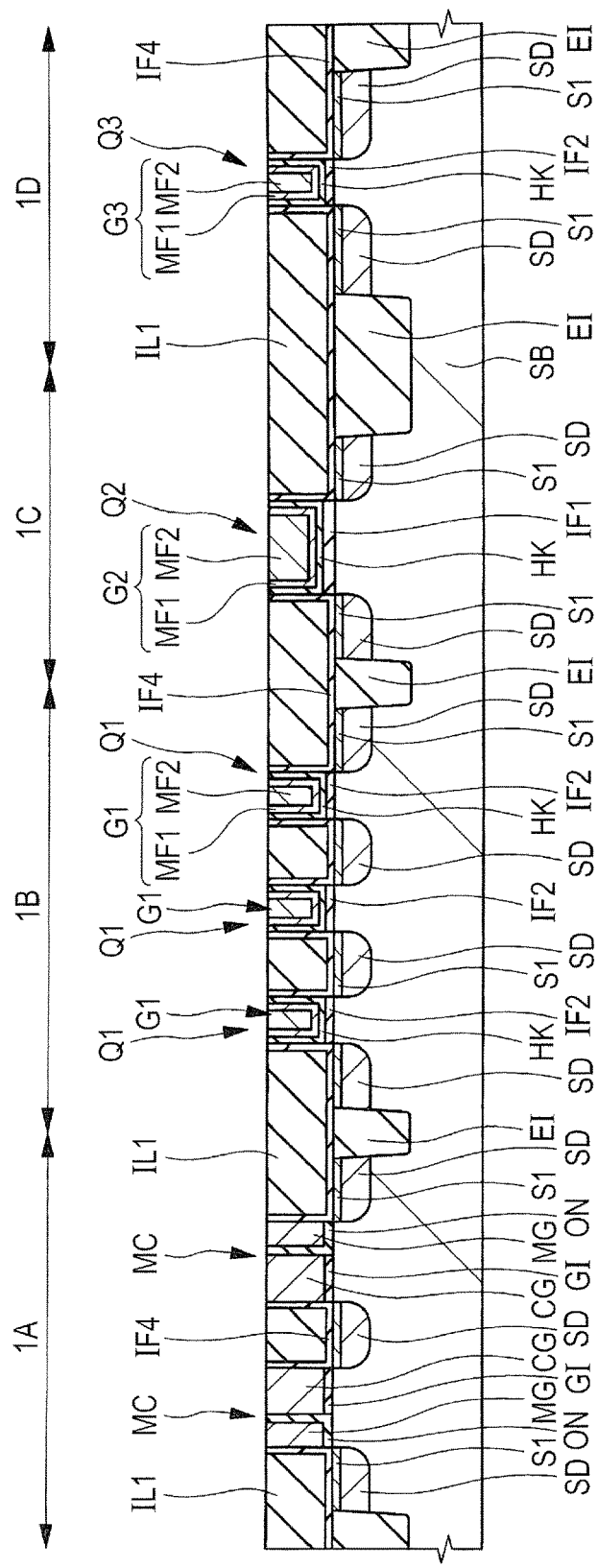
FIG. 30 is a cross-sectional view of the semiconductor device during the manufacturing process thereof, which is subsequent to FIG. 29.
Figure 31:
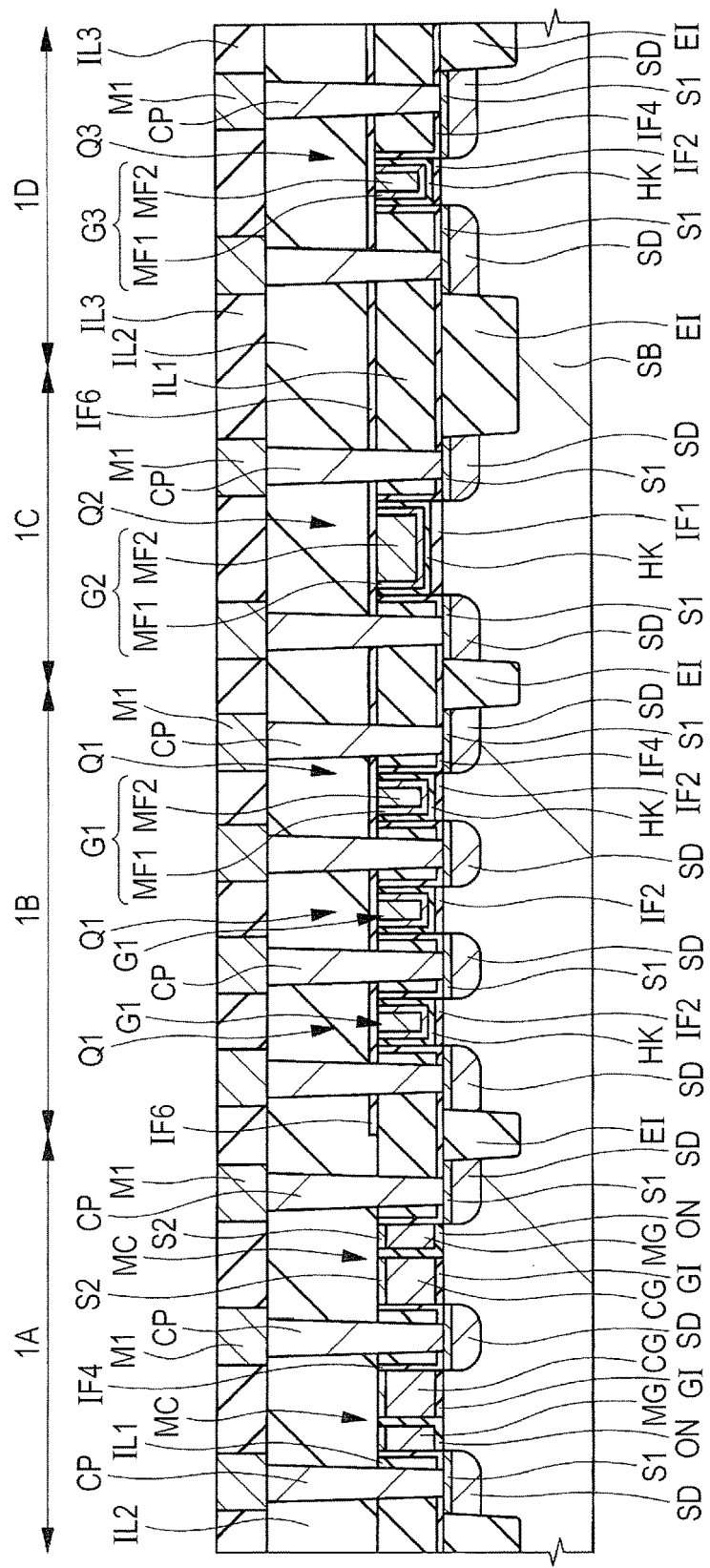
FIG. 31 is a cross-sectional view of the semiconductor device during the manufacturing process thereof, which is subsequent to FIG. 30.

The following will describe a method of manufacturing a semiconductor device in Embodiment 3. The manufacturing process in Embodiment 3 is substantially the same as in Embodiment 2 described above, but is different therefrom in that, before the upper portions of the memory gate electrodes are polished, the step of removing the silicide layers covering the upper surfaces of the memory gate electrodes is performed. FIGS. 29 to 31 are cross-sectional views of the semiconductor device in Embodiment 3 during the manufacturing process thereof. Each of FIGS. 29 to 31 shows the memory cell region 1A, the first lower-breakdown-voltage transistor region 1B, the higher-breakdown-voltage transistor region 1C, and the second lower-breakdown-voltage transistor region 1D, similarly to FIG. 1.

In Embodiment 3, first, the process steps described using FIGS. 1 to 10 and 26 are performed. That is, the control gate electrodes CG and the dummy gate electrodes DG1 to DG3 are formed, and the insulating films IF3 made of the silicon nitride film are formed thereover. After the insulating film IF4 and the interlayer insulating film IL1 are formed to cover the gate electrodes and the insulating film IF3, the upper surface of the interlayer insulating film IL1 is polished to expose the insulating films IF3 and IF4 made of the silicon nitride film from the interlayer insulating films IL1. Then, an etch-back process is performed using a dry etching method to lower the respective upper surfaces of the insulating films IF4 and IF3 and the interlayer insulating films IL1 in height. Thus, the respective upper surfaces of the control gate electrodes CG and the dummy gate electrodes DG1 to DG3 and the respective upper surfaces of the insulating films IF4 and the interlayer insulating films IL1 are planarized.

At this process stage, in the regions over the respective upper surfaces of the control gate electrodes CG and the interlayer insulating films IL1 after the etch-back process, parts of the upper portions of the memory gate electrodes MG and the silicide layers S1 over the memory gate electrodes MG protrude and the silicide layers S1 covering the upper surfaces thereof are exposed at the interlayer insulating films IL.

Next, wet etching is performed using, e.g., an ammonium hydrogen-peroxide mixture (APM) to remove the silicide layers S1 exposed at the interlayer insulating films IL1 and covering the upper surfaces of the memory gate electrodes MG. Thus, the upper surfaces of the memory gate electrodes MG are exposed.

Next, as shown in FIG. 30, by performing the same polishing step as the process step described using FIG. 27, the respective upper surfaces of the interlayer insulating films IL1, the control gate electrodes CG, the memory gate electrodes MG, and the dummy gate electrodes DG1 to DG3 are planarized.

Next, as shown in FIG. 31, by performing the same process steps as those described using FIGS. 18 to 24, the semiconductor device in Embodiment 3 can be manufactured.

In a gate last process, the polishing step is performed so as to expose the respective upper surfaces of the control gate electrodes, the memory gate electrodes, and the other dummy gate electrodes from the interlayer insulating films. At this time, when, e.g., the silicide layers covering the upper surfaces of the memory gate electrodes are removed by polishing, particles in the silicide layers separated from the memory gate electrodes during the polishing react with silicon in each of the gate electrodes due to heat resulting from the polishing. As a result, silicide layers are formed again over the respective gate electrodes. That is, when it is attempted to remove the silicide layers by the polishing, at the time when the polishing is ended, thin silicide layers may be formed again over the respective upper surfaces of the control gate electrodes, the memory gate electrodes, and the other dummy gate electrodes.

In the gate last process, it is necessary to remove some of the dummy gate electrodes as pseudo gate electrodes after the polishing and replace the dummy gate electrodes with the metal gate electrodes. However, a problem arises in that the silicide layers formed again by the foregoing polishing present an obstacle and the dummy gate electrodes cannot be removed. In this case, since the dummy gate electrodes are not removed, the dummy gate electrodes cannot be replaced with the metal gate electrodes. Since it is difficult to remove the thin silicide layers formed by the polishing step after the polishing step, it is desirable to remove the silicide layers before the polishing step.

Accordingly, in Embodiment 3, in the process step described using FIG. 29, the silicide layers S1 covering the upper surfaces of the memory gate electrodes MG and exposed over the interlayer insulating films IL1 are removed. Then, in the polishing step described using FIG. 30, the upper portions of the memory gate electrodes MG and the like are polished without polishing the silicide layers S1 to planarize the respective upper surfaces of the interlayer insulating films IL1, the control gate electrodes CG, the memory gate electrodes MG, and the dummy gate electrodes DG1 to DG3.

Thus, the silicide layers S1 over the memory gate electrodes MG are not polished herein by a polishing step and therefore it is possible to prevent a thin silicide layer from being formed over the upper surface of each of the gate electrodes. Consequently, when the dummy gate electrodes DG1 to DG3 are removed in the process step described using FIG. 15, the respective upper surfaces of the dummy gate electrodes DG1 to DG3 are not covered with thin silicide layers. Therefore, it is possible to easily remove the dummy gate electrodes DG1 to DG3 without being interrupted by the silicide layers.

This allows the dummy gate electrodes DG1 to DG3 to be replaced with the gate electrodes G1 to G3 (see FIG. 28) as the metal gate electrodes and allows the MISFETs Q1 to Q3 having intended characteristics to be formed. Accordingly, the reliability of the semiconductor device can be improved.

The manufacturing process in Embodiment 3 is the same as in Embodiment 2 described above except for the step of removing the silicide layers SI described using FIG. 27. As a result, in Embodiment 3, the same effects as obtained in Embodiment 2 described above can be obtained.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

For example, in Embodiments 1 and 2 described above, it is described that the gate electrode of the higher-breakdown-voltage transistor is formed of the metal gate electrode. However, it may also be possible that the high-k film and the metal gate electrode are not formed in the higher-breakdown-voltage transistor region and the gate electrode of the higher-breakdown-voltage transistor is formed of a polysilicon film. In this case, when, e.g., the dummy gate electrode DG2 is covered with the insulating film IF4 in the process step described using FIG. 14, it is possible to leave the dummy gate electrode DG2 without replacing the dummy gate electrode DG2 with the metal gate electrode in a subsequent process step and allow the dummy gate electrode DG2 to be used as the gate electrode actually included in a circuit, not as the dummy gate electrode.

In Embodiments 1 to 3 described above, even when a high-k first manufacturing method which forms a high-k film and then forms the dummy gate electrodes is used, the cap insulating film over each of the control gate electrodes needs to be formed to have a large film thickness to prevent an impurity from being implanted into the ONO film under each of the memory gate electrodes. Accordingly, even when the high-k first manufacturing method is applied to Embodiments 1 to 3 described above, the same effects can be obtained.

What is claimed is:
1. A method of manufacturing a semiconductor device, comprising:
(a) providing a semiconductor substrate;
(b) forming a dummy gate electrode over a main surface of the semiconductor substrate and forming a first insulating film over the dummy gate electrode;
(c) forming a pair of first source/drain regions in the main surface of the semiconductor substrate located beside the dummy gate electrode;
(d) forming a second insulating film covering the dummy gate electrode and the first insulating film and made of a material different from that of the first insulating film;
(e) polishing an upper surface of the second insulating film to expose an upper surface of the first insulating film from the second insulating film;
(f) after (e), removing the first insulating film;
(g) after (f), polishing down the upper surface of the second insulating film; and
(h) after (g), replacing the dummy gate electrode with a gate electrode including a metal film to form a field effect transistor including the gate electrode and the first source/drain regions,
wherein, after (g), a position of the upper surface of the second insulating film is higher than a position of an upper surface of the dummy gate electrode.
2. The method of manufacturing the semiconductor device according to claim 1,
wherein (h) includes:
(h1) removing the dummy gate electrode to form a trench;
(h2) forming the metal film over the semiconductor substrate to fill the trench; and
(h3) removing the metal film from over the second insulating film to expose the upper surface of the second insulating film and form the gate electrode including the metal film in the trench.
3. The method of manufacturing the semiconductor device according to claim 2, further comprising:
(h4) after (h1) and before (h2), forming a third insulating film covering a bottom surface of the trench,
wherein the third insulating film has a dielectric constant higher than that of a silicon nitride.
4. The method of manufacturing the semiconductor device according to claim 3,
wherein, in (c), the first source/drain regions are formed by an ion implantation method using the first insulating film as a mask, and
wherein, in (h1), the dummy gate electrode is removed by wet etching.
5. The method of manufacturing the semiconductor device according to claim 4,
wherein, in the wet etching performed in (h1), aqueous ammonia is used as a solvent.
6. The method of manufacturing the semiconductor device according to claim 1,
wherein the second insulating film includes a silicon dioxide film and the first insulating film includes a silicon nitride film.
7. The method of manufacturing the semiconductor device according to claim 1, further comprising:
(b1) before (c), forming a control gate electrode over the main surface of a second region of the semiconductor substrate, forming a fourth insulating film over the control gate electrode, and forming a memory gate electrode over a side wall of a multilayer film including the control gate electrode and the fourth insulating film via a fifth insulating film including a charge storage portion; and (c1) after (b) and before (d), forming a pair of second source/drain regions in the main surface of the semiconductor substrate such that a pattern including the control gate electrode and the memory gate electrode is interposed therebetween, wherein, in (d), the second insulating film is formed to cover the control gate electrode and the fourth insulating film, wherein, in (e), the upper surface of the second insulating film is polished to expose an upper surface of the fourth insulating film from the second insulating film, wherein, in (f), the first and fourth insulating films are removed, wherein the control gate electrode, the memory gate electrode, and the second source/drain regions are included in a memory cell, and wherein, after (g), the position of the upper surface of the second insulating film is higher than a position of an upper surface of each of the control gate electrode and the memory gate electrode.

8. The method of manufacturing the semiconductor device according to claim 7,
wherein, in (c1), ion implantation is performed using the memory gate electrode as a mask to form the second source/drain regions.

9. The method of manufacturing the semiconductor device according to claim 1, further comprising:
(i) after (h), forming a sixth insulating film covering the field effect transistor and the upper surface of the second insulating film; and
(j) forming a coupling portion extending through the second and sixth insulating films and electrically coupled to the first source/drain regions.

10. A method of manufacturing a semiconductor device, comprising:
(a) providing a semiconductor substrate;
(b) forming a dummy gate electrode over a main surface of the semiconductor substrate and forming a first insulating film over the dummy gate electrode;
(c) forming a pair of first source/drain regions in the main surface of the semiconductor substrate located beside the dummy gate electrode;
(d) forming a second insulating film covering the dummy gate electrode and the first insulating film and made of a material different from that of the first insulating film;
(e) polishing an upper surface of the second insulating film to expose an upper surface of the first insulating film from the second insulating film;
(f) after (e), etching back the respective upper surfaces of the first and second insulating films to expose an upper surface of the dummy gate electrode;
(g) after (f), replacing the dummy gate electrode with a gate electrode including a metal film to form a field effect transistor including the gate electrode and the first source/drain regions;
(b1) before (c), forming a control gate electrode over the main surface of a second region of the semiconductor substrate, forming a fourth insulating film over the control gate electrode, and forming a memory gate electrode over a side wall of a multilayer film including the control gate electrode and the fourth insulating film via a fifth insulating film including a charge storage portion; and (c1) after (b), forming a pair of second source/drain regions in the main surface of the semiconductor substrate such that a pattern including the control gate electrode and the memory gate electrode is interposed therebetween, wherein, in (d), the second insulating film is formed to cover the control gate electrode and the fourth insulating film, wherein, in (e), the upper surface of the second insulating film is polished to expose an upper surface of the fourth insulating film from the second insulating film, wherein, in (f), the respective upper surfaces of the first, second, and fourth insulating films are etched back to expose the control gate electrode and the memory gate electrode from the first, second, and fourth insulating films, and wherein, after the etching in (f), a height of the upper surface of the memory gate electrode from the main surface of the semiconductor substrate is greater than a height of the upper surface of the second insulating film from the main surface.

11. The method of manufacturing the semiconductor device according to claim 10,
wherein the second insulating film includes a silicon dioxide film, and the first insulating film includes a silicon nitride film.

12. The method of manufacturing the semiconductor device according to claim 10, further comprising:
(h) after (g), forming a sixth insulating film covering the field effect transistor and the upper surface of the second insulating film; and
(i) forming a coupling portion extending through the second and sixth insulating films and electrically coupled to the first source/drain regions.

13. The method of manufacturing the semiconductor device according to claim 10, further comprising:
(c2) after (c) and (c1) and before (d), forming silicide layers in respective upper surfaces of the first source/drain regions, the second source/drain regions, and the memory gate electrode,
wherein, in (f), the respective upper surfaces of the first, second, and fourth insulating films are etched back to expose an upper surface of the control gate electrode, the memory gate electrode, and the silicide layer over the memory gate electrode from the first, second, and fourth insulating films,
the method of manufacturing the semiconductor device further comprising:
(f1) after (f), polishing the memory gate electrode, including the silicide layer at the upper surface of the memory gate electrode.

14. A method of manufacturing a semiconductor device, comprising:
(a) providing a semiconductor substrate;
(b) forming a dummy gate electrode over a main surface of the semiconductor substrate and forming a first insulating film over the dummy gate electrode;
(c) forming a pair of first source/drain regions in the main surface of the semiconductor substrate located beside the dummy gate electrode;
(d) forming a second insulating film covering the dummy gate electrode and the first insulating film and made of a material different from that of the first insulating film;
(e) polishing an upper surface of the second insulating film to expose an upper surface of the first insulating film from the second insulating film;

(f) after (e), etching back the respective upper surfaces of the first and second insulating films to expose an upper surface of the dummy gate electrode;

(g) after (f), replacing the dummy gate electrode with a gate electrode including a metal film to form a field effect transistor including the gate electrode and the first source/drain regions;

(b1) before (c), forming a control gate electrode over the main surface of a second region of the semiconductor substrate, forming a fourth insulating film over the control gate electrode, and forming a memory gate electrode over a side wall of a multilayer film including the control gate electrode and the fourth insulating film via a fifth insulating film including a charge storage portion;

(c1) after (b), forming a pair of second source/drain regions in the main surface of the semiconductor substrate such that a pattern including the control gate electrode and the memory gate electrode is interposed therebetween; and (c2) after (c) and (c1) and before (d), forming silicide layers in respective upper surfaces of the first source/drain regions, the second source/drain regions, and the memory gate electrode, wherein, in (d), the second insulating film is formed to cover the control gate electrode and the fourth insulating film, wherein, in (e), the upper surface of the second insulating film is polished to expose an upper surface of the fourth insulating film from the second insulating film, and wherein, in (f), the respective upper surfaces of the first, second, and fourth insulating films are etched back to expose an upper surface of the control gate electrode, the memory gate electrode, and the silicide layer over the memory gate electrode from the first, second, and fourth insulating films, the method of manufacturing the semiconductor device further comprising:

(f1) after (f), removing the silicide layer from over the memory gate electrode; and (f2) after (f1) and before (g), polishing the upper surface of the memory gate electrode.

* * * * *